US010752513B2

(12) United States Patent
Conradson

(10) Patent No.: US 10,752,513 B2
(45) Date of Patent: Aug. 25, 2020

(54) NON-EQUILIBRIUM POLARONIC QUANTUM PHASE-CONDENSATE BASED ELECTRICAL DEVICES

(71) Applicant: NEQCST CORPORATION, Dover, DE (US)

(72) Inventor: Steven Conradson, Palo Alto, CA (US)

(73) Assignee: POLARONIX CORPORATION, Dover, DE (US)

(*) Notice: Subject to any disclaimer, the term of this patent is extended or adjusted under 35 U.S.C. 154(b) by 0 days.

(21) Appl. No.: 16/341,847

(22) PCT Filed: Oct. 16, 2017

(86) PCT No.: PCT/US2017/056816
§ 371 (c)(1),
(2) Date: Apr. 12, 2019

(87) PCT Pub. No.: WO2018/071914
PCT Pub. Date: Apr. 19, 2018

(65) Prior Publication Data
US 2019/0389739 A1 Dec. 26, 2019

Related U.S. Application Data

(60) Provisional application No. 62/408,599, filed on Oct. 14, 2016.

(51) Int. Cl.
*C01G 43/00* (2006.01)
*C01G 43/025* (2006.01)
(Continued)

(52) U.S. Cl.
CPC .......... *C01G 43/025* (2013.01); *H01G 9/042* (2013.01); *H01G 9/16* (2013.01); *H01L 29/45* (2013.01);
(Continued)

(58) Field of Classification Search
None
See application file for complete search history.

(56) References Cited

U.S. PATENT DOCUMENTS

2016/0289860 A1* 10/2016 Mann ............... C09K 11/04

* cited by examiner

*Primary Examiner* — Evren Seven
(74) *Attorney, Agent, or Firm* — Morgan, Lewis & Bockius LLP

(57) ABSTRACT

Electrical devices operating in a range of −273° C. to 100° C. are disclosed. The devices include an insulating substrate. A $UO_{2+x}$ crystal or oriented crystal $UO_{2+x}$ film is on a first portion of the substrate. The $UO_{2+x}$ crystal or film originates and hosts a non-equilibrium polaronic quantum phase-condensate. A first lead on a second portion of the substrate is in electrical contact with the $UO_{2+x}$ crystal or film. A second lead on a third portion of the surface is in electrical contact with the $UO_{2+x}$ crystal or film. The leads are isolated from each other. A $UO_{2+x}$ excitation source is in operable communication with the $UO_{2+X}$ crystal or film. The source is configured to polarize a region of the crystal or film thereby activating the non-equilibrium quantum phase-condensate. One source state causes the $UO_{2+X}$ crystal or film to be conducting. Another source state causes the $UO_{2+x}$ crystal or film to be non-conductive.

39 Claims, 28 Drawing Sheets

(51) Int. Cl.
*H01S 5/042* (2006.01)
*H01G 9/042* (2006.01)
*H01G 9/16* (2006.01)
*H01L 29/45* (2006.01)
*H01L 29/49* (2006.01)
*H01L 29/66* (2006.01)
*H01L 39/14* (2006.01)
*H01L 43/02* (2006.01)
*H01L 43/10* (2006.01)
*H01L 45/00* (2006.01)
*H01P 3/08* (2006.01)
*H01S 5/30* (2006.01)
*G01R 33/02* (2006.01)
*H01L 39/12* (2006.01)
*H01S 5/34* (2006.01)

(52) U.S. Cl.
CPC .... *H01L 29/4966* (2013.01); *H01L 29/66977* (2013.01); *H01L 29/66984* (2013.01); *H01L 39/146* (2013.01); *H01L 43/02* (2013.01); *H01L 43/10* (2013.01); *H01L 45/1206* (2013.01); *H01L 45/1213* (2013.01); *H01L 45/1226* (2013.01); *H01L 45/1253* (2013.01); *H01L 45/146* (2013.01); *H01P 3/08* (2013.01); *H01S 5/04252* (2019.08); *H01S 5/3004* (2013.01); *C01P 2006/40* (2013.01); *G01R 33/02* (2013.01); *H01L 39/126* (2013.01); *H01S 5/34* (2013.01)

(B)

(A)

A)

B)

C)

A)

B)

C)

A)

B)

C)

NON-EQUILIBRIUM POLARONIC QUANTUM PHASE-CONDENSATE BASED ELECTRICAL DEVICES

CROSS REFERENCE TO RELATED APPLICATION

This application claims priority to U.S. Patent Application No. 62/408,599, filed Oct. 14, 2016, which is hereby incorporated by reference.

FIELD

The present disclosure relates generally to uranium oxide that originates and hosts a non-equilibrium polaronic quantum phase-condensate and electrical devices made from such material.

BACKGROUND

There are five known conventional phases, or states, of matter: solids, liquids, gases, plasma and condensates (e.g., Bose-Einstein-condensates). These differ in their densities, energies, and the nature of the interactions between their constituent particles. At the extremely low end of the temperature-energy scale, atomic motion comes very close to stopping altogether as most of the atoms all fall into their minimum energy ground state. Since there is almost no kinetic energy or relative motions between the atoms they can self-organize—or condense—on the basis of the weakest, quantum mechanical interactions that occur when their separation corresponds to their Debroglie wavelength that is almost 100 times larger than the distance between the molecules in air. When this occurs the system exhibits such quantum mechanical effects as interference and superfluidity, making a Bose-Einstein condensate (BEC) a platform to study quantum mechanics and its particle-wave paradox on a macroscopic level. Light can be slowed down to a few cm/sec. The superfluidity of a BEC allows it to flow without friction, so that in the absence of dissipation it will persist essentially forever.

As such, enabled by the development of laser cooling methods into the nanoK regime, a dilute atom-gas Bose-Einstein condensate of Rb was first realized in 1995, 70 years after the prediction of this unusual state of matter by its namesakes, an achievement that awarded the 2001 Nobel prize for physics to Cornell and Weiman(1) and Ketterle(2).

Prior to this, however, predictions had also been made for condensates composed of certain so called "quasiparticles" that are typically excited states of more conventional atoms and electrons or combinations of these conventional particles with energy in some form. These include excitons(3-5) and phonons involving dipoles(6, 7), based on inhibited relaxation that gave the requisite athermal population distribution. Although the difficulties in making BCS superconducting and dilute atomic gas Bose-Einstein condensates could imply that condensation is a fragile process, it could well be the opposite. Following these predictions, such non-equilibrium condensates have been produced with a number of constituents, e.g., photons, excitons(8, 9), magnons(10, 11), exciton-polaritons(12, 13), and more. The hosting of these non-equilibrium condensates of quasiparticles inside solid hosts and, because of the low masses of their constituent (quasi) particles and the intrinsically higher temperatures associated with excitations, their persistence to ambient temperatures in some cases(14) make them much more amenable to both study and potential applications(15-17).

A conspicuous absence from this quasiparticle menagerie is polarons. This is especially important because polarons are the origin of the properties of doped transition metal oxides and chalcogenides, most notably their exotic superconductivity. In addition, unlike the other quasiparticles, polarons possess charge, localized spin, electrons in specific orbits, and mass, and are therefore much more receptive to our abilities to manipulate electricity, magnetism, and matter that form the basis for our microelectronics, optics, magnetics, and related technologies. The discovery that charge inhomogeneities in $UO_2$ resulting from either static doping with excess Oxygen or transient photoexcitation via the metal-to-metal charge transfer transition aggregate and self-organize to form a coherent polaron quantum phase (CPQP) that exhibits extraordinary coherence and either is a condensate or possesses many of the properties(18-20) of the non-equilibrium type predicted by Fröhlich in his 1968 paper. (6, 21, 22) suggests that polarons should be further studied.

Pertinent to the polaron, regarding the Fröhlich BEC problem, a large number of unusual or unique results from structural and spectroscopic experiments on the O- and photodoped 5f Mott insulator, $UO_{2(+x)}$ that indicate its presence in this system have been reported (18-20). As used herein $UO_{2+x}$ is $UO_2$ containing extra O (oxygen atoms) so that it is a combination of U(IV) and U(V) that retains its original fluorite structure through x=0.33–0.5. As used herein, $UO_{2(+x)}$ is photoexcited $UO_2$, the excitation here is from the highest occupied U 5f state to the lowest unoccupied U 5f or 6d states on a different U ion, this metal-to-metal charge transfer transition creates U(III) and U(V). $UO_{2(+x)}$ can also mean $UO_{2+x}$ and vice versa, referring to mixed valence $UO_2$ with charge defects or inhomogeneities created by both chemical methods and photoexcitation. These can also mean $UO_2$ without or prior to the creation of the charge defects by these means. The combination of XAFS, x-ray pair distribution function (pdf), and neutron pdf showed tunneling polarons (18) whose displacements are far too large for conventional tunneling, exceeding those in cuprates (23-29) by at least an order of magnitude. These tunneling polarons aggregate and self-organize into the relevant coherent, polaronic, quantum phases, possessing exceptional coherence, stability, and other collective effects persisting even up to ambient temperature. Their non-equilibrium condensate-like properties would then be the culmination of the phonon-coupled, synchronous charge transfer displayed by related systems (30, 31). These comprehensive structural results indicate that the coherence of the CPQPs is possibly enhanced by a Fano-Feshbach (19, 20, 32-35) or other types of resonances that connects the U(IV,V) ground state closed channel and U(IV,VI) excited state open channel species that are preferred at the opposite ends of the vibrational excursion of a special [111] phonon (36). Although time domain optical pump-optical and THz probe experiments on $UO_{2.0}$ and electron paramagnetic spectroscopy measurements on O-doped $UO_{2+x}$ have identified a number of non-$UO_2$ states with extraordinary coherence and collective properties, an outstanding question has been the electronic structure.

Conradson et al., 2013, "Possible Bose condensate behavior in a quantum phase originating in a collective excitation in the chemically and optically doped Mott-Hubbard system, $UO_{2(+x)}$." *Physical Review B*, 88 115135 (Conradson 2013) discloses through U $L_3$ EXAFS and x-ray pair distribution function experiments performed at the Stanford Synchrotron Radiation Lightsource combined with neutron pair distribution function experiments performed at Lujan Neutron Scattering Center that: x-ray and neutron structural probes demonstrate tunneling polaron in $UO_{2+x}$, but more radical than the one found in cuprates. Conradson 2013 speculates that it was superfluid tunneling, although superfluid tunneling of atoms inside a crystal has never been postulated. Further, Conradson 2013 discloses O XAS experiments on $UO_{2+x}$ performed at SSRL and Non-resonant Inelastic X-ray Scattering experiments performed at the Advanced Photon Source in which the electronic levels of $UO_{2+x}$ did not fit the pattern set by related compounds. Conradson 2013 postulates that this originated in the tunneling polaron in $UO_{2+x}$. Conradson 2013 further discloses Raman experiments on $UO_{2+x}$ performed at the Environmental Molecular Science Laboratory in which: $UO_2$ in powder form did not scatter, $UO_{2+x}$ gave weak scattering with a very broad spectrum but not the feature associated with the U(VI)-oxo group found in the x-ray measurements. Conradson 2013 postulated that this originated in the tunneling polaron in $UO_{2+x}$. Conradson 2013 further discloses ultrafast time domain optical laser pump-optical laser reflectivity probe experiments on $UO_2$ crystal performed at Los Alamos National Laboratory in which extraordinarily long lifetimes were found, indicating something is stabilizing the excited state or inhibiting its relaxation. The observed complicated temperature dependence of lifetimes and time domain spectra indicate that the photoinduced polarons form a quantum phase that is separate from the host $UO_2$ and has multiple states, one of which undergoes a gap opening phase transition around 50-60 K. Conradson 2013 speculated that these states would be consistent with a Bose-Einstein condensate. Conradson 2013 further discloses ultrafast time domain optical laser pump-THz probe spectroscopy experiments on $UO_2$ crystal in which it was observed that some states were changing their relative populations at lower temperatures although the $UO_2$ phase diagram shows no additional structures or states in this temperature range. Conradson 2013 concluded that $UO_{2+x}$ and $UO_{2(+x)}$ contain polarons with unique or unusual properties, one of which is that the ones created by lower energy photoexcitation into the U 5f states aggregate to form a relatively stable quantum phase separate from the host that can undergo a phase transition. Conradson 2013 speculated that these properties derive from the quantum phase being a coherent porlaon quantum phase that may be a non-equilibrium Bose-Einstein or similar condensate.

While much has been learned regarding O- and photodoped 5f Mott insulators, what is needed in the art are ways to apply $UO_{2(+x)}$ to electrical applications such as optical switches, electric and magnetic switches, transmission lines, ultrafast detectors, ultrahigh frequency circuits, magnets, motors, magnetic sensors, quantum computing, quantum communications, and energy storage.

SUMMARY

The present disclosure provides further details of O- and photodoped 5f Mott insulators and their application to electrical applications such as optical switches, ultrafast detectors, electric and magnetic switches, transmission lines, ultrahigh frequency circuits, magnets, motors, magnetic sensors, quantum computing, quantum communications, and energy storage.

Mixed valence $UO_{2(+x)}$ hosts a unique polaronic quantum phase (CPQP) that exhibits many characteristics of the Fröhlich-type, non-equilibrium, phonon-coupled Bose-Einstein condensate whose stability and coherence are amplified by collective, anharmonic motions of atoms and charges. Subsequent to the detailed real space information already obtained from scattering and XAFS, an outstanding question is the electronic structure. Mapping the Mott gap in $UO_{2+x}$ with O XAS and NIXS and U $M_5$ RIXS shows that O-doping has minimal effects on the valence band but lowers the edge of the conduction band by 1.5 eV vs. the calculated 0.6 eV, with a tail that gives a continuous density-of-states that increases rapidly above its constricted intersection with the occupied U 5f states. Femtosecond-resolved photoemission measurements of $UO_2$ with 4.7 eV excitation beginning coincident with the excitation pulse at time=0 show a metastable state consisting of the unoccupied 5f states of $UO_2$ and no hot electrons. 3.1 eV excitation, however, emulates O-doping by giving a metastable state with a continuous population of electrons above the Fermi level. $UO_{2(+x)}$ therefore fulfills the criteria prescribed for a non-equilibrium condensate in terms of the athermal electron distribution and inhibited relaxation that causes a nonthermal accumulation of the quasiparticles in a particular state. The present disclosure presents four exceptional findings: 1) the direct formation of both of these long lived (>3-10 ps) excited states in well under the 40 femtosecond excitation pulse width without the short lived athermal intermediate energetically continuous electron spectrum found for almost every other material; 2) the superthermal metallic state is as or more stable than typical photoinduced metals despite its extended distribution of electrons unfilled regions of the density of states; 3) the number of these athermal electrons is large, approaching one percent of the total; and 4) the absence of hot electrons accompanying the insulating $UO_2$ excited state. These may be characteristic of the heterogeneous, non-equilibrium, Fröhlich BEC stabilized by a Fano-Feshbach resonance.

As such, the response of the Mott gap to O-doping by combining the O XAS (18, 20) and NIXS (37) with RIXS, and to photoinduced polarons via time resolved photoemission (20, 38) is described in the present disclosure. In addition to the analogies with some of the properties and behaviors of atom gas Bose-Einstein condensates, the identification of these states and their connections demonstrates the equivalence of this real space scenario with two-band, coherent-exchange, superconductivity mechanisms (33, 39). These experiments described in the present disclosure also continue the established pattern of identifying unique behavior in $UO_{2(+x)}$, in this case the properties of the electronic states with both chemical doping and photoexcitation.

One aspect of the present disclosure provides an electrical device operating in a range of –273° C. to 100° C. The electrical device comprises an insulating substrate having a surface. The electrical device further comprises a first single $UO_{2+x}$ crystal or a first oriented crystal $UO_{2+x}$ film on a first portion of the surface, where the first single $UO_{2+x}$ crystal or the first oriented crystal $UO_{2+x}$ film originates and hosts a non-equilibrium polaronic condensate. The electrical device further comprises a first lead comprising a first electrically conductive material on a second portion of the surface in electrical contact with the first single $UO_{2+x}$ crystal or the first oriented crystal $UO_{2+x}$ film. The electrical device further comprises a second lead comprising a second electrically conductive material on a third portion of the surface. The second lead is in electrical contact with the first single $UO_{2+x}$ crystal or the first oriented crystal $UO_{2+x}$ film and the first and second leads are not in contact with each other. The electrical device further comprises a $UO_{2+x}$ excitation source in electrical communication with the first single $UO_{2+x}$ crystal or the first oriented crystal $UO_{2+x}$ film but separated by an insulating barrier such that imposing a voltage on the excitation source creates a voltage within the $UO_{2+x}$ but does not produce any current. The excitation source is configured to polarize a region of the first single crystal or the first oriented crystal $UO_{2+x}$ film to activate the non-equilibrium polaronic condensate and determine an electrical conductivity of the first single crystal or the first oriented crystal $UO_{2+x}$ film. Analogous to photoexcitation, a first state of the excitation source causes the first single $UO_{2+x}$ crystal or the first oriented crystal $UO_{2+x}$ film to be electrically conducting. A second state of the excitation source causes the first single $UO_{2+x}$ crystal or the first oriented crystal $UO_{2+x}$ film to be electrically non-conductive.

In some embodiments, the $UO_{2+x}$ excitation source applies a first voltage that is in a first voltage range to the first single $UO_{2+x}$ crystal or the first oriented crystal $UO_{2+x}$ film when the $UO_{2+x}$ excitation source is in the first state, and the $UO_{2+x}$ excitation source applies a second electric voltage that is in a second voltage range to the first single $UO_{2+x}$ crystal or the oriented crystal $UO_{2+x}$ film when the $UO_{2+x}$ source is in the second state. The selection of the state by manipulation of the excitation source is analogous to photoexcitation.

In some embodiments, the $UO_{2+x}$ excitation source applies a light with an energy of 2.5-3.5 eV and with a fluence of 0.1-5 milliJoules/cm$^2$ to the first single $UO_{2+x}$ crystal or the first oriented crystal $UO_{2+x}$ film when the $UO_{2+x}$ excitation source is in the first state, and the $UO_{2+x}$ excitation source applies (i) a light with an energy of 4-5 eV with a fluence of 0.1-5 milliJoules/cm$^2$ or (ii) no light to the first single $UO_{2+x}$ crystal or the first oriented crystal $UO_{2+x}$ film when the $UO_{2+x}$ excitation source is in the second state. Light with an energy of 0.5-2.5 eV with a fluence of 0.1-5 milliJoules/cm$^2$ may also be used to stimulate the coherence.

In some embodiments, when the first single $UO_{2+x}$ crystal or the first oriented crystal $UO_{2+x}$ film is electrically conducting, an observable of the first single $UO_{2+x}$ crystal or the first oriented crystal $UO_{2+x}$ film is detectable when the first single $UO_{2+x}$ crystal or the first oriented crystal $UO_{2+x}$ film is exposed to a magnetic field of 0.1 gauss or greater either interacting with the magnetic moments of the electrons participating in the quantum-phase condensate to modify the energy of the state in which they reside and change that state of the first single $UO_{2+x}$ crystal or the first oriented crystal $UO_{2+x}$ film. In some such embodiments, the observable comprises: a change in resistance between the first lead and the second lead, an absorption or emission of electromagnetic radiation by the first single $UO_{2+x}$ crystal or first oriented crystal $UO_{2+x}$ film, or a change in voltage between the first lead and the second lead.

In some embodiments, the $UO_{2+x}$ excitation source applies a first laser pulse that is between 2.5 and 3.5 electron volts at the first single $UO_{2+x}$ crystal or the first oriented crystal $UO_{2+x}$ film when the $UO_{2+x}$ excitation source is in the first state, and the $UO_{2+x}$ excitation source applies a second laser pulse that is between 4 and 5.2 electron volts at the first single $UO_{2+x}$ crystal or the first oriented crystal $UO_{2+x}$ film when the $UO_{2+x}$ excitation source is in the second state. A laser pulse of 0.5-1.5 eV may also be used to enhance the coherence of the quantum phase-condensate.

In some embodiments, the first laser pulse switches the first single $UO_{2+x}$ crystal or the first oriented crystal $UO_{2+x}$ film from electrically insulating to electrically conducting in less than 50 femtoseconds. In some such embodiments, the second laser pulse switches the first single $UO_{2+x}$ crystal or the first oriented crystal $UO_{2+x}$ film from electrically conducting to electrically insulating in less than 50 femtoseconds.

In some embodiments, an additional insulating layer is placed under the substrate (104) to provide an additional electrical barrier with the material on which the device resides that provides additional structural integrity and the optimum properties for the end use application and its fabrication that may include other devices made with $UO_2$ or other materials.

In some embodiments, the first single $UO_{2+x}$ crystal or the first oriented crystal $UO_{2+x}$ film has a resistivity of less than $10^{-4}$ Ω·cm when the first single $UO_{2+x}$ crystal or the first oriented crystal $UO_{2+x}$ film is electrically conducting.

In some embodiments, the first single $UO_{2+x}$ crystal or the first oriented crystal $UO_{2+x}$ film is in the [111] orientation with respect to the substrate.

In some embodiments, x is in the range −0.05 to 0.35.

In some embodiments, the first lead comprises a first metal and the second lead comprises a second metal. In some such embodiments, the first metal is the same as the second metal. In some such embodiments, the first metal and the second metal are the same or different and are each selected from the group consisting of gold, copper, aluminum, silver, platinum, and similar metals commonly used as conductors in electrical devices. In some embodiments more specialized materials may be used because they have necessary properties such as magnetism or because they are better suited for the device and its fabrication. These could include iron and other magnetic materials or heavily doped silicon or related materials.

In some embodiments, the device is a superconducting field effect transistor in which the first lead is the source, the second lead is the drain, the $UO_{2+x}$ excitation source is the gate. In some such embodiments, the $UO_{2+x}$ excitation source comprises an electrode that is separated from the first oriented crystal $UO_{2+x}$ film by an ionic liquid and the $UO_{2+x}$ excitation source applies a first voltage that is in a first voltage range to the ionic liquid when the $UO_{2+x}$ excitation source is in the first state. Further, the $UO_{2+x}$ excitation source applies (i) a second electric voltage that is in a second voltage range or (ii) no voltage to the ionic liquid when the $UO_{2+x}$ excitation source is in the second state. In a field effect transistor the channel opened by the gate voltage it typically only at most only a few nm in height. The quantum-phase condensate, however, stabilizes the voltage induced charge carriers and can diffuse through a large volume of the material. This is the explanation for the results in the time resolved THz experiment described below. This was performed in transmission where the THz passed through the material twice because the recorded signal was after reflecting off of the back side. The penetration depth of the excitation pulse was only a few nm because of the high absorptivity of $UO_2$ in this energy range. The only way to get the observed results in which a spectrum that was not that of $UO_2$ was recorded is if the quantum phase formed by the excitation had spread through the entire volume of material.

In some embodiments, additional states of the excitation source and/or additional parameters such as an applied electric, magnetic, or radiant field or the presence of other particles or condensates that can interact by quantum mechanical means may modify the conductivity and other properties of the first single $UO_{2+x}$ crystal or the first oriented crystal $UO_{2+x}$ film.

Another method to control and modify the properties of the first single $UO_{2+x}$ crystal or the first oriented crystal $UO_{2+x}$ film provided by the present disclosure is to introduce mechanical strain by compression, tension, or bending that slightly modifies the distances between the atoms and the degree of overlap of the electronic states or, for oriented crystal $UO_{2+x}$ films, to fabricate them on a substrate with a known degree of epitaxial mismatch that will also strain the $UO_{2+x}$ film.

Another aspect of the present disclosure provides an electrical device operating in a range of −273° C. to 100° C. The electrical device comprises an insulating substrate having a surface. The electrical device further comprises a first single $UO_{2+x}$ crystal or a first oriented crystal $UO_{2+x}$ film that is in a metastable electrically conducting state, stabilized by mechanical strain as described above or by an alternative means. The electrical device further comprises a first lead comprising a first electrically conductive material on a second portion of the surface, wherein the first lead is in electrical contact with a first portion of the first single $UO_{2+x}$ crystal or the first oriented crystal $UO_{2+x}$ film. The electrical device further comprises a second lead comprising a second electrically conductive material on a third portion of the surface. The second lead is in electrical contact with a second portion of the first single $UO_{2+x}$ crystal or the first oriented crystal $UO_{2+x}$ film. A third portion of the first single $UO_{2+x}$ crystal or the first oriented crystal $UO_{2+x}$ film is between the first portion and the second portion of the first single $UO_{2+x}$ crystal or the first oriented crystal $UO_{2+x}$ film and is not in direct electrical contact with either the first lead or the second lead.

In some embodiments, the first single $UO_{2+x}$ crystal or the first oriented crystal $UO_{2+x}$ film is patterned to form a closed form path, and a current flows in the closed form path without resistance. In some such embodiments, the electrical device serves as a battery for an electrical load serviced by the first and second lead. In some such embodiments, the first single $UO_{2+x}$ crystal or the first oriented crystal $UO_{2+x}$ film maintains a current through the closed form path for a period of time after a current initiating source is removed from the closed form path. In some such embodiments, the first single $UO_{2+x}$ crystal or the first oriented crystal $UO_{2+x}$ film weighs less than 30 g and stores 3 Wh or more of electricity.

In some embodiments, the electrical device serves as a sensor in which an observable of the first single $UO_{2+x}$ crystal or the first oriented crystal $UO_{2+x}$ film is detectable when the first single $UO_{2+x}$ crystal or the first oriented crystal $UO_{2+x}$ film is exposed to a magnetic field of 0.1 gauss or greater. In some such embodiments, the observable comprises: a change in resistance between the first lead and the second lead, an absorption or emission of microwaves by the first single $UO_{2+x}$ crystal or the first oriented crystal $UO_{2+x}$ film, or a change in voltage between the first lead and the second lead.

BRIEF DESCRIPTION OF THE SEVERAL VIEWS OF THE DRAWING

FIG. 1(A) illustrates the energies for $UO_2$, $U_4O_9$, and $U_3O_7$ XAS that were obtained from the NIXS measurements and the others adjusted from literature values (40) to this $UO_2$. The broadening of the overall 5f-6d manifold of the mixed valence compounds occurs on the low energy edge of the upper Hubbard band. In addition to some variability in the relative amplitudes between different samples of the same compound, the NIXS(18) that is not distorted by self-absorbance shows that the 531.5 eV peak in the $U_3O_7$ spectrum is quite low relative to the others.

FIG. 4(A) illustrates how 4.7 eV excitation does not have a thermalized component, suggesting that the heat from the excitation pulse has already been distributed across all of the different reservoirs throughout the crystal within the 40 fs time resolution. FIG. 4(B) that is the same as (A) but with 3.1 eV excitation energy shows a monotonic increase in the x intercept with increasing fluence, but this is small relative to other materials and includes the intersection of the plateau region at higher energies. We conclude that, even if there is some electron heating, like the excitation at 4.7 eV it is much smaller than expected so as to demonstrate the same effects. Extremely rapid heat flow is a property of superfluids, so these results are consistent with the condensate interpretation. From (20).

FIG. 5(A) illustrates that, although energetically favored by ΔE, relaxation of the excited state is inhibited by an activation energy with a barrier height of Ea, promoting the accumulation of particles to give an excess, non-equilibrium population in the closed channel that will become the condensate. The inhibition is maximized when the energy of the excited state is in proximity to the chemical potential that will be between the occupied ground state and lowest unoccupied state. FIG. 5(B) illustrates that coherent transfer between the open and closed channels is promoted by a Fano-Feshback resonance that is maximized when the energy of the excited, S=0 state is in proximity to the individual particle energy of the S≠0 state. The barrier height for the reverse reaction is therefore zero. ΔE for $UO_{2+x}$=−2.2 eV, which is very close to the energy between the centers of the $U_4O_9$ U 5f highest occupied state and the and the lowest feature in the $UO_{2+x}$ spectra (FIGS. 2B and C) that corresponds to the lowest energy excited state, therefore meeting the Fano-Feshback criterion. From (20).

FIG. 8 illustrates the generic response of a material to femtosecond, high fluence optical laser pulse. The coincidence of the Fermi level with the occupied states shows that this is a metal, but this scheme is also true for insulators. FIGS. 8a) and 8b) from (41).

11, the electrons in the current directly excite those in the material analogous to photoexcitation and obviating the need for laser excitation.

Figure 13:
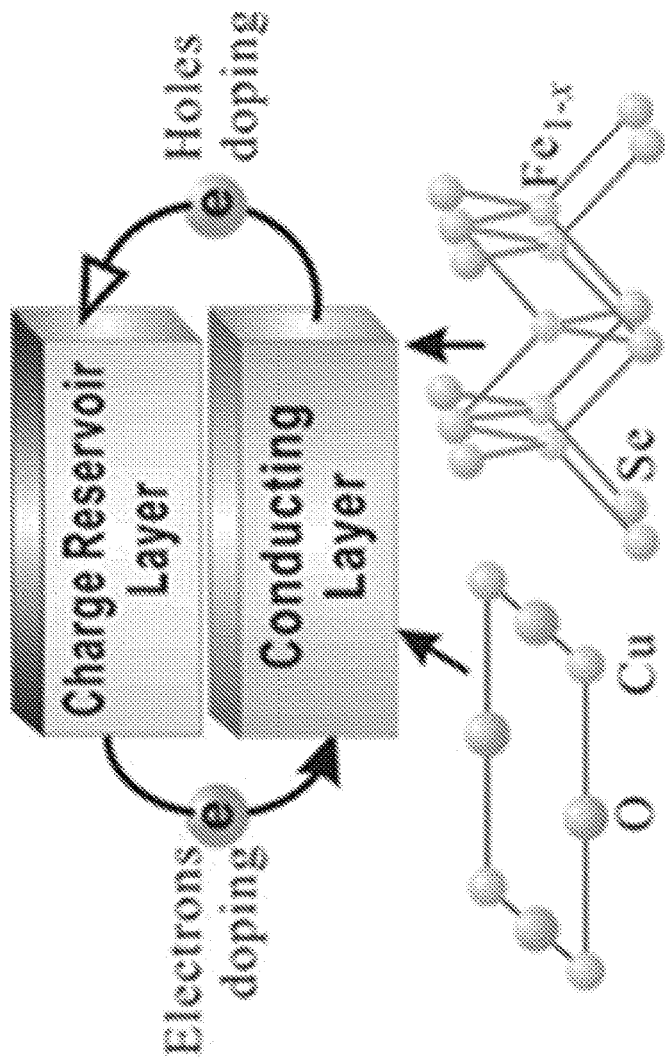
Figure 13:
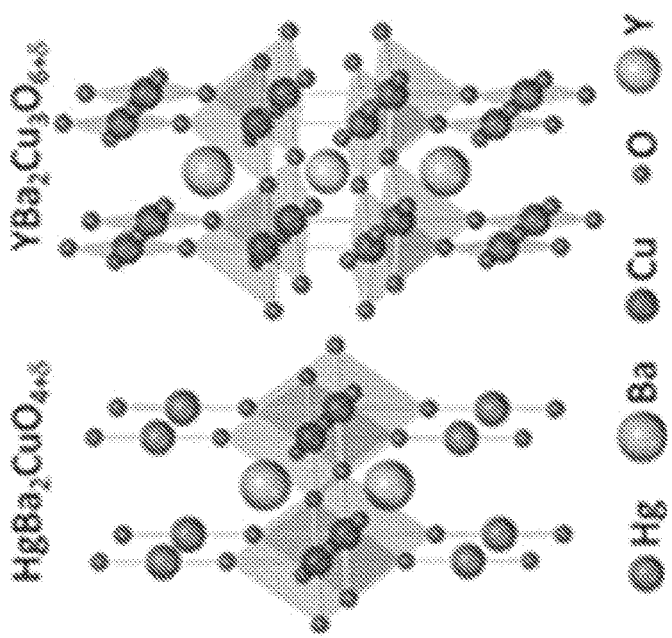

FIG. 13 illustrates the domain structure of exotic superconductors in which the crystal structures of a single $CuO_2$ layer mercury cuprate and the double layer $YBa_2Cu_3O_7$ compound show the $CuO_2$ planes, which when stacked are held together with another cation such as $Y^{3+}$ or $Ca^{2+}$, which are separated by an insulating Ba—O layer from the Hg—O or CuO domain that injects charge into the planes. This structural motif with separated conducing and charge reservoir layers is common to a number of quantum materials. An artificial heterostructure of this type fabricated with $UO_2$ as the conducting layer could inject holes and create the quantum phase-condensate statically.

Figure 14A:
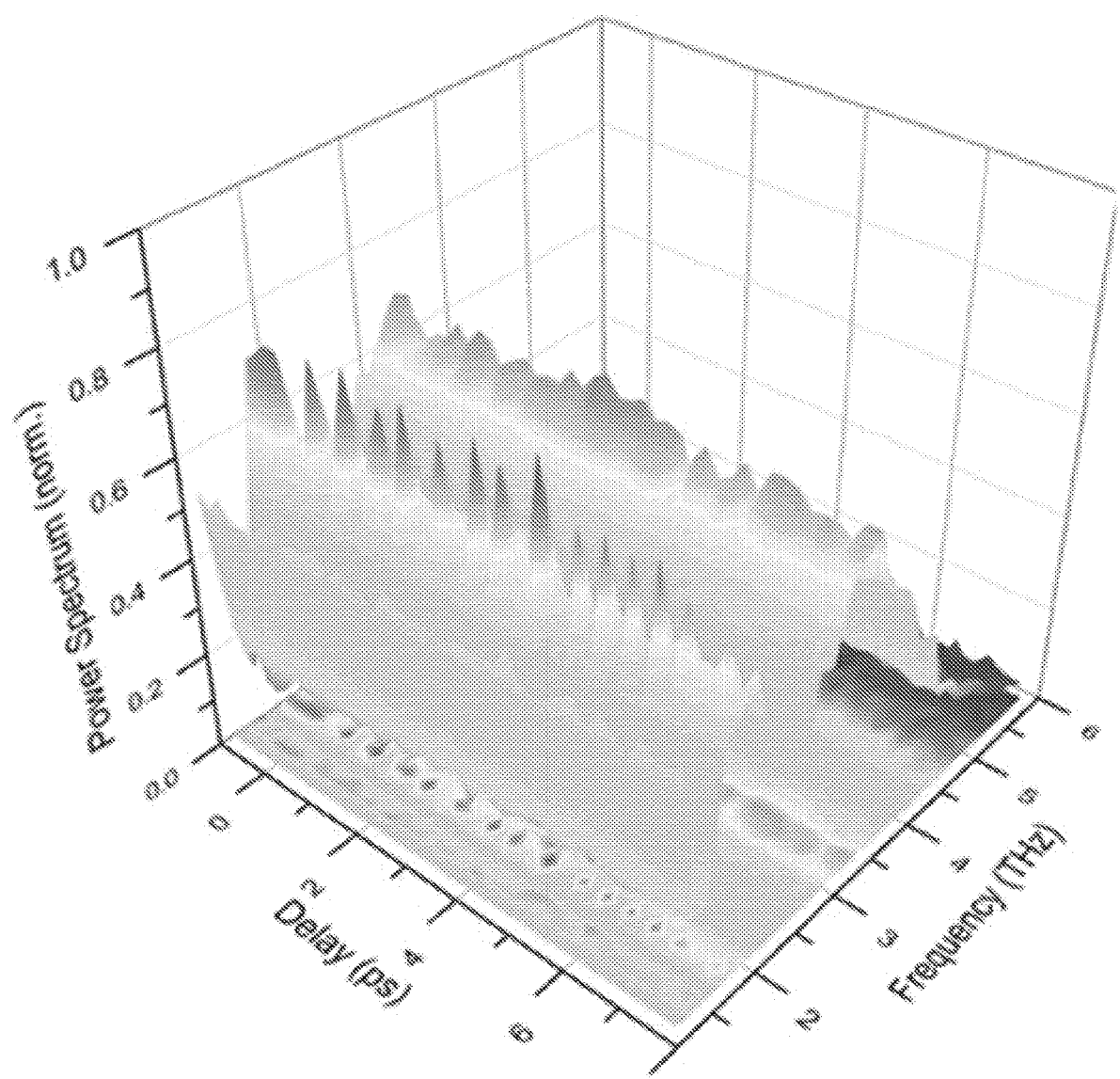

FIG. 14A illustrates the TDTS transmission power spectrum through ~5 THz after excitation with a 40 fs 1.51 eV laser pulse. The features in this spectrum that are identical for other laser excitation energies are not the $UO_2$ phonons in this range, so they belong to the (photoinduced) polaron quantum phase-condensate. The coherent oscillation that is indicative of a condensate is observed at 1.7 THz at a maximum in transmitted power and only with 1.5 eV excitation.

Figure 14B:
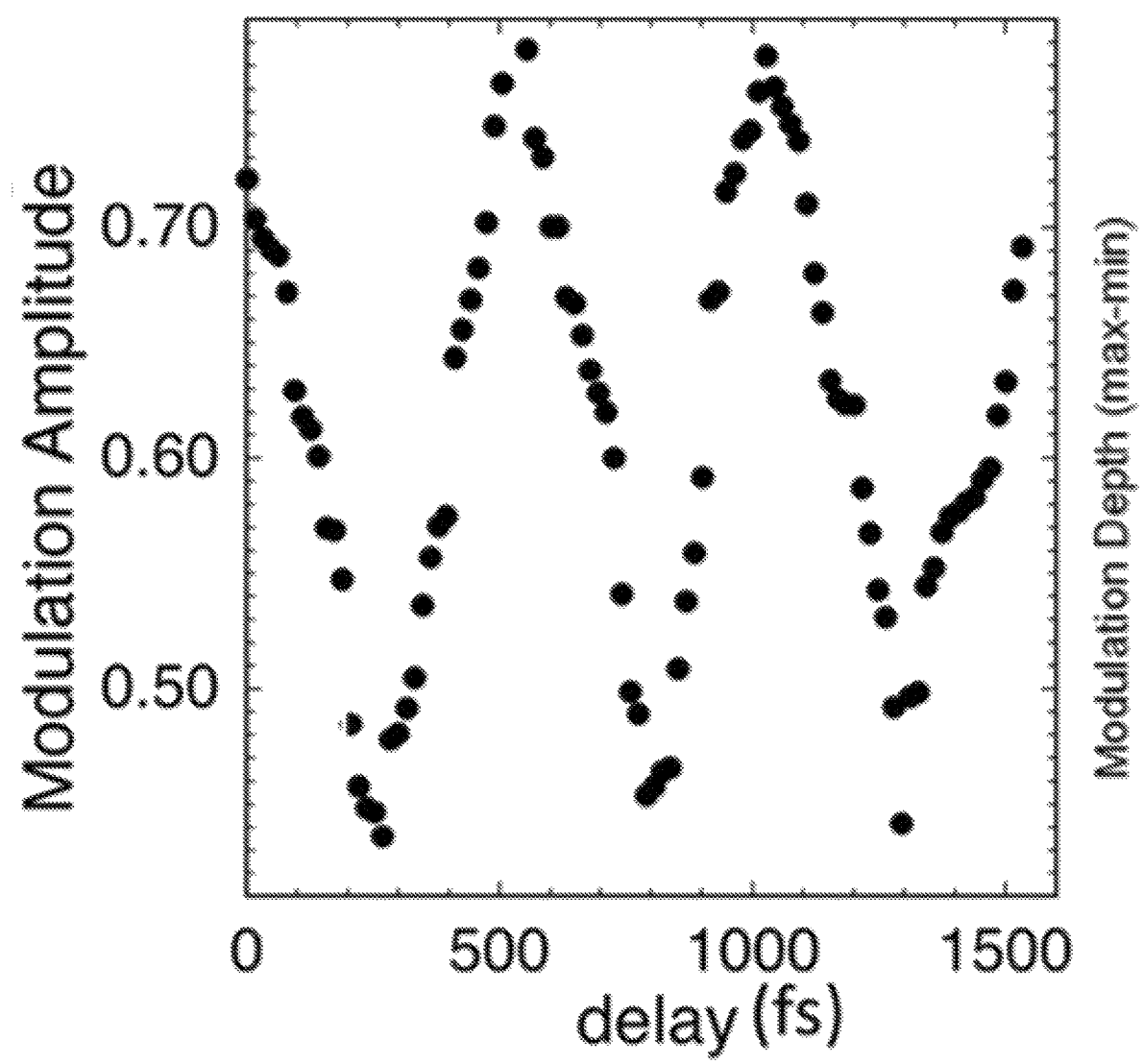
Figure 14C:
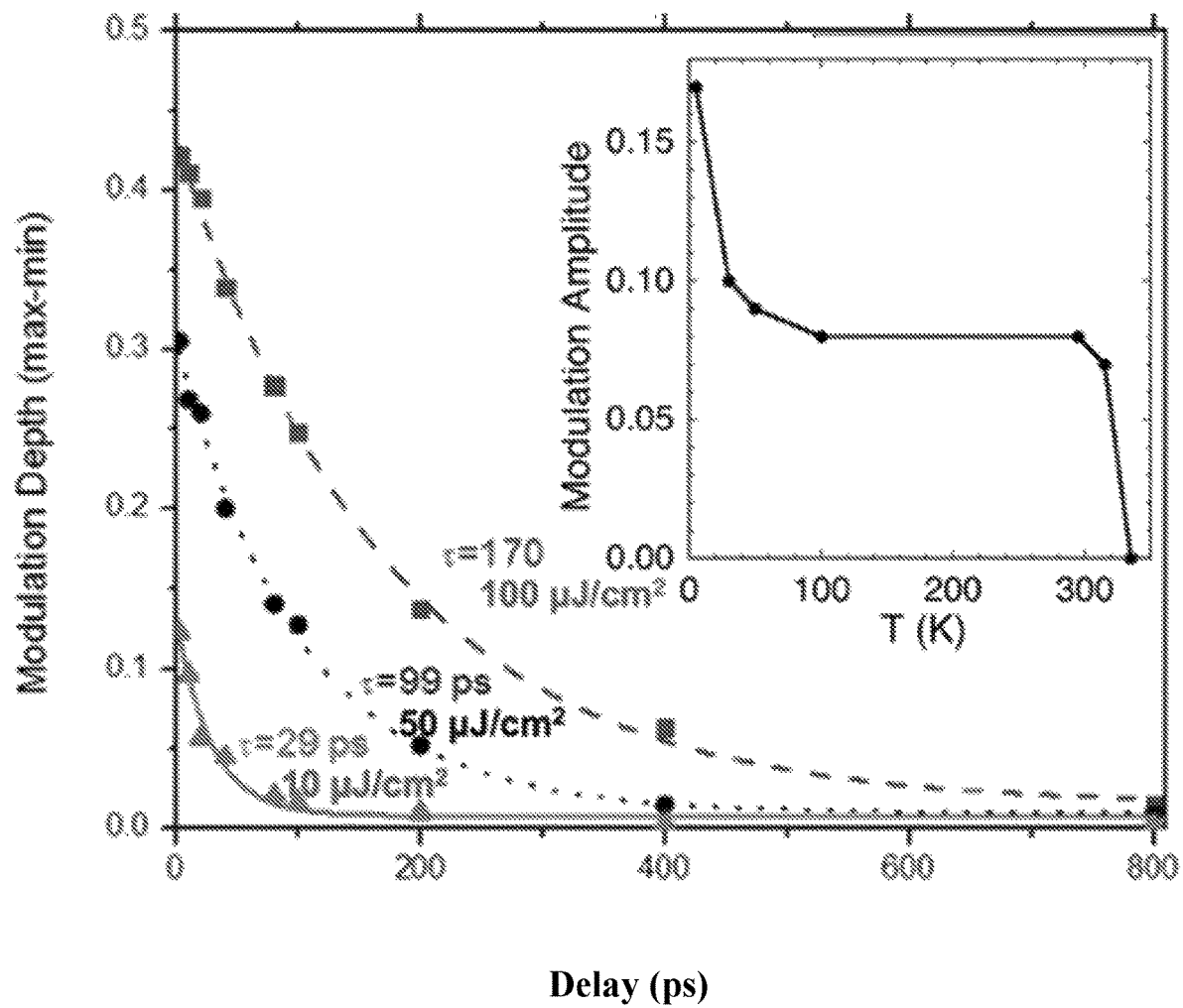

FIG. 14 B illustrates how the TDTS at 1.7 THz shows the regularity in the oscillatory portion of the transmission that is diagnostic for the coherence. It is also notable that the maximum amplitude is attained almost immediately, with no other spectral features at t=0, consistent with other experimental probes that indicate ultrafast switching into the metastable states.

FIG. 14 C illustrates the coherence amplitude as a function of time at three different fluences. At high fluence the coherence extends for hundreds of cycles even through 300 K (inset), corresponding to the quasiparticle lifetime.

Figure 15:
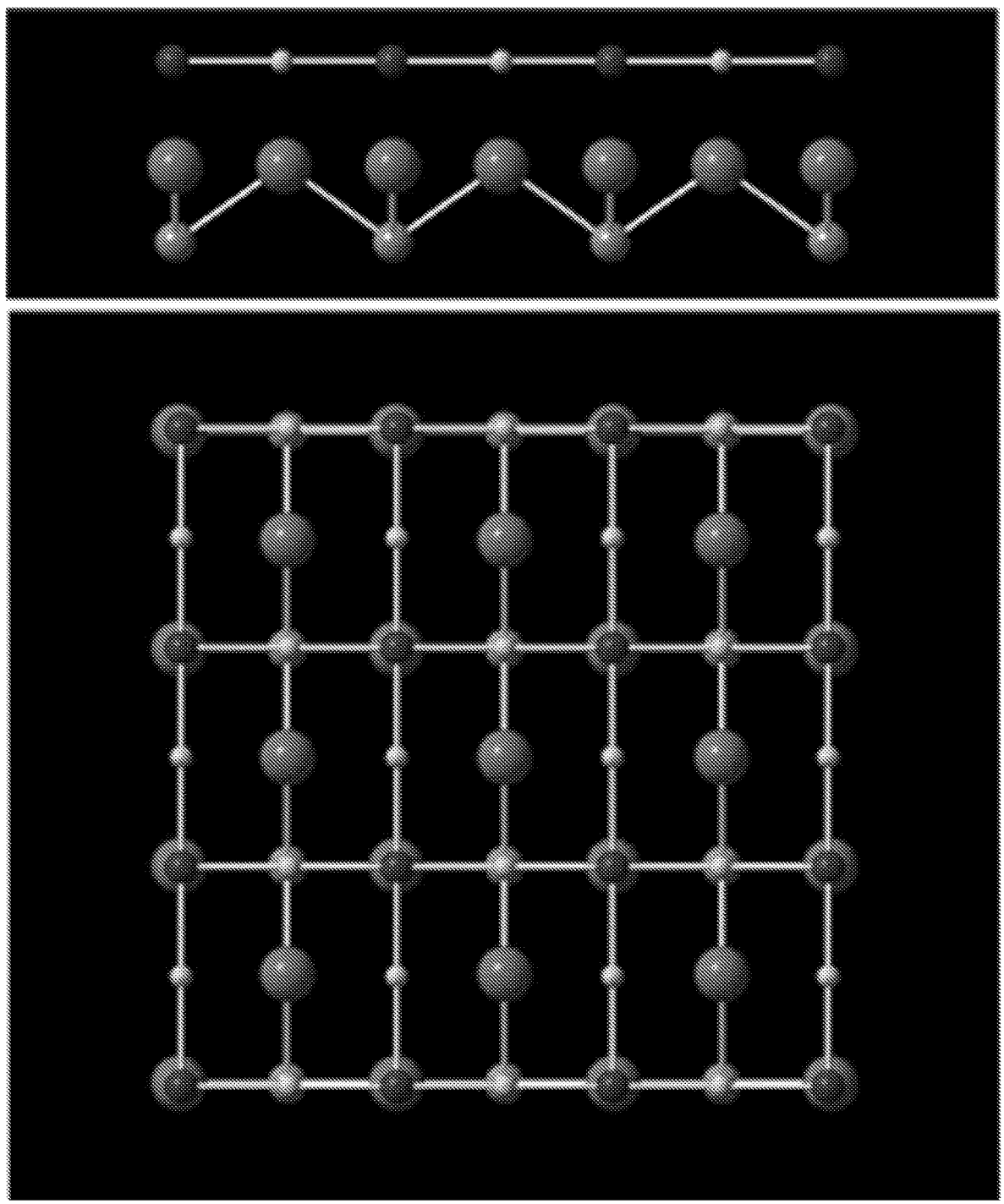

FIG. 15, upper panel illustrates the profile through (001) $CuO_2$ plane of a cuprate, where Cu=blue, O=green; over (111) U plane of $UO_2$; U=grey, O=red while the lower panel illustrates a vertical view through same structure, where Cu ions are directly over O of $UO_2$ so that their coordination sites are identical to those in the cuprate. The epitaxial mismatch of only a few percent can easily be seen. The proximity allows the BCS condensate in the $CuO_2$ planes and BEC condensate in the $UO_2$ to mix. A heterostructure as described in FIG. 13 could therefore conceivably be fabricated with a cuprate.

Figure 16:
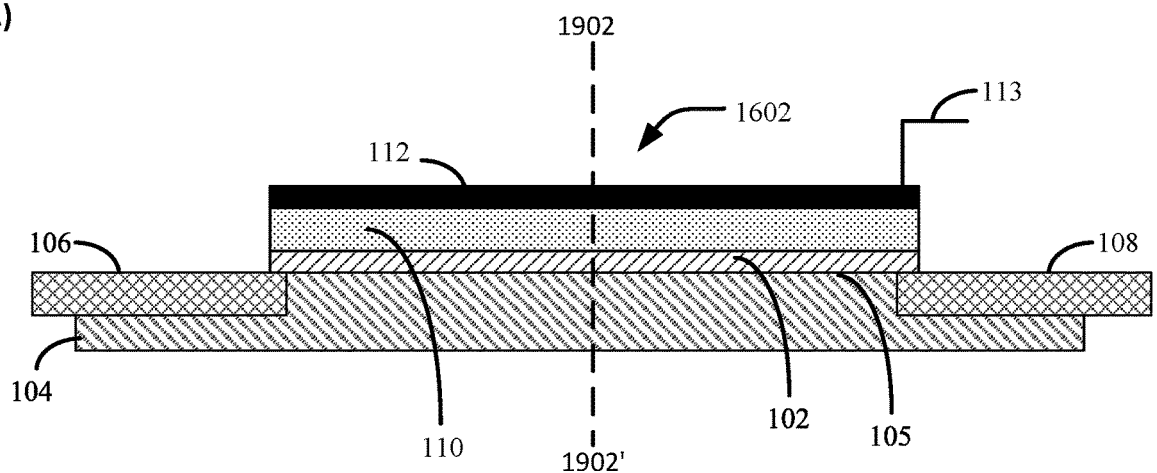
Figure 16:
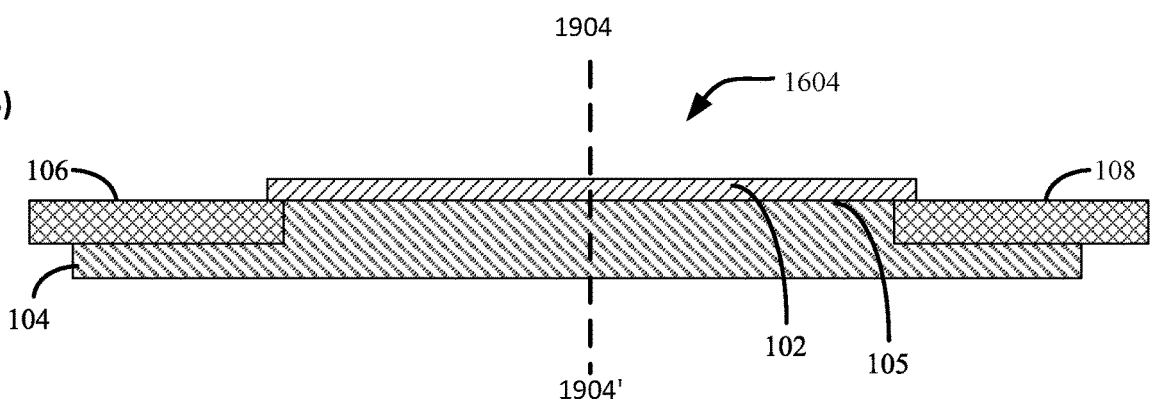
Figure 16:
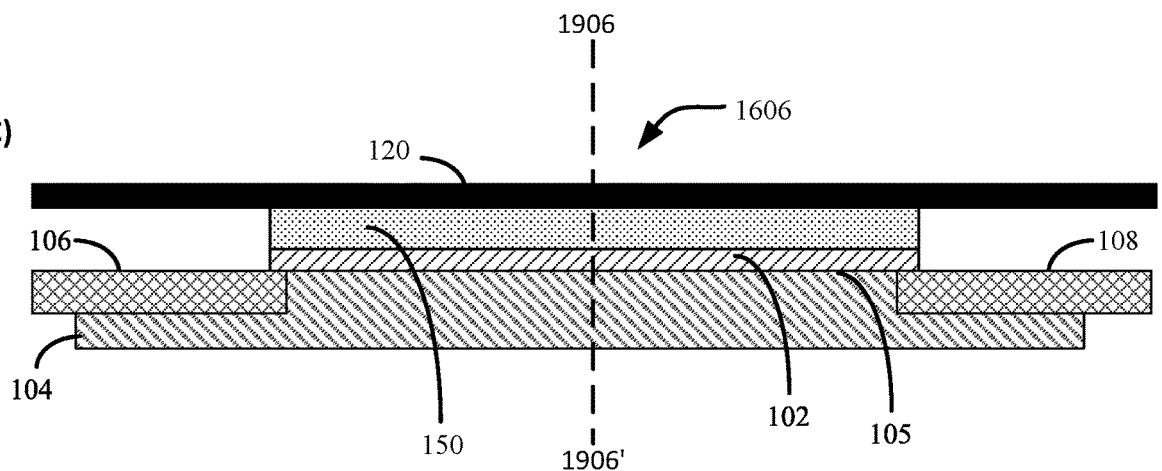

FIGS. 16 (A), 16 (B), and 16 (C) each illustrate a sectional view of electrical devices in accordance with an embodiment of the present application.

Figure 17:
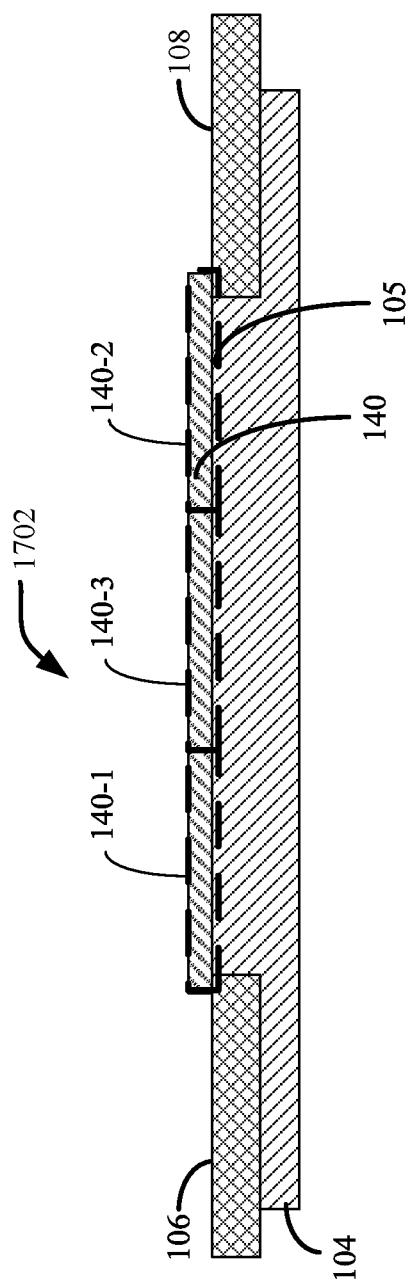

FIG. 17 illustrates a sectional view of an electrical device in accordance with an embodiment of the present application.

Figure 18:
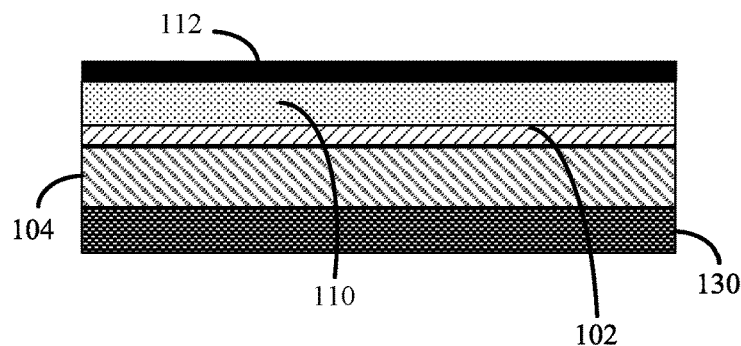
Figure 18:
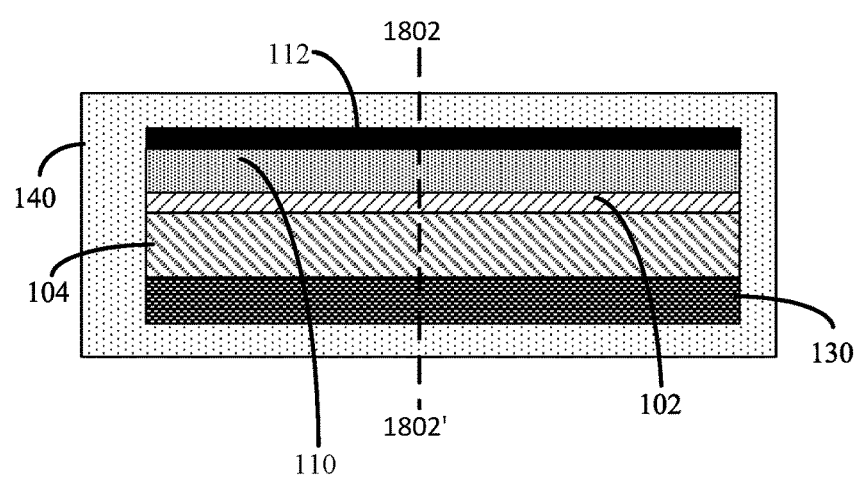
Figure 18:
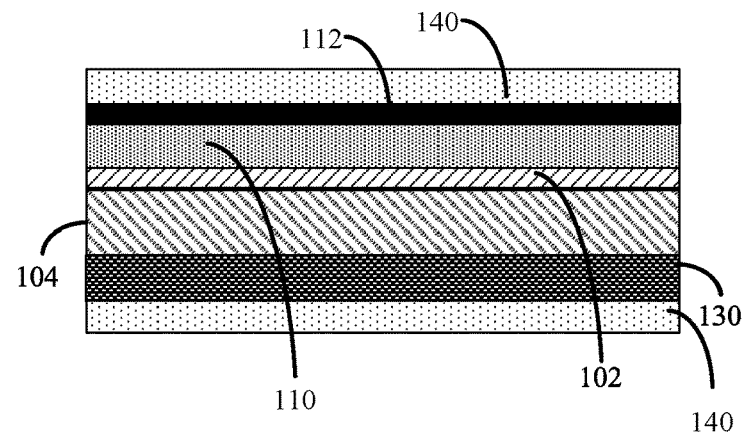

FIGS. 18 (A) and 18 (B), illustrate cross-sectional views of electrical devices in accordance with an embodiment of the present application and FIG. 18 (C) illustrates a sectional view of an electrical devices in accordance with an embodiment of the present application.

Figure 19:
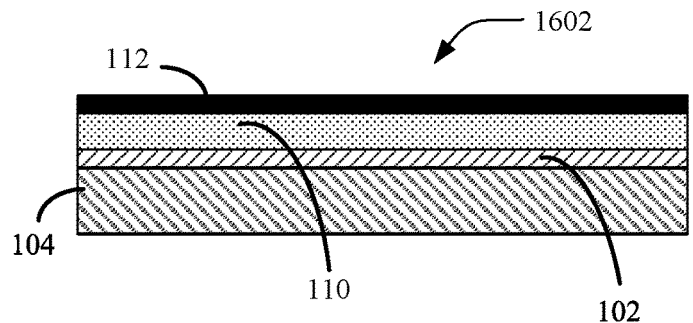
Figure 19:
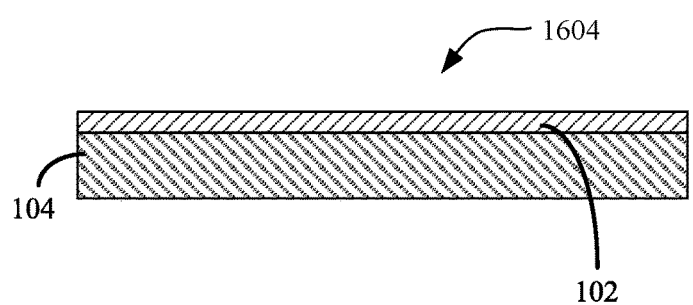
Figure 19:
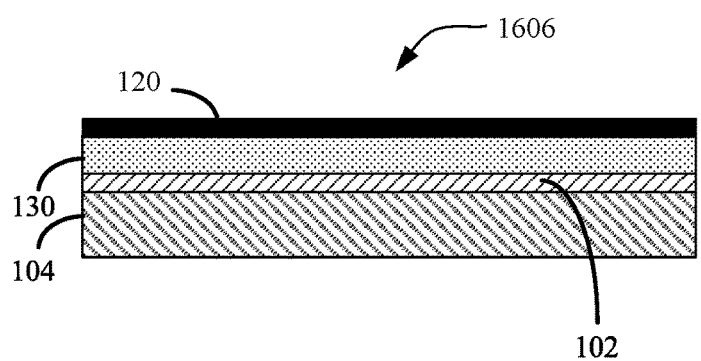

FIGS. 19 (A), 19 (B), and 19 (C) each illustrate a cross-sectional view of the respective electrical devices of FIGS. 16 (A), 16 (B), and 16 (C) in accordance with an embodiment of the present application in which there is a single $UO_{2+x}$ crystal or the first oriented crystal $UO_{2+x}$ film between first and second leads.

Figure 20:
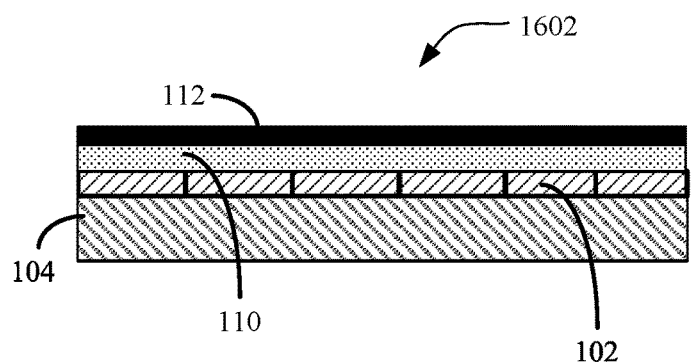
Figure 20:
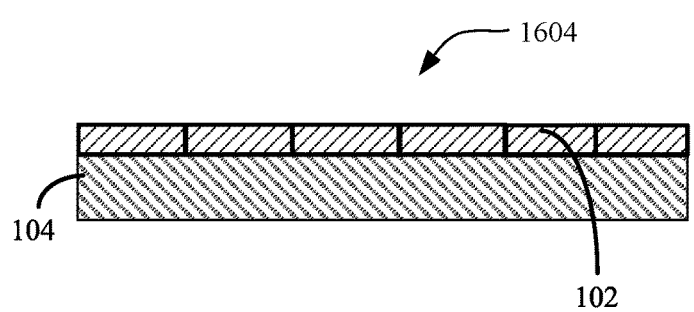
Figure 20:
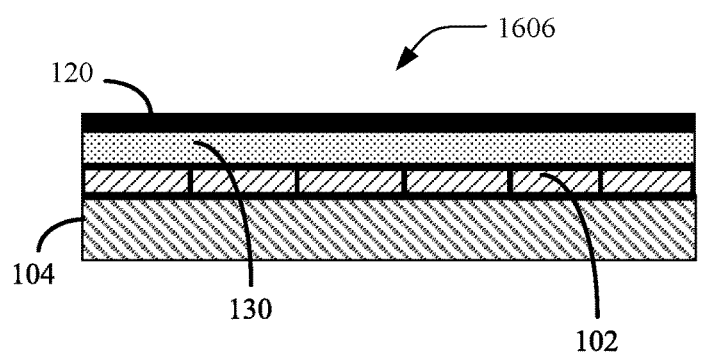

FIGS. 20 (A), 20 (B), and 20 (C) each illustrate a cross-sectional view of the respective electrical devices of FIGS. 16 (A), 16 (B), and 16 (C) in accordance with an embodiment of the present application in which there are multiple single $UO_{2+x}$ crystal or the first oriented crystal $UO_{2+x}$ films between first and second leads.

Like reference numerals refer to corresponding parts throughout the several views of the drawings.

DETAILED DESCRIPTION

Conradson et al., 2015, "Possible demonstration of a polaronic Bose-Einstein(-Mott) condensate in UO2(+x) by ultrafast THz Spectroscopy and microwave dissipation." *Scientific Reports* 5, 15278, (hereinafter, "Conradson 2015"), which is hereby incorporated by reference, discloses ultrafast optical pump-time domain THz probe spectroscopy on $UO_2$ crystals performed at Los Alamos National Laboratory. Conradson 2015 discloses that the quantum phase formed by laser excitation at 1.6 eV possesses extraordinary coherence throughout the host crystal in the form of periodic oscillations in amplitude that persist for hundreds of ps that and are observed through room temperature. Speculation, together with the results of Conradson 2015 indicate that the quantum phase both only forms after a certain threshold in terms of the number of photoinduced polarons and also saturates. This would be coherent exchange with another entity in the crystal and constitutes a signature of the proposed Bose-Einstein condensates. Conradson 2015 discloses electron paramagnetic resonance spectroscopy on $UO_{2+x}$ performed at University of Rochester. The spectra are unique and show that $UO_{2+x}$ hosts a number of different states with peculiar collective properties. Conradson 2015 concludes that the quantum phase formed by the polarons in $UO_{2+x}$ and $UO_{2(+x)}$ exhibits unique or at least extraordinary coherence and collective properties that can persist up to 300 K. Conradson 2015 speculates that coherence mechanism involves an excitation that is specifically an internal charge transfer reaction coupled to a phonon.

The experimental results disclosed herein advance the understanding of $UO_{2+x}$. In experimental results disclose herein, U $M_5$ Resonant Inelastic X-ray Scattering, Non-resonant Inelastic X-ray Scattering, and O XAS on $UO_{2+x}$ were performed at, respectively, the European Synchrotron Radiation Facility, Advanced Photon Source, and Stanford Synchrotron Radiation Laboratory, and calculations were performed at University of Washington, Los Alamos National Laboratory, and University of North Texas. This combination of experiments that are now carefully calibrated by recourse to the scientific literature and to the calculations show that, in $UO_{2+x}$, the gap in $UO_2$ is being closed specifically by the formation of new states from the high energy, unoccupied electron levels and that there are even tails that may overlap with the occupied U 5f states to give a continues density-of-states as in metals. This is either unique or extraordinary. Disclosed herein, are ultrafast optical laser pump-photoemission probe experiments: with 4.7 eV excitation into the U 6d levels these immediately give the unoccupied $UO_2$ density-of-states, but with 3.1 eV excitation in the U 5f levels these i give a continuous population of electrons through 3 eV above the Fermi level. Both of these results occur immediately within the 40 femtosecond width of the excitation laser pulse, with no intermediates, which is unprecedented. For 4.6 eV there are no "hot" electrons, indicating that the energy dissipation from the hot electrons also occurs immediately. For 3.1 eV the density of states on the high energy side of the highest occupied state does shift with increasing fluence, giving the appearance of some electron heating. This may, however, be the intersection of the plateau-like density of states that was not removed from the fit with the occupied states or may also be from relaxation from this unique type of electron spectrum. It is therefore likely that the heat transfer from the 3.1 eV state is also exceptionally fast. This is a characteristic of condensates, resulting from their superfluid properties. The lifetimes of these states are several picoseconds, and the relaxation appears to occur by loss of the photoexcited polarons, not decay of these states. Thus, the electronic states resulting from O-doping and photoexcitation appear to be the same state or similar; the polaronic quantum phase has many unique properties. The quantum phase identified here is the same as in the other experiments. The continuum of electrons created with 3.1 eV excitation must be metallic and conducting by our understanding of electronic structure in which metals contain partly filled bands. In fact, it would be a "superthermal" metal with an extraordinarily large number of carriers whose velocities would be maximum because they are continuous with and extend past the Fermi level. The postulated mechanism is consistent with these new experiments, as is the association with certain theories involving exchange between two states at the Fermi level and particular energy resonances.

What is absent from Conradson 2013, Conradson 2015, and Conradson 2017 is any theoretical basis for the experimental results that could be used to help connect and explain them. Without intending to be limited by any particular theory, a theoretical basis for these experimental results is the concept of a non-equilibrium Bose-Einstein condensates, using excited phonons as the basis, although this could be more general, as first proposed by Herbert Fröhlich in 1968. Over the last 14 years, work has been performed on laser excitation in quantum well materials that is now believed to produce a certain type of non-equilibrium BEC made of polariton-excitons. These can go to room temperature, but this is because they have almost no mass. In the last two or three years the amount of effort spent on these has grown because of possible applications in communications technology. Another type of non-equilibrium BEC can be made of magnetic excitations called magnons. The polaron condensates are totally different in that they contain mass, spin, and charge, and could therefore have many more applications than these others. The present disclosure proposes a phonon-based synchronization-resonance mechanism as a theoretical starting point. Theories from other topics are also used, such as the standard atom gas BECs, and high temperature superconductivity. $UO_2$ appears to be a platform where these connections can be identified. The framework for consolidating and rationalizing years of $UO_2$ into the framework of non-equilibrium condensates is a significant advance over the prior art and allows for considerations of how to use $UO_2$ in a broad array of electronic devices. Some such electronic devices make use of the unique immediate transfer of energy among the different channels. Some such electronic devices make use of an optical switching time of $UO_{2(+x)}$, which could be related to the electric switching time, which appears to be at least 10-100 times faster than in any known material and could actually be even more, the "metallic" phase forms immediately. In addition, interpreting the unique electron spectrum with the known physics of conductivity, the conductivity could be higher than a typical metal by a factor of 1 to 100 million. The coherence, conductivity, magnetism, and switching of $UO_{2(+x)}$ all have potential applications.

The systems and methods of the present disclosure further propose the use of $UO_2$ in multilayers with other materials. For example, by coincidence, the lattice parameters of the (111) planes in $UO_{2(+x)}$ are almost identical with the $CuO_2$ planes in cuprates, and thus a multilayer heterostructure synthesized from $UO_2$ and overdoped LSCO, which could induce polarons in the $UO_2$ without lattice defects while simultaneously doping LSCO into its superconducting state, is contemplated in the present disclosure. In fact, are any number of devices could be made from these combinations and could transform the properties of $UO_2$ into or enhance those of its partner.

Specific applications of non-equilibrium polaronic condensate (neqc) in $UO_2$ are now disclosed.

The conductivity of non-equilibrium polaronic condensate in $UO_2$ has commercial application. Based on the electronic structure of the condensate that shows a "superthermal metal," i.e., electrons partially occupying states continuously over an energy range orders of magnitude larger than in a normal metal, the correspondingly large number of carriers are expected to produce extremely high conductances that allow large amounts of current in small amounts of material to reduce the overall size and weight of any electrical component.

Based on the combination of large numbers of free carriers, superfluidity, and coherence, the electronic structure of the non-equilibrium polaronic condensate in $UO_2$ gives the conditions that provide the possibility of superconductivity at elevated temperatures. This superconductivity would have commercial applications. The superconductivity would exist up to the temperatures where these properties persist, which would be much higher than in a normal superconductor because the particles forming the non-equilibrium condensate that would also be or be related to the superconducting condensate exhibit an extremely high density because of their association with the close packed atoms of the crystal lattice and because they are in excited rather than ground states. Because the non-equilibrium polaronic condensate in $UO_2$ is quite stable, its properties could be maintained by a very low energy input. This could be electrical or magnetic as well as by light. It is also possible that once it has been created it could be maintained even by thermal processes. The high conductivity could be used to reduce the size and weight of any electric component, including magnets and motors, the rapid switching time for ultrahigh frequency circuits, and these in combination with its microscopic magnetic properties for ultrasensitive magnetic sensors.

In some embodiments of the present disclosure, the low dissipation in the superconducting or superthermal metallic states allows the non-equilibrium polaronic condensate in $UO_2$ to be used for energy storage at energy densities much higher than current batteries and without the need for massive thermal insulation as with current superconducting technology.

In some embodiments of the present disclosure, the metallic state of the non-equilibrium polaronic condensate in $UO_2$ is switched on instantaneously by application of a laser pulse of the correct energy and fluence and the process reversed by the application of a laser pulse of a different energy. This serves as the basis for (i) optical switches with switching times near zero (e.g., less than 50 femtoseconds) and/or (ii) ultrafast detectors. In some embodiments, the switching can be performed electrically or magnetically thereby providing devices thereby providing electric switches with switching times near zero or at least limited by the other components of the device.

Additional types of materials and circuits encompassed by the present disclosure utilize multilayers composed of $UO_2$ containing the non-equilibrium polaronic condensate and other materials. The interaction between the non-equilibrium polaronic condensate and the carriers in the second material and the low dimensionality of the interface creates materials with additional unique properties derived from the coherence of the condensate. For instance, the coherence could be used for technologies derived from quantum interference such as metrology and other atomtronics applications.

In some embodiments of the present disclosure, the non-equilibrium polaronic condensate is used for quantum computing. Assuming that the interpretation of experimental results as the coherent polaron quantum phase having condensed is correct, the requirements for superposition and entanglement have already been met by the observation of the transitions between the numerous electronic and magnetic states. The high temperatures, presence in an easily handled solid material, and control by electric and magnetic means would provide distinct advantages for qubits. Quantum computing with multiparticle condensates has been shown theoretically to have advantages of single particles in terms of speed, with the disadvantage that it should be more difficult to maintain coherence(45, 46).

In some embodiments of the present disclosure, the non-equilibrium polaronic condensate is used for instantaneous (faster than the speed of light) quantum communications. Although faster than light communication is forbidden by the known laws of quantum mechanics and information theory, algorithms developed by others that circumvent these constraints have been proposed utilizing encoding schemes based on multiparticle systems. If these algorithms are correct then $UO_2$ could be the enabling material. In such embodiments, a single non-equilibrium polaronic condensate would be created in two separate pieces of $UO_2$ (e.g., two separate pieces of a $UO_2$ crystal) by a coherent source such as a laser. These two separate pieces could then be separated and would react instantaneously with each other. Because the non-equilibrium polaronic condensate is composed of a large number of particles and itself has many different states it may be possible, unlike in current entangled systems, to process information via reading the state while maintaining overall coherence through the majority of its constituent particles. Another communications technology fostered by the quantum mechanical attributes of the condensate that would be a substantial improvement over existing single particle qubits is teleportation for secure communications.

In some embodiments of the present disclosure, the non-equilibrium polaronic condensate is used for magnetic sensors and devices. The non-equilibrium polaronic condensate has a unique response to magnetic fields; it contains a number of both single electron and collective states that are controlled by the excess charge density and temperature. This is used in some embodiments for ultrasensitive magnetic sensors because of the energy changes in the energy levels induced by magnetic fields. It also provides a possible means for entanglement and improved qubits.

High Electrical Conductivity: Application to Conductors for Power Transmission, Electronics, and Magnets.

Figure 6:
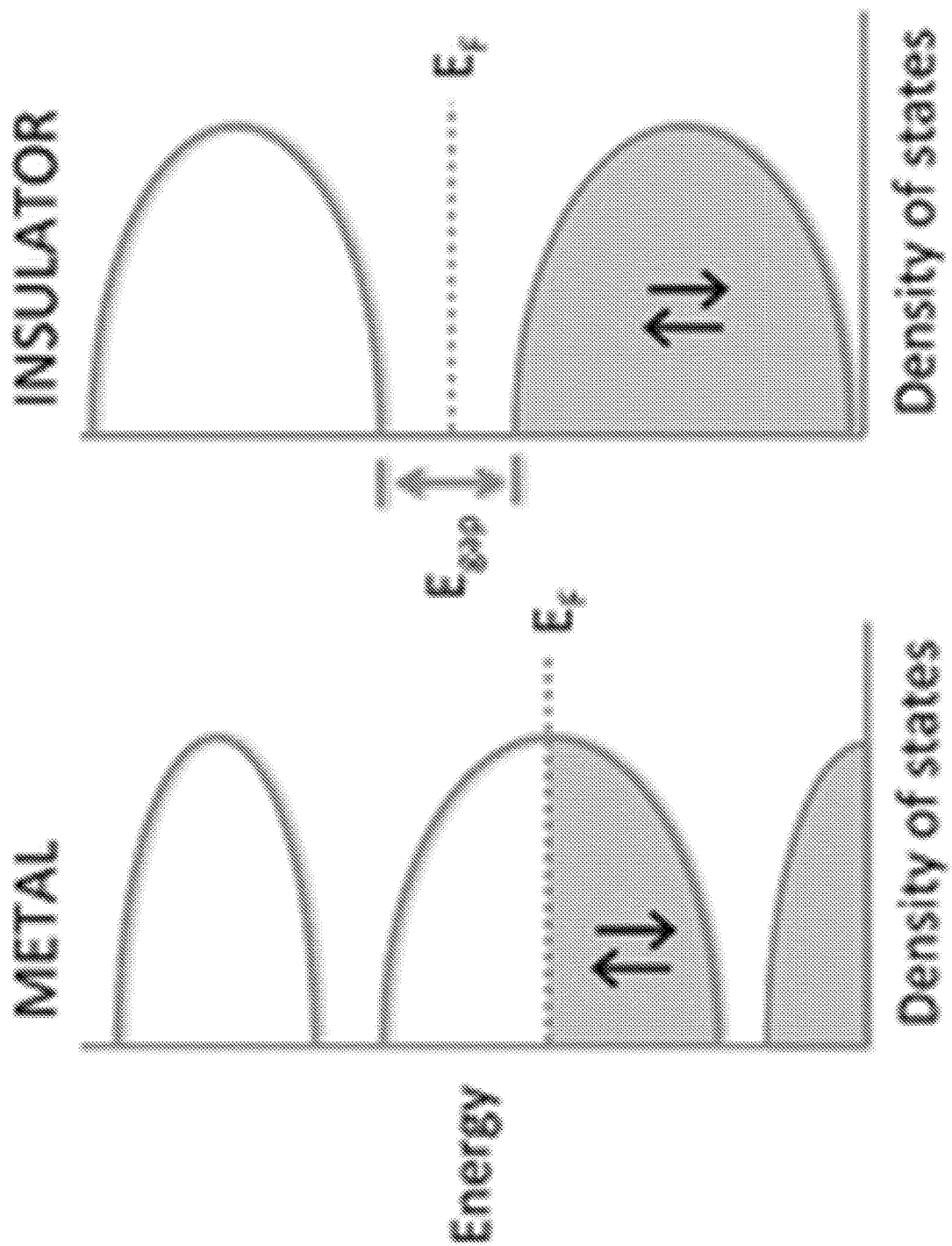
FIG. 6 illustrates Electronic bands in metal and insulator. $E_f$ is the Fermi energy of the highest energy electrons. In the metal $E_f$ occurs within a band, which is therefore only partly occupied and has empty states adjacent to the electrons. In the insulator the valence band below $E_f$ is filled and the highest energy electrons must be elevated by $E_{gap}$ to attain the conduction band where they are able to move through the material.

In some embodiments, the non-equilibrium polaronic condensate is used for power transmission, electronics, and magnets. Metals conduct electricity because electrons subjected to a voltage gradient can move through them via the unfilled states in the partially occupied band in which they reside, in contrast to insulators where the band is filled and they must cross a large energy gap to reside in empty states (FIG. 6).

Figure 7:
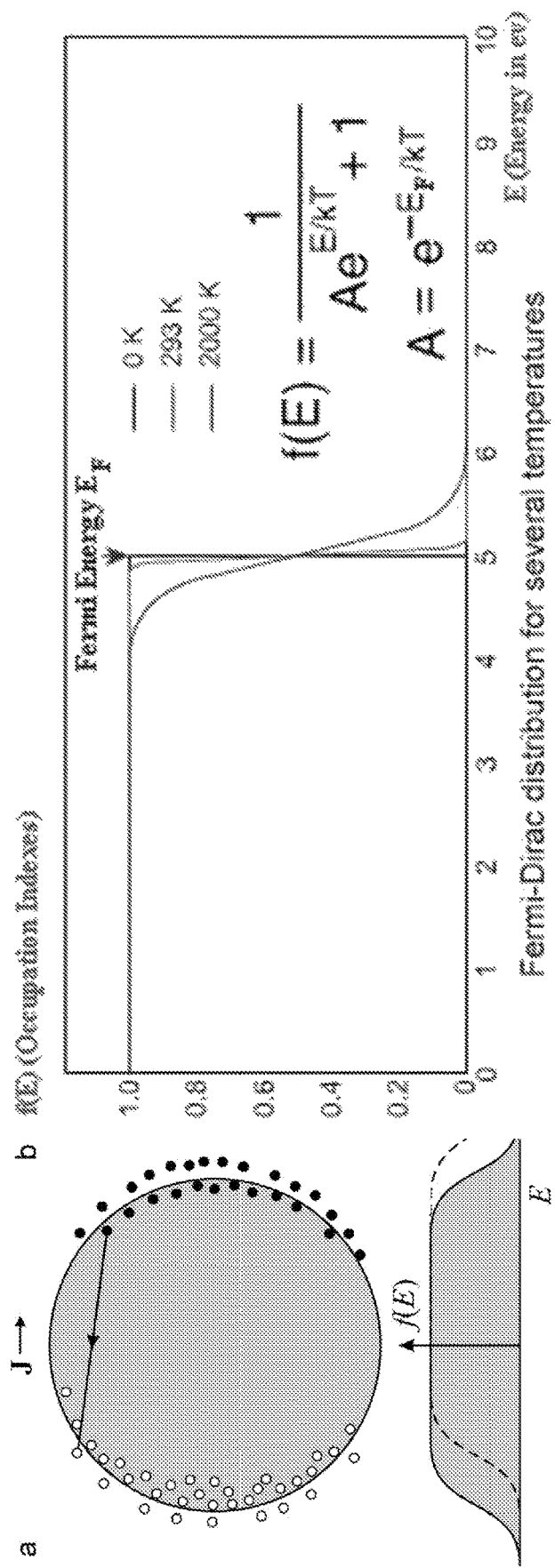
FIG. 7, panel 7a) illustrates displacement of Fermi sphere (top) and corresponding density of states resulting from applied voltage. Black circles are states populated as the result of a shift to the right, empty circles are now vacant (holes). Only the newly populated states carry the current because the momenta of all of the others still in the circle cancel as they did prior to the displacement. The displacement is grossly exaggerated here, the actual displacement is miniscule because the average drift velocity that is calculated over all of the conduction electrons is very small relative to the large velocities of the electrons at the Fermi surface, panel 7b) illustrates Fermi-Dirac distribution of electrons around Fermi level at several temperatures showing the actual distribution of the electrons from the Sommerfeld model.

The process is actually more complicated. Using the conceptually correct quantum mechanical model of Sommerfeld gives a different and more accurate description. Plotting the momenta of the electrons in an electron gas in a metal in three dimensions gives a sphere whose surface is the Fermi surface where the electron energies and velocities are at their maximum. Although all of the electrons are in motion, for any one with a particular momentum there is always another with the opposite momentum so the net current is zero. Applying a voltage displaces the center of the Fermi sphere in the opposite direction (FIG. 7, panel a)). The cancellation of the velocities of the excess electrons on that side is no longer in effect so there is now a net motion and current. This can be averaged over all of the conduction electrons, in which case because of their large numbers their average drift velocity is small, 1 cm/sec for a voltage of 0.1 V/cm. This approach is used in introductory discussions of the microscopic mechanism of electrical conductivity that find on the order of one to three conduction electrons per atom for metals and implies that all of these are involved in current flow. This description is incorrect, the current carriers are the electrons at the Fermi level that have velocities around $10^8$ cm/sec. This large difference indicates that only a correspondingly small fraction of the electrons, $10^{-8}$, from a thin layer at the Fermi level are carrying all the current by moving at the Fermi velocity. The actual quantity determining the current is the number of carriers multiplied by their velocities. The division by the total number of conduction electrons using all the atoms can be applied to the velocity, giving a low average drift velocity, or more accurately to the number carrying the current, giving the very low fraction of electrons in sufficient proximity to the Fermi level. The value calculated for the current is the same regardless. In a copper wire at 300 K the average energy imparted by a 1V/cm gradient is stated to be 4 µeV, which would be the energy shift in the density of states. For comparison the thermal energy from the Fermi-Dirac function is 25 meV of thermal energy (FIG. 7, panel b)). This gives a somewhat higher value for the number electrons carrying the current, of the order of 10 corresponding to the shift of the band edge relative to its total width. Whichever value is used, the fraction is very small because the Fermi velocities are very large.

Figure 8A:
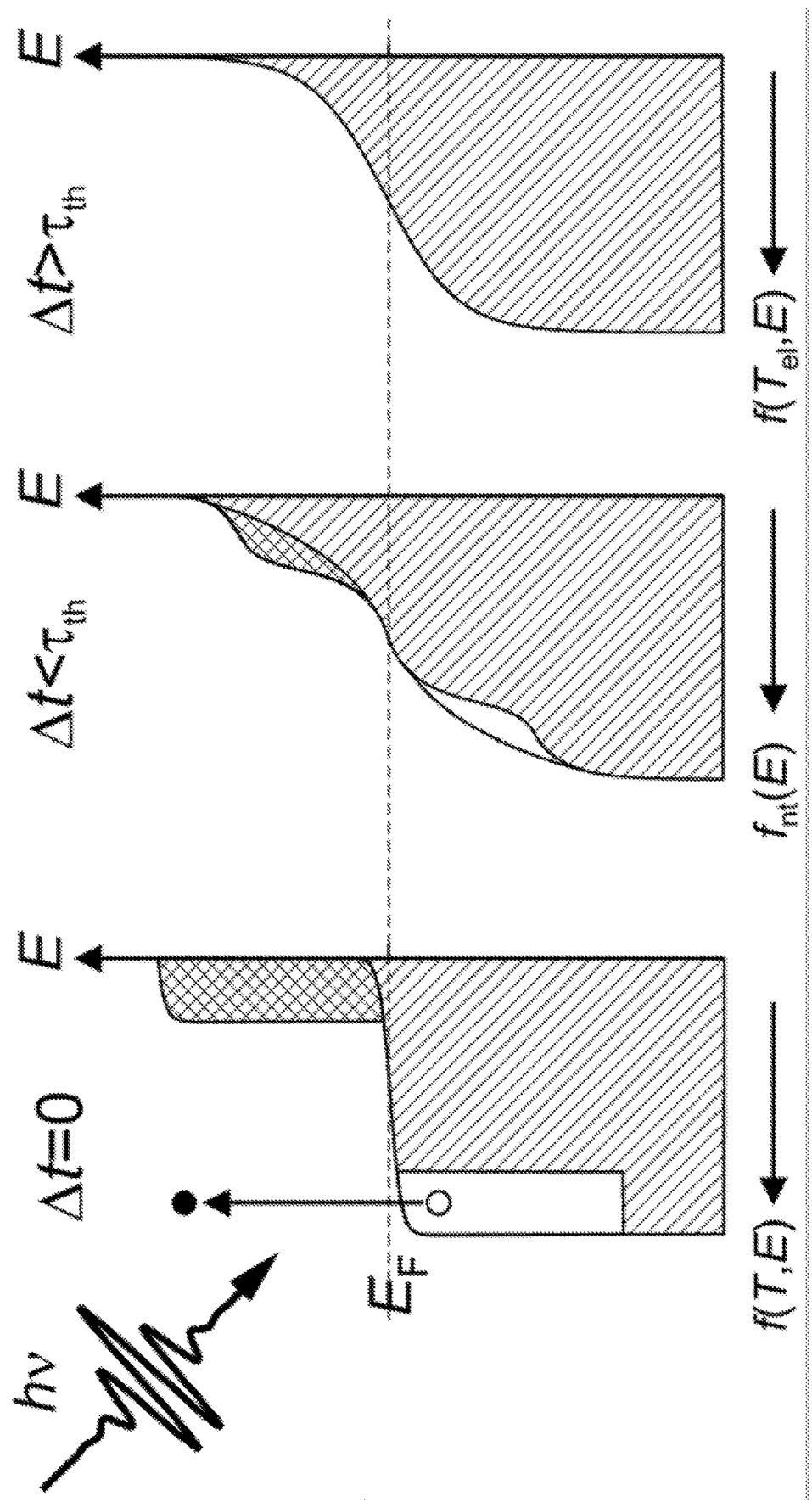
FIG. 8a) is a schematic diagram of the excitation process with femtosecond high fluence laser pulse. $E_f$ is the Fermi level, the densities of states are outlined, diagonal shading shows thermal electrons, cross hatch shows nonthermal electrons, white areas are corresponding holes in the thermal distribution, and the three figures show the original excitation at t=0, the electron distribution after the excitation but prior to complete thermalization, and after thermalization is complete but before the electrons have cooled.
Figure 8B:
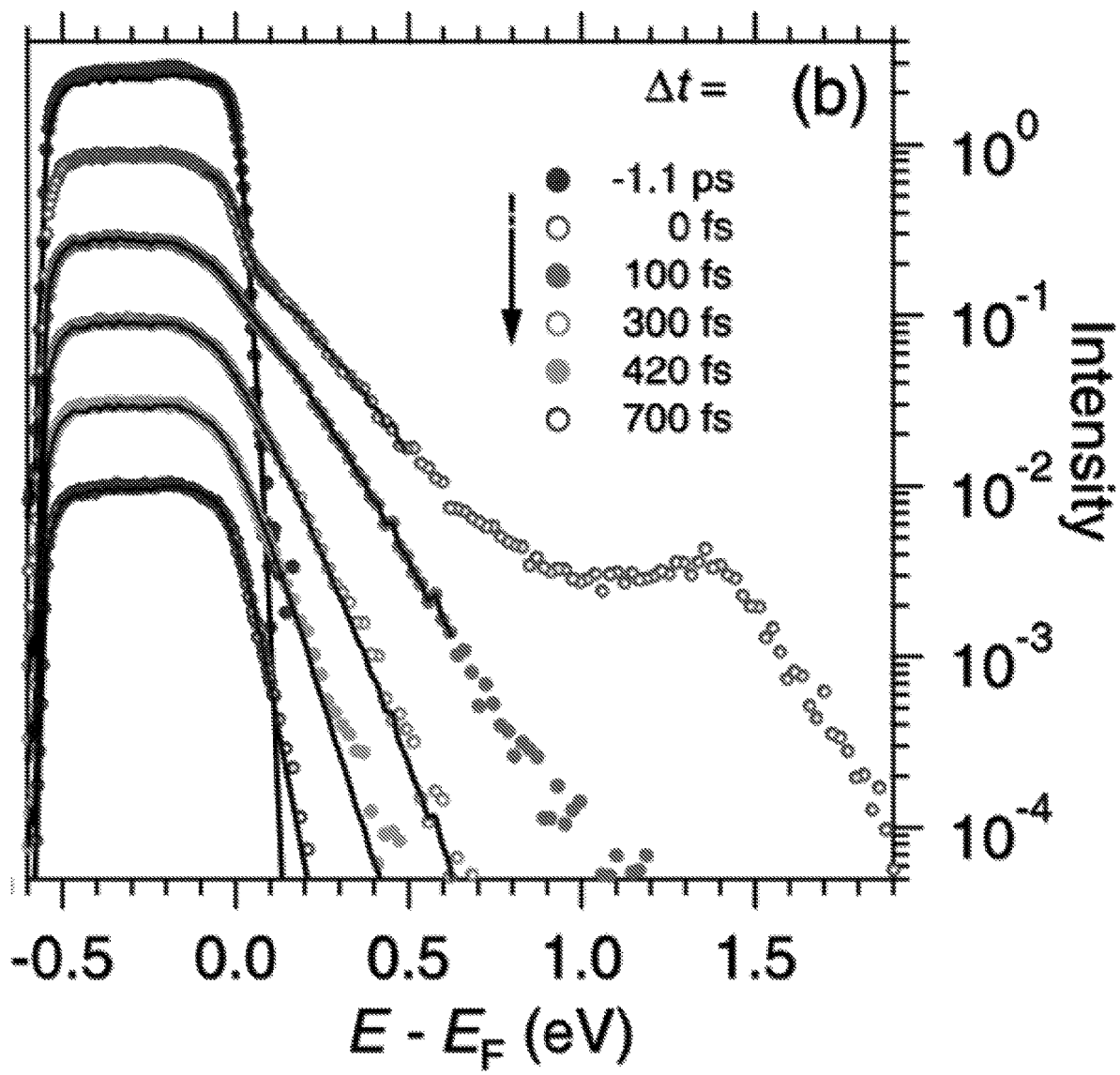
FIG. 8b) provides actual measurements of this process in Gd metal, with the nonthermal distribution obvious at t=0 followed by thermalization and relaxation of the hot electrons over the next several hundred fs.
Figure 8C:
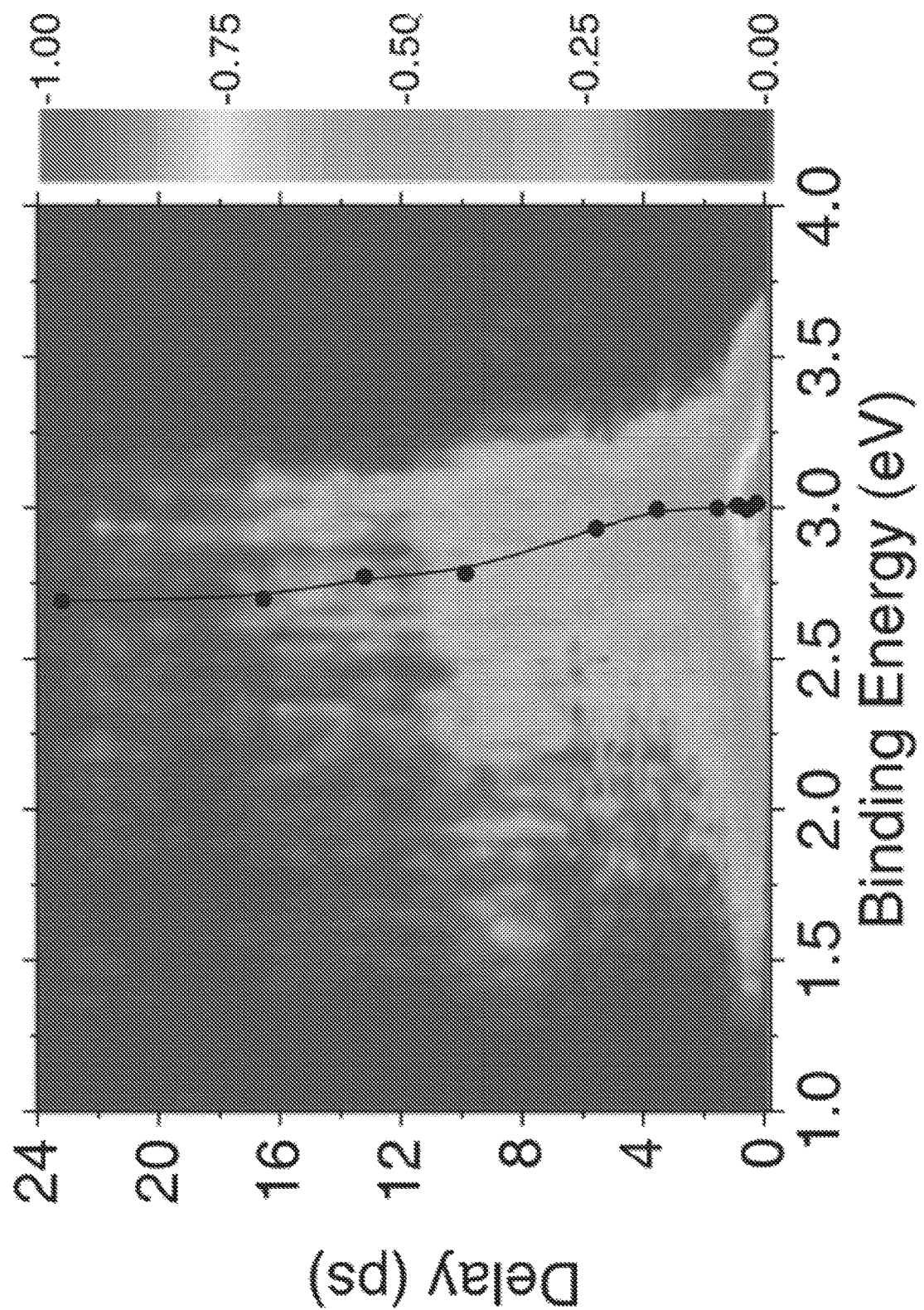
FIG. 8c) illustrates measurements of $UO_2$ with 4.7 eV excitation in which the relative amplitude of the density of states delineated on the abscissa is indicated by the color bar is indicated by the color, the time is the ordinate. The energetically homogeneous electron distribution above the Fermi level at t=0 common to all other materials does not occur. What is observed is the immediate populating of the $UO_2$ unoccupied states across the 2.2 eV wide Mott gap which relaxes over the subsequent 20 picoseconds(38). This is also presented in the t=0 results in FIG. 2(20).

The polaron quantum phase-condensate in $UO_2$ formed from polarons resulting from O-doping and photoexcitation exhibits a density of states of the electrons that demonstrate that it is a metal or semimetal. Its current carrying potential of is obtained by comparing the numbers and energies of the carriers with those in a normal metal, such as copper that is often used as a standard. This was determined by optical pumping with a 40 femtosecond wide pulse of 3.1 eV light from fluences between 0.7 and 3.2 mJ/cm$^2$ and measuring the energy resolved photocurrent coincident with the pump pulse and then via the time resolved integrated photocurrent through 24 picoseconds with relaxation times calculated through 7 ps(38). As seen in FIG. 8A, ultrafast excitation shifts a block of electrons with the same energy range as the pump pulse from below to states above the Fermi level. The immediate response is therefore a nonthermal distribution of electrons extending above the Fermi level. In an insulator where these states are virtual or forbidden ones the relaxation is very fast, within a few tens of femtoseconds. In a metal where these states are real the relaxation can be up to a few hundred femtoseconds(47, 48). If this process induces an insulator to metal transition the times can be intermediate, and there are cases such as $TaS_2$ where the relaxation is to a metastable "hidden" state that persists until it is annealed by heat or light(30, 49-59). $UO_2$ shows a unique response. As shown in FIG. 8c, when recording the time and resolved photoelectron spectra pumping at 4.7 eV the $UO_2$ spectrum that is observed coincident with the pump pulse is that of the $UO_2$ unoccupied states of the upper Hubbard band on the high energy side of the Mott gap, and this spectrum persists until all of the photoelectrons have relaxed back to the ground state. $UO_2$ pumped at this energy therefore forms the final metastable state in well under the 40 femtosecond excitation pulse width, with the metastable state being the calculated and measured $UO_2$ density of states with an appreciable number of electrons having been promoted into the unoccupied states of the lower Hubbard band.

Although the energy resolved spectra with 3.1 eV pump energy were not recorded as a function of time, the time dependence can be inferred from the relaxation times of the energy integrated results (20, 38). At the higher fluences there is a very obvious fast relaxation whose rate decreases by more than a factor of 15 as the fluence is decreased, followed by a second slower one that changes only slightly with fluence and is close in value to the slow relaxation with 4.7 eV pumping that was both time and energy resolved. In combination with the fact that the shape of the photoelectron spectrum is the same at all fluences, only lower in amplitude at lower ones, it has been extrapolated that the low fluence photoelectron spectra are very close to or even the same as they would have been with time.

Figure 2A:
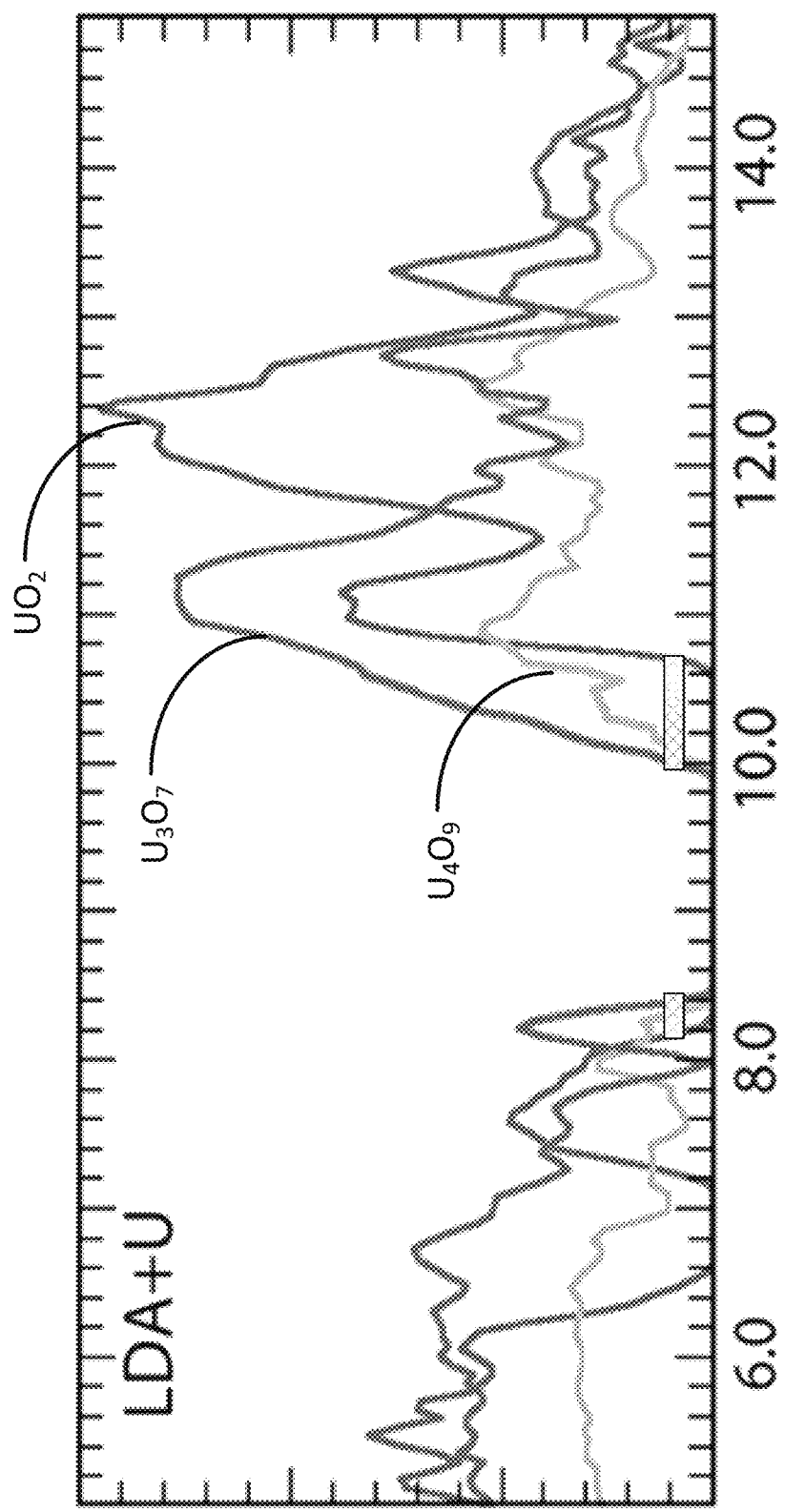
FIG. 2 (A) illustrates tracking the Mott gap in O- and Photo-doped $UO_{2(+x)}$ by LDA+U calculations of the total densities of states (DOS) for $UO_2$, $U_4O_9$, and $U_3O_7$ using the static, U(IV,V)-based structures derived from neutron scattering and energy minimization. The hashed boxes show the shifts in the occupied and unoccupied U 5f states of the lower and upper Hubbard bands between $UO_2$ and $U_3O_7$ that are derived from these calculations. Adapted from (20).
FIG. 2(B) illustrates the measured spectra of U $M_5$ RIXS of $UO_2$ and $U_4O_9$ with overlapping elastic and occupied U 5f peaks of the LHB scaled to a peak height of one, the fits to two Voigt functions, the individual components of the fits, and the separated U 5f contributions to the data and their fits. The hashed box shows the energy shift of the occupied U 5f states of the lower Hubbard band between $UO_2$ and $U_4O_9$. Comparison with FIG. 2(A) shows that this amount is consistent with the calculation within the errors. From (20).
FIG. 2(C) illustrates the transitions to the unoccupied states of the UHB of predominantly U 5f character for O XAS of $UO_2$, $U_4O_9$, and $U_3O_7$. The hashed box shows the energy shift of the unoccupied U 5f states of the upper Hubbard band between $UO_2$ and $U_3O_7$. Comparison with FIG. 2(A) shows that this amount is much larger than the calculation by an amount that exceeds the error levels. The NIXS of $UO_2$ does not show the low energy tail displayed by the more surface sensitive XAS measurement, implying that the tail in the electronic states of the upper Hubbard band is a phenomenon that either occurs in proximity to the surface of the material or requires the higher energy density and number of photoexcited electrons that occur with the lower energy photons of the O XAS experiment. The intersection of this tail at the Fermi level with the occupied states at the few percent level implies that there is a region in the material that has metallic or semimetal-like properties. From (20).
FIG. 2(D) illustrates 40 fs resolution pump-probe angle-integrated photoemission measurements coincident with the excitation pulse excited at the listed fluences with 3.1 and 4.7 eV pump energies. The solid lines at 0-5 eV are fits of the data to asymmetric Gaussian functions. The vertical green band is the 2.4 eV wide band gap derived from the calculations that is consistent with the ~2.2 eV gap measured in experiments, with the Fermi level of the photoemission measurement aligned with the calculation. The RIXS (FIG. 2(B)) and tr-PES spectra with their different energy scales are aligned with respect to the center of the $UO_2$ 5f states, with "0" energy=the elastic scattering for the RIXS and the Fermi level for the PES. The absorption edge of the $UO_2$ NIXS is aligned with the front portion of the DOS from the calculations and may exaggerate the actual width of the Mott gap. From (20).
FIG. 2(E) illustrates the combined $U_4O_9$ RIXS after subtraction of the elastic peak, $U_3O_7$ XAS, and tr-PES at the highest fluence of both 3.1 and 4.7 eV excitation. Energy scales are the same as in the prior figures. The DOS from all of the measurements overlap around −1.0 eV with a nodal point a few percent of the maximum values, after adjusting the baselines to zero and scaling the maximum amplitudes of the RIXS and PES to 10,000 and the XAS to 30,000 to correspond to the calculation. From (20).
Figure 2B:
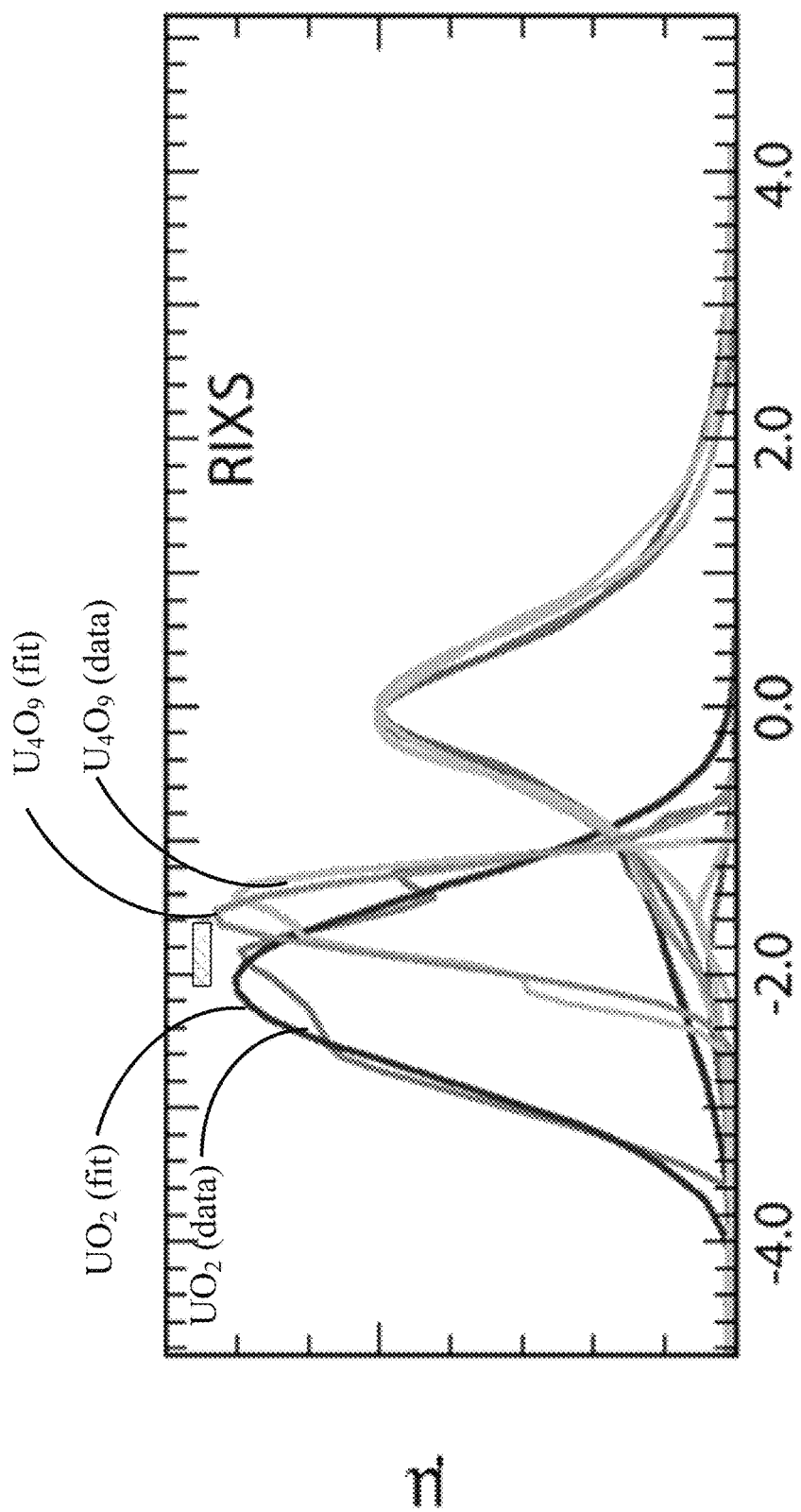
Figure 2C:
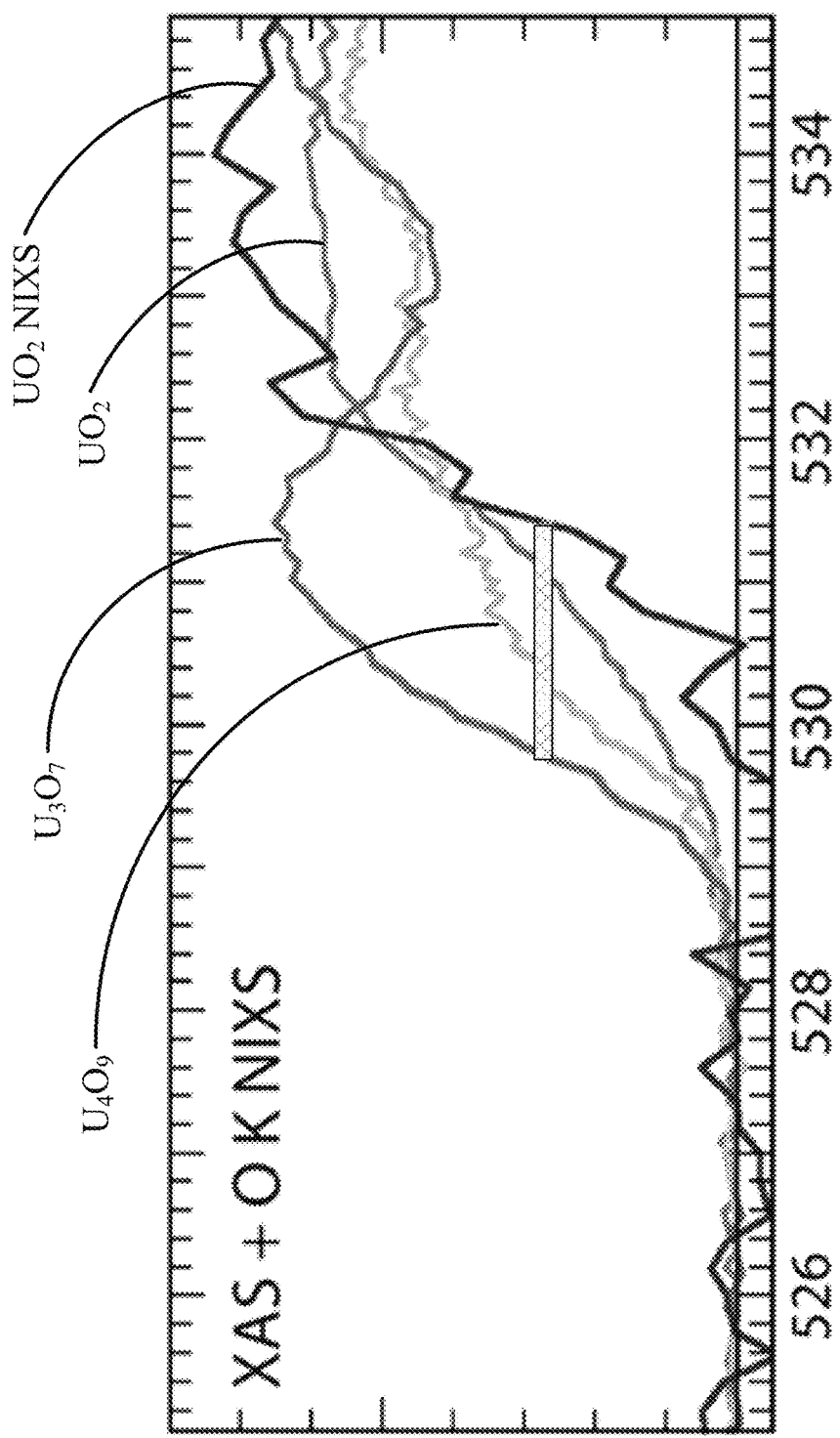
Figure 2D:
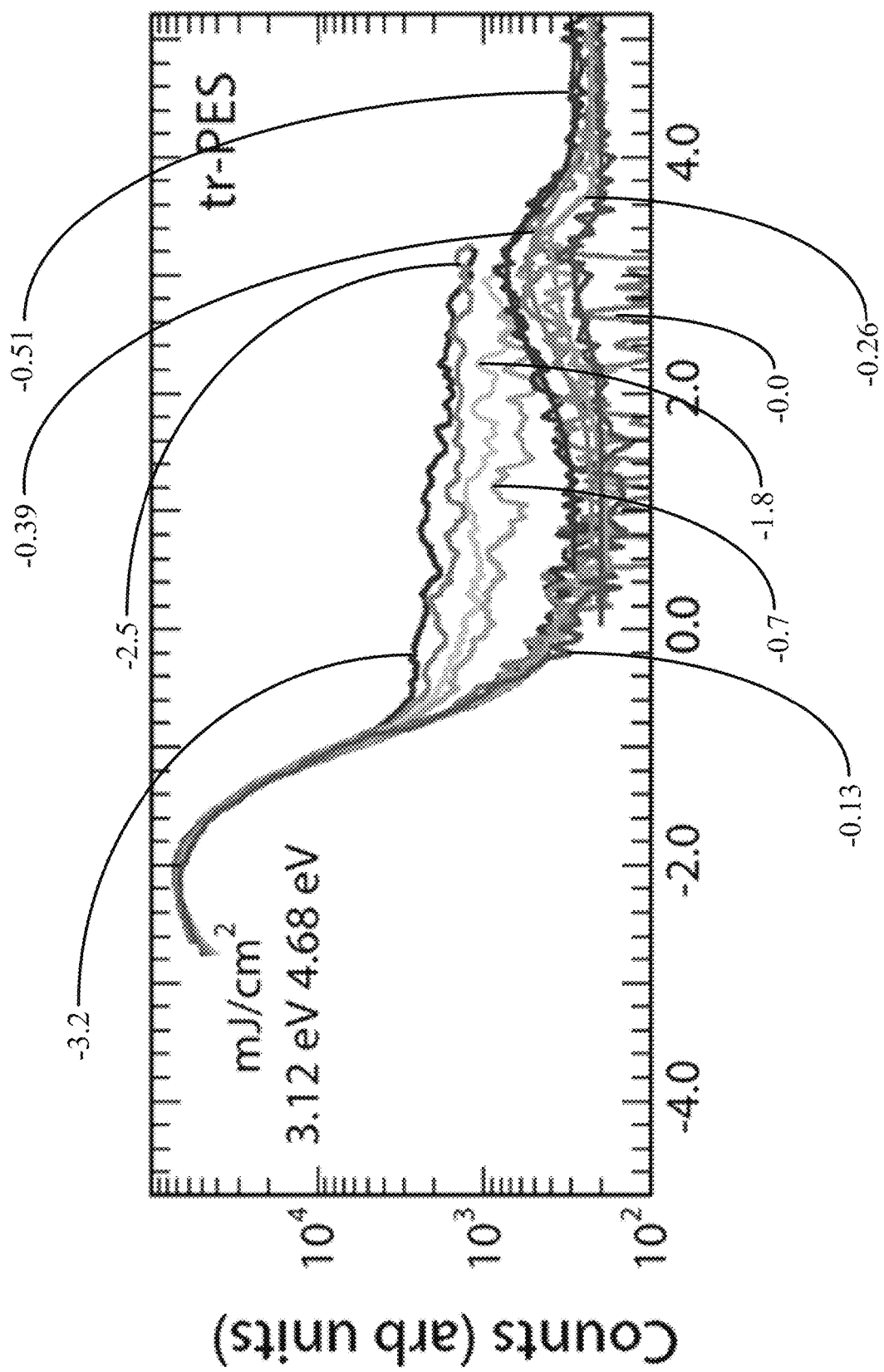
Figure 2E:
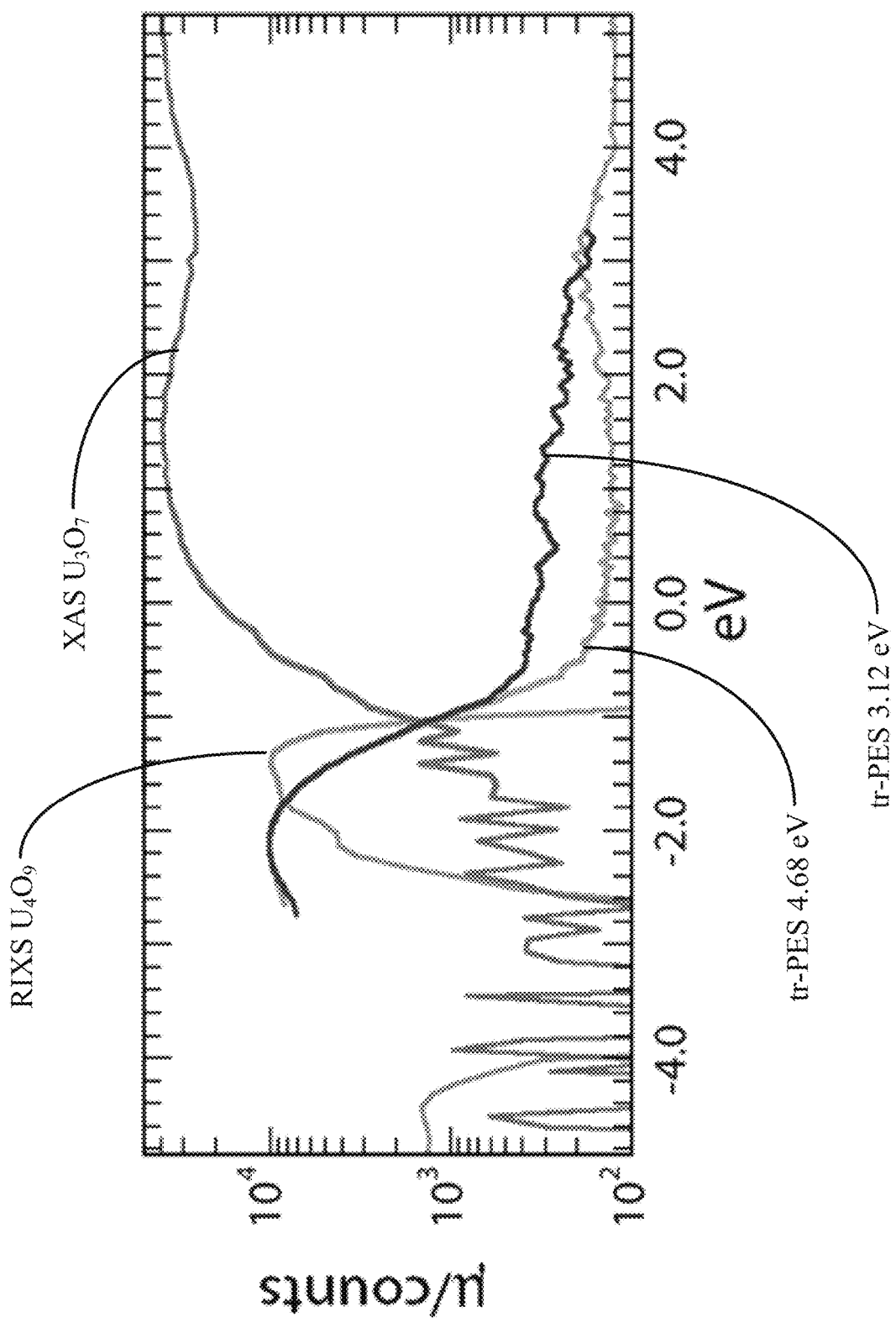

These results for $UO_2$ are unique and remarkable in that they are not explained by the known physics of this process. Similar to the pumping at 4.7 eV, the immediate t=0 photoelectron spectrum is the final, metastable state that relaxes back to the ground state over several picoseconds. However, instead of being the $UO_2$ unoccupied states the photoelectron spectrum shows an energetically homogeneous electron distribution up through and possibly beyond the pump energy. This distribution is characteristic of the t=0 response of other materials except that for other materials it relaxes in a few tens to hundreds of femtoseconds and for $UO_2$ the relaxation kinetics and fluence dependence demonstrate that this distribution is metastable and will be the state that persists through the relaxation. This can be partly understood by our study of the response of the Mott gap to O-doping that also produces charge inhomogeneities in $UO_2$ that makes now $UO_{2+x}$(20). The unoccupied states of the upper Hubbard band (UHB) of $U_4O_9$ and $U_3O_7$ that possess the same cubic, fluorite structure as $UO_2$ are anomalous both by comparison with standard compounds $U_3O_8$, $\alpha\,UO_3$, and $UO_2Cl_4^{2-}$ and DFT-LDA+U calculations that use the neutron diffraction derived structures that are also the minimum energy ones in these calculations. These structures are not the same as those derived from Extended X-ray Absorption Fine Structure (EXAFS) and X-ray pair distribution function analysis that show short, U(VI)-oxo type bonds(18), with these differences between the neutron and x-ray derived structures being indicative of "tunneling" polarons(27-29) as are present in high temperature cuprate superconductors (23-26). Oxygen K edge X-ray Absorption Spectroscopy (XAS) measurements show that the shapes of the spectra from these two mixed valence fluorite-structure compounds do not fit the two peak predominantly U 5f and $6d+O^2p$ pattern (FIG. 2c) found in the standards and the calculations (FIG. 2a). In addition, while the edge of the occupied U 5f states of the UHB undergoes only a small shift (FIG. 2b) that is consistent with the calculations, the leading edge of the UHB is shifted to much lower energy, closing the gap to a few tenths of an eV (FIG. 2c). In addition, there are tails on these spectra, and one on the fluorescence yield spectrum of $UO_2$ (but not the O K Non-resonant Inelastic X-ray Scattering, NIXS) spectrum that uses more penetrating 10 keV x-rays) that intersect the occupied U 5f states of the lower Hubbard band at the few percent occupancy level (FIGS. 2d and 2e). If these do close the gap with finite electron density they would introduce a nodal point in the density of states that is like a semimetal or even graphene. These results indicate that, if the photoinduced polarons resulting from excitation at 3.1 eV form the coherent quantum phase-condensate and this phase is related to the one created by O-doping, the electrons that gave the relatively flat photoelectron spectrum extending to >3 eV above the Fermi level with 3.1 eV pumping reside in the real states of this phase. This helps to explain their long lifetimes. The difference between 3.1 and 4.7 eV excitation is corroborated by time resolved reflectivity experiments that also found a distinct quantum phase with 3.1 eV but not 4.7 eV(18). We have called this phase a "superthermal" metal, because the electrons in the energetically homogeneous distribution are clearly metallic since they must occupy partially filled states and their equivalent temperature is in the tens of thousands of K. In the absence of any other possible explanation, their stability would therefore be a property of the condensate in which they reside.

A superthermal metal is a new scientific discovery. Many of its applications will be derived from its conduction properties. Its conductivity can be compared against a normal metal using the microscopic mechanism described above. Because the electrons in the superthermal region are above the Fermi level their velocities will be even higher than those in a normal metal, which depend upon the width of the conduction band because that determines their energies that are counted from zero at its base. It is therefore conservative to assume that the velocities will be the same as the current carrying electrons in a normal metal and not adjust the conductivity for this. The relative conductivity of the condensate will therefore depend only on the fraction of electrons in the occupied region above the Fermi level. We can therefore calculate the number of electrons as the area of the densities-of-states that they occupy relative to that of the total band contains the two U 5f electrons. Using a peak amplitude of 70,000 and a FWHM of 1.4 eV (FIG. 2d), the fraction of electrons in the metastable state in the region above the Fermi level is ~0.03 at the maximum fluence. The conductivity of the $UO_2$ quantum phase-condensate based on the relative numbers of current carrying electrons is therefore higher than a normal metal by up to a factor of $10^{6-8}$, a very large number. The actual number could be considerably lower because the photoemission experiment does not measure conductivity directly and correlation effects could be expected to be substantially decrease the scattering times. However, to the extent that conductivity would be increased in a normal metal by the number of carriers before such secondary effects became important a factor of at least 100 could be expected, and could be much higher, up to the $10^{6-8}$, level since the width of the conduction band and corresponding separation of the electrons in momentum space is so large.

Since the power delivered by an electric circuit is $P=V^2/R=V^2\sigma$, an increase in conductivity, $\sigma$, increases the power and decreases the losses proportionately. Conductors, whether individual wires or patterned films could be theoretically reduced in cross sectional area by the this factor of $\sigma$ of the superthermal metal divided by the conductivity of the Cu or Al that are the most widely used electric conductors. According to this calculation of the number of conducting electrons in partly filled states in proximity to the Fermi level, the value could be up to the factor of $10^{6-8}$, and at a minimum a still very significant factor of a minimum of 100 where conventional conduction would still occur prior to increased electron correlation. Alternatively, the reduced resistance could be used to lower the voltage for the same amount of current according to Ohm's Law, $I=V/R=V\sigma$. These advantages of the quantum phase-condensate in $UO_2$ could be applied to electrical transmission lines, electric motors, electromagnets, and microelectronics.

Electric Power Transmission.

An electrolytic copper cable rated for 220 kV with a cross section of 800 mm$^2$=has a resistance of 0.032 Ω/km and a continuous current capacity of ~800 A. Copper is considered to have one free electron that has a Fermi velocity of $1.6 \times 10^8$ cm/sec, giving it $0.6 \times^{-8}$ current carrying electrons/atom at the Fermi edge. The quantum phase-condensate in $UO_2$ has 0.03 current carrying electrons/atom, a factor of 50,000 higher. Conducting the same power as this Cu cable would therefore require only 0.02 mm$^2$ of $UO_2$, equivalent to a 40 mm wide 500 nm thick ribbon relative to the 32 mm wide Cu cylinder. The Cu in a 1 m long section of this cable has a mass of 7200 g, compared to the $UO_2$ mass of 2.2 mg. The $UO_2$ film would have to be supported on an appropriate substrate such as $CaF_2$ or yttrium stabilized zirconia, but this would also be quite thin to give it flexibility. Overall, the support structures for the $UO_2$ would be combined with the insulation and give an overall mass and volume well under that for conventional Cu or Al. If the quantum phase-condensate was maintained by the current, discussed in a different section, then no additional circuitry would be needed, although periodic electrodes might be required to initiate it. If the quantum phase-condensate was formed and created by gating then a metal electrode would have to be added on one side of the ribbon, electrically and chemically isolated from the $UO_2$, and a small voltage maintained. As noted previously, in contrast to the normal conduction induced by a voltage gradient that opens a channel only a few nm in height, the condensate appears to very quickly expand through a large volume of the $UO_2$ host.

Electromagnets.

The most common way to generate a magnetic field for industrial use is by an electromagnet. The field an electromagnet generates, B, is, to first approximation, equal to NIμ/L, where I is the electric current passing through the conductor, N is the number of loops made by the conductor, μ is the magnetic permeability of the material within the loops, and L is the length of the magnet. The corresponding force for a circuit enclosing an area A is $\mu^2 N^2 I^2 A/2\mu_0 L^2$. For a given permeability and cross sectional area high fields and forces are therefore obtained by high integrated currents (NI) and short lengths. N can be reduced to an equivalent length of a conductor, which for a circle of area A would be $2N\sqrt{A\pi}$. Returning to the previous example, increasing the conductance of the current carrying material would reduce this total length of the conductor by the ratio of the conductance of the replacement material with that of Cu or Al. This is typically multiplied by the permeability of the core material, which can increase the strength by large factors. However, since this effect saturates the most powerful electromagnets do not use such cores. This length of the conductor would also go as the reciprocal of the ratio of the cross section areas, and for a material with a higher conductance and lower L from smaller N and cross sectional height there would also be an improvement from the reduction of $L^2$. The field strength scales identically with the power transmission calculation, demonstrating that with sufficient improvement in the conductance the field strength produced by a large electromagnet, for example a magnet with a one meter circumference and Cu windings equivalent to 800 mm$^2$ cross section, could be attained with the same 500 nm by 40 mm $UO_2$ film, or a spiral path composed of 40 1 mm wide loops. Industrial strength magnets could be fabricated on a chip.

Electric Motors.

Electric motors would scale as their constituent electromagnets, so that their size would also scale as the ratio of the conductances of the new conductor with more conventional Cu or Al. Like electromagnets, the current carrying components of high power and high torque electric motors could be fabricated as a thin film on an appropriate substrate.

Microelectronics.

Microelectronics would be advanced by multiple characteristics of the $UO_2$ quantum phase-condensate. Increased conductivity permits lower voltages and results in less heat, fast switching permits higher clock speeds, and higher rates of heat transfer allow heat to be removed, from both the $UO_2$ and the other components.

Ultrafast Switching—Application to Electronics and Detectors.

Another unexpected property of the quantum phase-condensate is that, based on the t=0 photoemission spectra that are the final metastable states of the photoinduced polarons and do not show the energetically homogeneous electron distribution or mixing of the unoccupied states of the upper Hubbard band displayed in the spectra with 4.7 eV excitation in the ones from 3.1 eV excitation, the optical switching time must be much less than the 40 femtosecond width of the excitation pulse. Furthermore, the final state is dependent on the energy of the excitation, being in the supermetallic phase when it is 3.1 eV and in the $UO_2$ insulating phase with the Mott gap when the excitation is at 4.7 eV. The combination of these results demonstrates that $UO_2$ does not give the response to the ultrafast, high fluence pulse depicted in FIGS. 8a and 8b that is found in all other related materials. The ultrahigh current carrying capability and ultrafast switching are unique properties that can be used in a number of applications that utilize electric currents and switching.

Possible High Temperature Superconductivity: Application to Conductors for Power Transmission, Electronics, and Magnets.

Superconductivity is an electric current in which the movement of the carriers is without dissipation because they are in a superfluid state as a consequence of their condensation. With reference to FIG. 14, the quantum phase-condensate in $UO_2$ exhibits all of these listed characteristics: 1) EXAFS measurements have found tunneling polarons whose large displacements are consistent with superfluid transport of the atoms; 2) the time resolved photoemission shows a metallic state with an extremely large number of carriers; 3) the pump-probe reflectivity and especially the time domain THz spectroscopy show exceptional coherence in or between states that do not correspond to $UO_{2+x}$ phonons and so are most likely coherent exchange between two quantum phase-condensates or two states of one. In the Time Domain THz Spectroscopy (TDTS) measurement this coherence persists to 300 K. The quantum phase-condensate may therefore be an intrinsic superconductor in which the carriers are coherent and condensed that remains superconducting to elevated temperature.

With reference to FIG. 15, another mechanism by which the $UO_{2+x}$ polaron quantum phase-condensate may induce high temperature superconductivity is via exchange with an existing Bardeen-Cooper-Schrieffer electron condensate in a material that is already superconducting. The presence of the $UO_2$ condensate causes exchange between it and the neighboring BCS superconducting condensate that can increase its critical temperature beyond its value by itself. Resonant exchange between related condensates has been observed in dilute bosonic atom gas ones(60). For $UO_2$ it may be sufficient that the carriers are both electrons or both holes. This is accomplished in a heterostructure in which a thin film of the $UO_{2+x}$ is deposited over or under one of the superconductor. Coincidentally, the epitaxial mismatch between the $UO_2$ U (111) plane and the (001) $CuO_2$ conducting plane of a cuprate is only a few percent, sufficiently close so that they can be deposited to create this multilayer without prohibitive strain.

A third mechanism is to create a heterostructure formed of layers of $UO_{2+x}$ with layers of a non-superconducting material. Interfacial superconductivity has been found in similar systems such as $SrTiO_3$:$LaAlO_3$, neither of which are superconducting or contain polarons, and in a monolayer of FeSe deposited on $SrTiO_3$. U.S. Pat. No. 8,204,564 $B_2$ discloses systems of this type based on the example of $La_2CuO_4$: $La_{2-x}Sr_xCuO_4$ the first compound is an insulator and the second has sufficiently high x to be metallic but not superconducting. The different chemical potentials promote charge transfer across the interface, with the accumulated charge at the interface that forms a two-dimensional electron gas being of a value such that the charges form Cooper pairs that condense to form the superconducting fluid. The use of $UO_{2+x}$ with its existing quantum phase condensate would facilitate the condensation of the carriers by the same mechanism as in [0084] and stabilize the condensate to higher temperatures.

In some embodiments, the non-equilibrium polaronic condensate is used for energy storage, transfer, and conversion.

Methods for Creating and Maintaining the Constituent Quasiparticles, Quantum Phase, and Condensate.

Non-equilibrium systems can either be transitory or metastable, kinetically inhibited from relaxing to their ground state. Transitory ones require a constant input of energy. The identification of the $UO_2$ system as non-equilibrium is more ambiguous than in other materials because our experiments have shown that doping with Oxygen substantially decreases the Mott gap that makes it an insulator rather than a metal, and may even close it to give an electron density of states with a constriction like a semimetal in proximity to the surface(20). $UO_2$ is an insulator, but the electrical conductivity of oxygen doped $UO_{2+x}$ in the $U_4O_9$ or similar phase has not yet been measured definitely because of the difficulty of getting single crystals by oxidation of $UO_2$ or fabricating thin films with this stoichiometry. The low conductivity may also be the result of the lattice defects resulting from doping it by adding oxygen. There is also the complication that this last occurred in low energy x-ray spectroscopic measurements that may have deposited sufficient energy to create enough photo excited states to give the quantum phase-condensate, which would be consistent with its non-equilibrium character. If the quantum phase-condensate is transitory, or transitory under certain conditions, it also facilitates using it as a switch in devices.

Several methods are available to continuously input the energy to maintain the constituent polaron or polaron-like quasiparticles and the resulting quantum phase-condensate, some of which have been successfully applied to related systems. These include gating, an electric current, and excitation or induction via a resonant electric or magnetic field or radiation.

Electrostatic gating is the process that occurs in, e.g., Field Effect Transistors, where a large voltage gradient is formed within a material by applying a voltage to a conductive gate in contact with or adjacent to it and that is electrically isolated and chemically isolated or inert. A negative potential causes electrons to move away from the interfacial region, giving an excess of holes at the interface and thereby doping a plane of the material a few nm thick, or vice versa. This process emulates photoexcitation that produces electrons and holes without introducing any defects in the lattice. Under the reasonable assumption from the structural measurements that find U(VI) associated with the quantum phase-condensate that must have originated in aggregation and disproportionation of the U(V) holes and the instability of aggregated U(III) in U oxides, a volume enriched in U(V) should therefore give the electron DOS found by the time resolved photoemission measurement. It has been found in $TaS_2$ which also exhibits multiple states including a metastable hidden state, that the state can be selected by the amount and direction of current(56), and by combinations of heating and photoexcitation below the fluence where the electron order is completely melted(61). It could therefore be expected that switching between the ground insulating, excited insulating, and excited superthermal metal states can be selected analogously.

An effective means for accomplishing this in the laboratory is not, as in a metal oxide semiconductor FET, with a metallic electrode separated from a semiconductor with an oxide or other dielectric layer making an all solid device that must be fabricated by deposition methods and may have poor contact at the interfaces and that has a maximum carrier density of $10^{13}$. Rather, it has recently been discovered that carrier densities larger by a factor of 100 times or more can be attained by using an ionic liquid as the polarizing or voltage transmitting medium(62-64).

Figure 10:
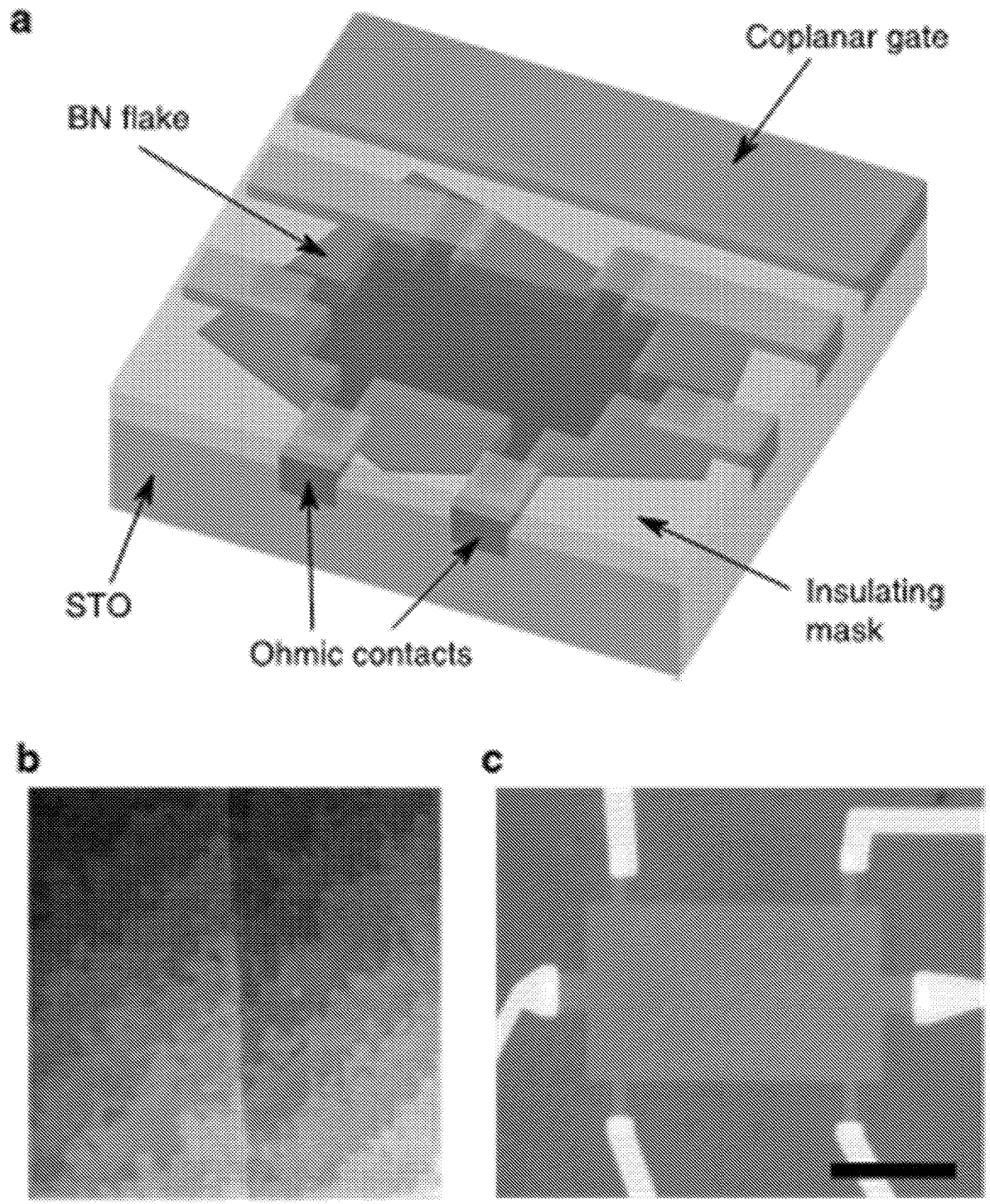
FIG. 10 illustrates the device used for ionic liquid gating through a BN membrane(42) in which panel a) provides a schematic of the gating device, used for $SrTiO_3$, panel b) provides a micrograph of the BN membrane showing its flatness across the sample, and panel c) is a micrograph of the test. Gating of oxides typically results in the removal or addition of Oxygen that will reduce or oxidize the material. The impermeable BN membrane allows the formation of the required voltage gradient in the material but prevents the movement of the Oxygen that causes changes in the stoichiometry and disorder in the crystal lattice.

Although a substantial improvement, ionic liquids nevertheless are far from perfect as gates. Although their fluidity allows them to make close contact with any material and avoid epitaxial strain and mismatch at the interface, it also results in disorder in the arrangement of charges on the microscopic level. It has also been discovered that using ionic liquid gating to effect insulator to metal transitions in oxides(65) causes not only charge injection but also the removal and addition of O(66, 67). Since $UO_2$ is highly reactive towards the removal of small amounts of O and especially oxidation, gating would probably not be useful in injecting charge while maintaining a fixed U:O ratio to emulate photoexcitation-induced charge separation and polaron formation with no lattice defects. There is, however, a recent advance in this field that would allow this. The Goldhaber-Gordon group has found that a 0.5-1.5 nm film of inert boron nitride placed on top of the materials to act as a chemical barrier between the ionic liquid and the material prevented the oxidation of gated Au. It also enabled carrier concentrations in $SrTiO_3$ (STO) into the two-dimensional electron system region of around $4 \times 10^{13}$ carriers/$cm^2$, substantially higher than in $SrTiO_3$ without the film and comparable to those in the $LaAlO_3$:$SrTiO_4$ system. This increase was postulated to result from a combination of separation from the charge disorder in the electrolyte and the retention of the O because of the impermeability of the BN film(42), with reference to FIG. 10. Gating through a chemically inert barrier that does not transport O is one method that could be expected to generate and maintain the quantum phase-condensate in $UO_2$. It may be facilitated by using O-doped $UO_2$ so that the gating is applied to $UO_{2+x}$ that already has some level of U(V) and $UO_2$:$U_4O_9$ interfaces. Gating would be expected to breakdown the $UO_2$:$U_4O_9$ phase separation by mobilizing the polarons to create a homogeneous $UO_{2+x}$ that may be advantageous for charge and mass transport. Although gating normally produces a conducting channel only a few nm in height, for $UO_2$ the carriers aggregate into the condensate that certain experiments demonstrate expands throughout the $UO_2$ host.

Figure 11:
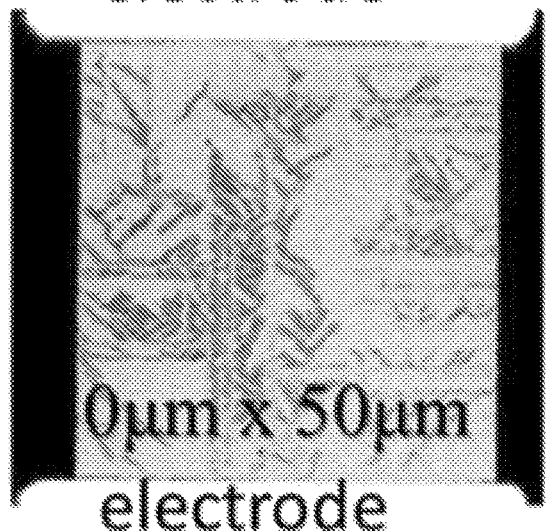
FIG. 11 illustrates an optical image of domain formation resulting from insulator to metal transition in $VO_2$ driven by electric current at given voltages, showing how a small electric current impelled by a small voltage can effect phase transitions in Mott insulators(43).
Figure 11:
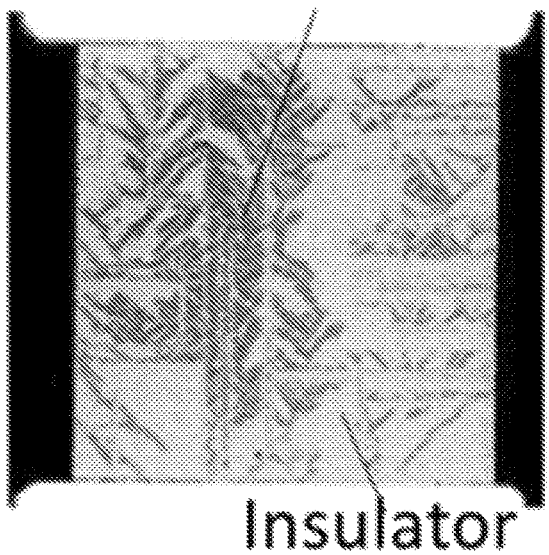
Figure 11:
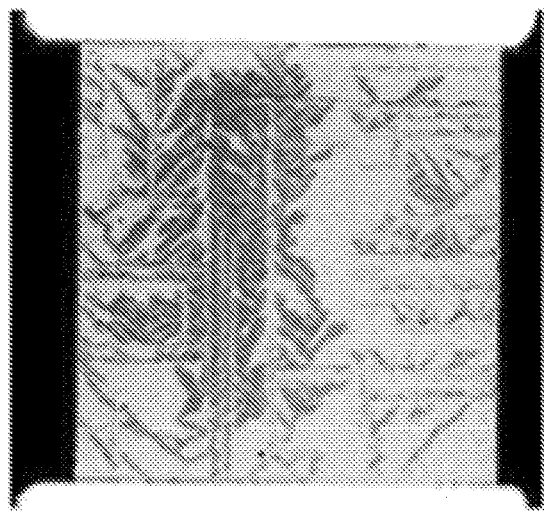
Figure 11:
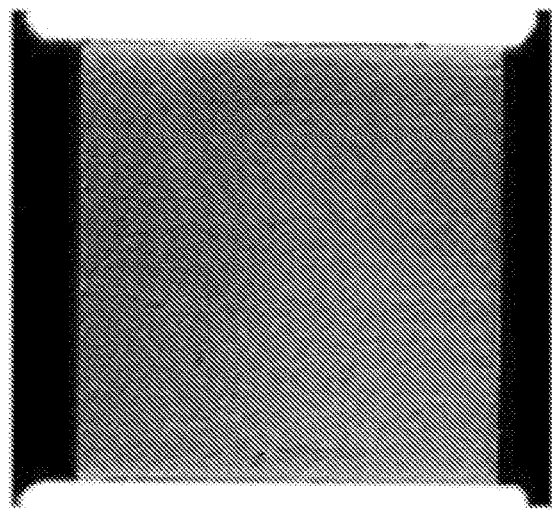
Figure 12:
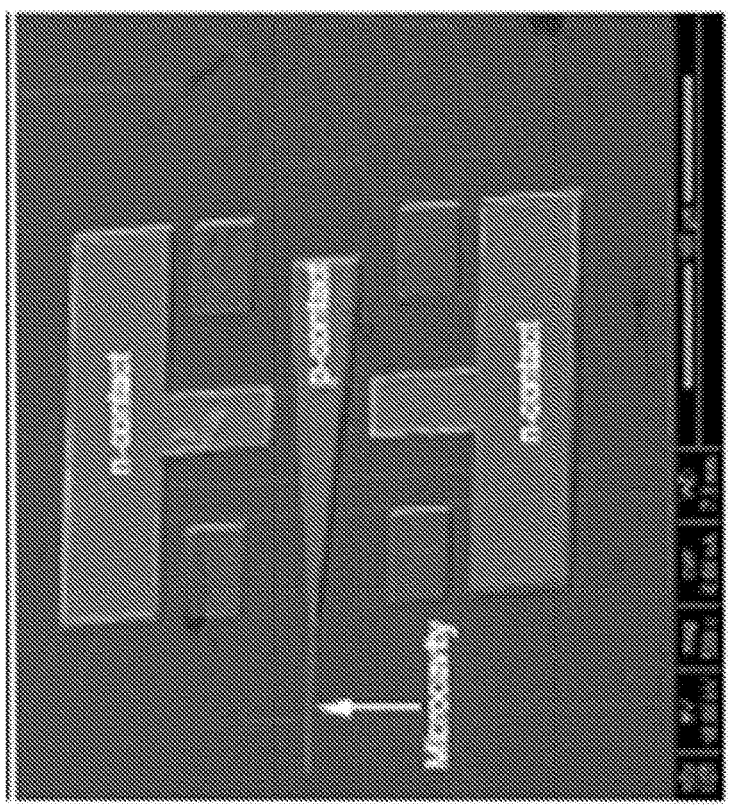
FIG. 12 a) illustrates a schematic of electrically injected polariton laser based on a quantum well in a semiconductor and FIG. 12 b) illustrates a micrograph of an electrically injected polariton laser in which the quantum well structure is in the center, with the distributed Bragg reflectors on the sides and electrodes on the top and bottom(44). As in FIG.
Figure 12:
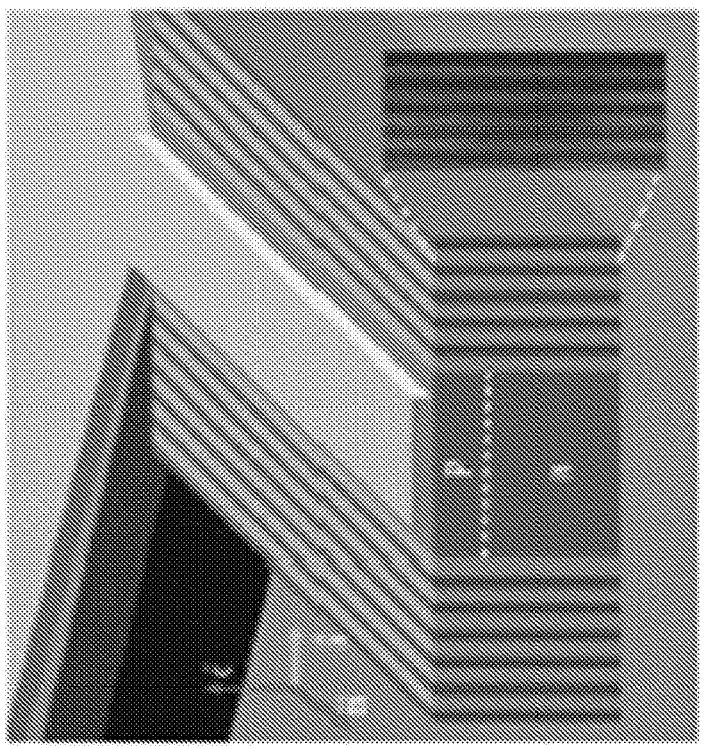

In contrast to gating that creates free carriers in a small volume at the interface where the gate voltage is applied, the application of an electric current driven by less than 5 V has been shown to close the Mott gap to give the metallic state in oxides (43, 56, 68, 69), such as $VO_2$ (FIG. 11) and $TaS_2$(61, 70) without the application of an extremely large voltage gradient at the interface with the electrodes. In this case the configuration would be the same as with gating, but the gate would be removed. Electric current has also been used to directly create the excited state constituent quasi-particles in semiconductors. In semiconductor quantum wells a modest electric current has been shown to directly create the polaritons at a rate sufficient to maintain the condensate even while it is emitting coherent light(13, 16, 44, 71). A recent device used to accomplish this (FIGS. 12a, and 12b) uses an orthogonal configuration in which the current is injected across the quantum well structure at right angles to the distributed Bragg reflectors that accumulate the light to maintain the polariton density at the level required for condensate formation. For our application the semiconductor core would be composed of $UO_2$ or $UO_{2+x}$ that would also be deposited as a thin film by appropriate deposition methods. The Bragg reflectors would only be included for devices producing coherent light, so the electrodes could be in any configuration. Devices with direct contact with the electrodes that then generate a current within the $UO_2$ are therefore another possible means of generating and maintaining the quantum-phase condensate.

Fabrication of Heterostructures with Charge Reservoir Domains.

Almost all quantum materials are activated by chemical doping, e.g., substituting ions with difference charges or adding nonstoichiometric amounts of O or another anion. The transition metal that is central to its properties therefore occurs in more than one valence, making a mixed valence compound. These charges and spins can order in a variety of ways. $UO_2$ conforms to this description, with the interesting properties accruing to O-doped $UO_{2+x}$ or photodoped $UO_2$ when the U is a mixture of (IV) and (V), or (III), (IV), and (V) valences. As already described, the problem is that the adventitious O forms defects in the lattice that disrupt transport and other properties that require a periodic structure by pinning the charges at the defect sites. This is universal amongst these compounds, e.g., substitution of the Cu with other metal ions in the $CuO_2$ planes in cuprates destroys the superconductivity at a few atom-% level. The doping in these materials, often by a combination of non-transition metal ions or different valences such as La—Sr/Ba and non-stoichiometric amounts of O, is accomplished without disrupting the $CuO_2$ planes through their layered, multidomain structures (FIG. 13). Cuprates, and related materials such as the iron arsenides, typically have separate conducting and charge reservoir domains, which can be connected and separated by an insulating layer. This makes them analogous to a gated system, where a potential gradient generated by a charge imbalance between the domain injects charge into the conducting layer where, because the crystal lattice remains intact, it is mobile.

$UO_2$ with its simple stoichiometry and uniform cubic structure is not amenable to chemical doping. $UO_{2+x}$ is mixed valence, but disordered, which may be why it remains an insulator despite the near closing of its Mott gap. The addition of alkali metal or alkali earth ions gives the ternary uranate compounds, which could be susceptible to doping. However, these also form cubic rather than layered structures so that the other cation is combined with instead of separated from the U. The structures of U in its higher (V) and (VI) valences are layered, but these do not contain sufficient electrons for the quantum phase. In addition, the fluorite and the layered structures do not combine despite the similarity in structure of their U (111) planes, $U_3O_8$ always separates on the macroscopic scale from $U_3O_7$.

An alternative is to form artificial structures that emulate the cuprates and related compounds by thin film fabrication methods. $UO_2$ is easily deposited on a number of substrates, including $CaF_2$ as well as more complicated ones such as $LaAlO_3$ and yttrium stabilized zirconia. Either a substrate or a capping layer could be selected that has a structure similar to that of $UO_2$ but that could be made non-stoichiometrically with a charge deficit and an electrochemical potential high enough to remove electrons from U(IV) to generate a layer of a mixed valence U(IV/V) material. The La—Sr—$AlO_3$ system is one example, where the La:Sr ratio dictates a particular O stoichiometry that, if exceeded, will withdraw electrons from the material to which it is coupled. If the energy of the O hole in LSAO is greater than the O defect in $UO_2$ the charge but not the O will be transferred. Coincidentally, the $CuO_2$ planes of cuprates are only a few percent different in size from the U (111) planes of $UO_2$, making them candidate substrate materials (FIG. 15). Charge injection into the $UO_2$ could then be accomplished by overdoping the cuprate. Such heterostructures could also give synthetic systems with additional properties or combinations of properties originating in the combination of the $UO_2$ with the other material.

Resonant Excitation and Induction.

The underlying theory and mechanism for the quantum phase-condensate based on the finding of U(VI) involve an oscillating electric dipole, as prescribed by the original theory for a non-equilibrium condensate(6, 7, 21, 72). Specifically, we have proposed that its origin is the coupling of a phonon that synchronously drives charge transfer and the speciation-geometry change as the result of the dynamical change in the separation between the (111) U planes(19). Alternatively, there could be exchange between two coherent states that are the different chemical species connected by the charge transfer, in which case the exchange would not need to be synchronized by the phonon. The time domain spectroscopy, both with optical reflectivity(18) and THz transmission probes(19), both show strong coherence signals whose frequencies do not correspond to any of the phonons of $UO_2$. They must therefore originate in the quantum-phase condensate, either as phonons or as coherent exchange. If the former, then their low frequencies, 1.8 THz and 12 GHz, imply that they are synchronized motions over large volumes of the material. If the latter then these would be the energy differences between the coupled states. Because the exchange between the states involves the motion of charge, either as charge transfer between ions or, if the charge transfer is incomplete, a large dipole, it would be possible to excite it directly via an alternating electric or possibly magnetic field oscillating at the same frequency to resonantly drive the motion and exchange, initiating and maintaining it. These frequencies are sufficiently low so that it could be accomplished by an AC current in a wire or other geometry conductor in proximity to the $UO_2$.

Control by Strain.

Another method that has been used to modify and control insulator to metal transitions and relative phase stabilities in correlated oxides and related materials is strain imposed by fabricating a film on a substrate selected to have an epitaxial mismatch or by bending a thin film on a substrate(57, 58, 73-77). This method could also be applied to tune and control the relative stability of the quantum phase-condensate and ground state in $UO_2$ and of the various states of the quantum phase-condensate.

Figure 4:
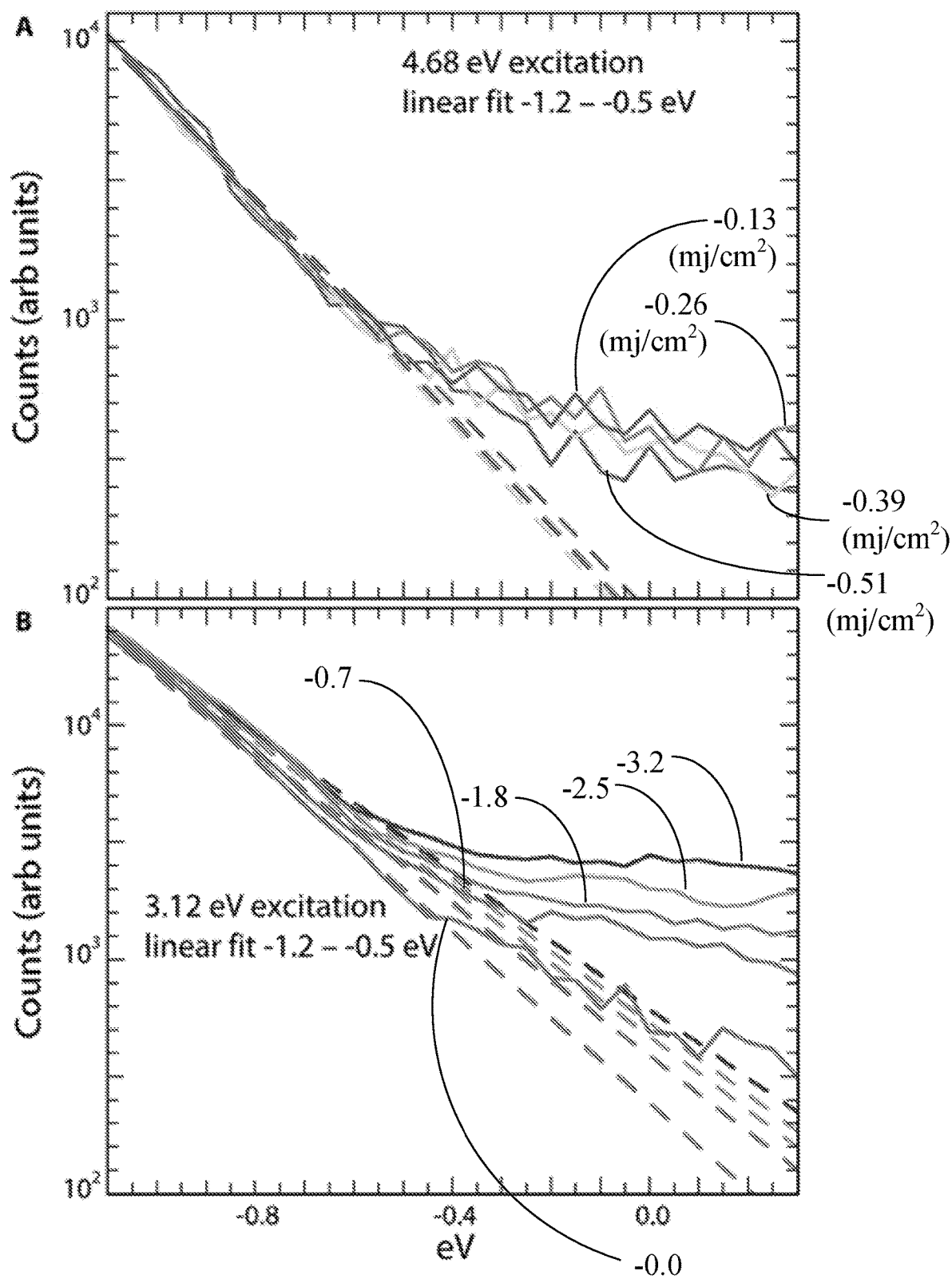
FIG. 4 illustrates the t=0 (coincident with the excitation pulse) fluence dependence of the electron occupancies across the edge of the highest occupied state, with less negative slopes (higher intercepts on the abscissa) indicative of higher electron temperatures. Linear fits to the logarithm of the intensity over the leading edge of the photoemission peak nearest the Fermi level are indicative of the temperature of the thermalized hot electrons after the photon impulse. Because $UO_2$ is an insulator the linear portion of the ln(DOS) provides qualitative information rather than a specific temperature.

A $UO_{2+x}$ crystal or a first oriented crystal $UO_{2+x}$ film on a first portion of the surface, where the first single $UO_{2+x}$ crystal or the first oriented crystal $UO_{2+x}$ film originates and hosts a non-equilibrium polaronic condensate that can be used in heterostructures to make superconductors, normal and exotic, and interfacial, and also non-laser coherent light sources, magnetism, qubits, and heat pipes via the superfluid thermal conductivity. FIG. 4 illustrates, for example, fluence dependence on temperature at t=0.

Atomtronics and Sensing.

Analogous to electronics, atomtronics is the science and associated technology resulting from controllable matter waves(78, 79).

As with optical and magnetic computing, it would be based on devices that are the matter or atom analogs of transistors, diodes, beam splitters, etc. The three requirements for devices utilizing atomtronics are (i) a set of atoms that possess coherence and superfluidity, as in a Bose-Einstein condensate, (ii) a method for controlling their positions, and (iii) a method for controlling their energies, both kinetic energy and states The use of a polaron condensate or coherent quantum phase with superfluid properties easily meets all three requirements. In contrast to an ultracold dilute atom gas condensate whose constituent particles are neutral and coherence is extremely fragile, polarons are easily manipulated on the basis of their charge and magnetism and, although their quantum phase-condensate is separate from their host lattice, they are nevertheless confined to volumes that have the correct composition and structure. In addition, because the polaron quantum-phase condensate is non-equilibrium, its coherence extends to easily attainable temperatures, even ambient temperature in some experiments. Its existence in a crystalline solid instead of an ultra-high vacuum greatly facilitates the design and fabrication of the necessary circuit components and devices. The detection of the polaron currents and potentials is easily done by monitoring emission, charge, or magnetism either directly or via spectroscopic probes. Applications include metrology, based on the short wavelengths of atoms vs. electrons and light, and metrology derivatives such as gravimetry.

Response of the Mott Gap to O Doping and the Static CPQP.

The O XAS of cubic $UO_2$ and, for comparison, layered $U_3O_8$, α $UO_3$ (40, 80-82), and $Cs_2UO_2Cl_4$ (83) display two peaks below the continuum (FIG. 1A), assigned to transitions to final states of primarily U 5f character at ~533.5 eV and 6d at ~538-540 eV (84-86). The relative amplitudes of these features are distorted by self-absorption but can also vary between different batches of material. These features are widest and most complex in the $UO_2$ spectrum, attributed to a combination of crystal field, Coulomb, and multiplet splitting (S2) effects that cause them to become narrower with increasing valence (80, 81, 84, 87). The highest amplitude peaks in the O XAS of $U_4O_9$ and $U_3O_7(UO_{2+x})$ occur at the same energy as the 6d final states for the higher U valence compounds. Contrary to this pattern, however, there is an increase in the width of not only this 6d peak but the entire U 5f-6d-O 2p manifold. This causes the energy of the lower energy peak in the $U_3O_7$ spectrum to be significantly less than those from the other compounds, concomitant with a substantial reduction in its amplitude and spectral weight (cf. its NIXS (18)). The $U_4O_9$ spectrum that is distinct from that of $U_3O_7$ is also broader and exhibits a number of small, overlapping features instead of the separated lower peak.

Figure 1:
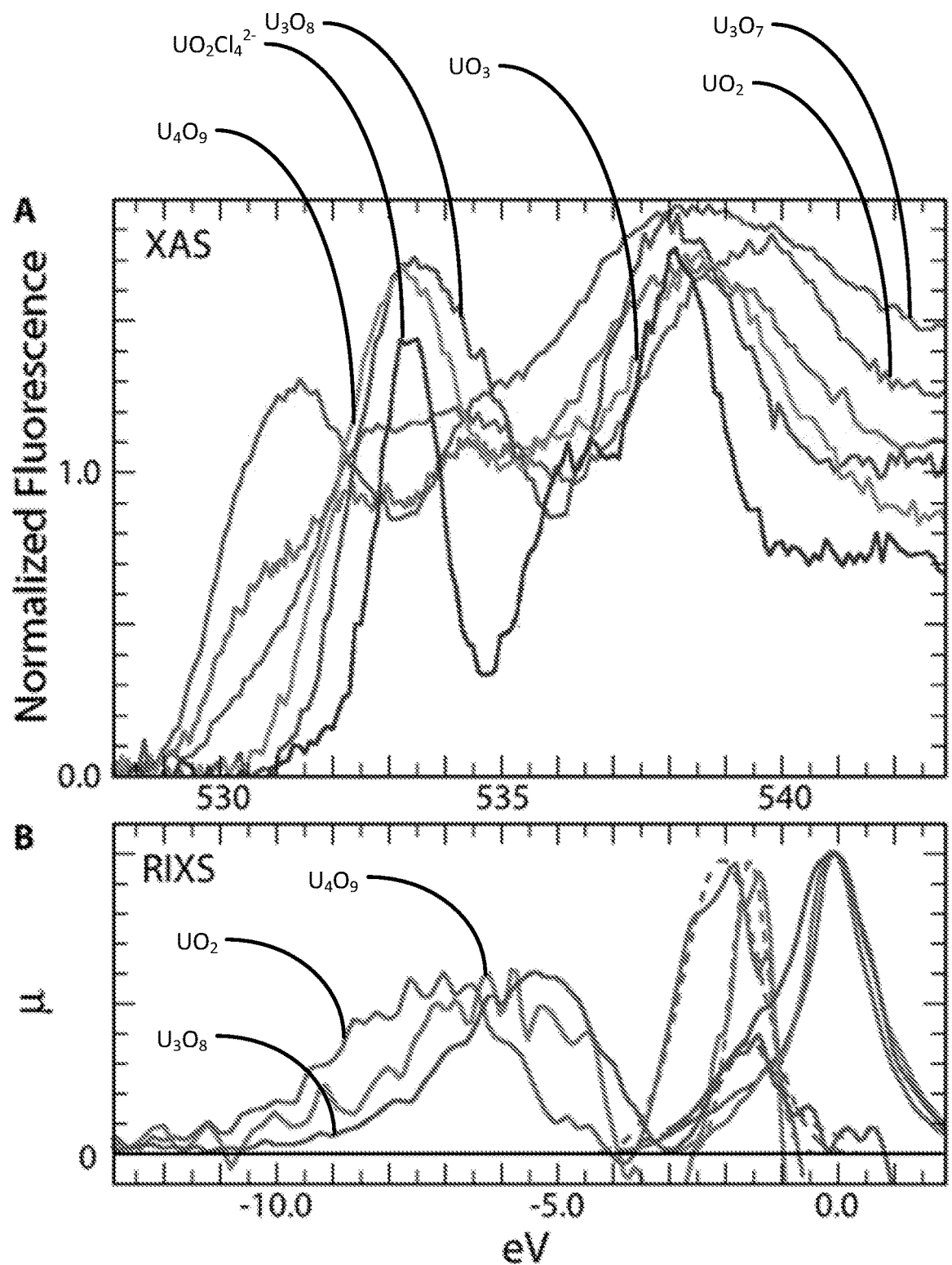
FIG. 1 (B) illustrates the U $M_5$ valence-to-core 3d5f RIXS are broken into the O 2p (<3.5 eV), U 5f (−4-0 eV), and elastic regions (>−4 eV), with the amplitudes in each region adjusted separately. The abscissa shows the energy transfer. From (20).

The occupied states, consisting of the O 2p and the U 5f states of the lower Hubbard band (LHB) just below the Fermi level (88), are probed by valence-to-core 3d5f RIXS at the U $M_5$ edge (89) measured at 3552 eV (FIG. 1B). It is assumed that the time domain of RIXS is sufficiently short to give the dynamic instead of only the static structure. Features 4-8 eV below the elastic peak at 0 eV are U 5f→O 2p excitations, those at lower energies that were separated from the elastic peak by curve-fitting are intra-atomic U 5f→5f. In contrast to the large shifts in the upper Hubbard band (UHB), the increase in the energy of the occupied 5f states from $UO_2$ to $U_4O_9$(and $U_3O_8$) is only ~0.5 eV. This shift is somewhat larger for the O 2p states. These relatively small amounts agree with the LDA+U calculations (FIG. 2A) using the energy minimized structures for $U_4O_9$ and $U_3O_7$(90) that are quite similar to the proposed cuboctahedral (91) and static structures derived from neutron scattering (92) which are a relatively small perturbation of $UO_2$. The different structures identified by x-ray pair distribution function analysis and EXAFS (18) including the 1.75 Å U(VI)—O bond lengths are the signature of the tunneling polarons. The calculated density of states (DOS) (FIG. 2A) give results for $UO_2$ very similar to those already cited (80, 81, 84) and are also accurate with respect to the optical gap of ~2 to ~2.4 eV (93, 94). The $UO_{2+x}$ calculations find increases in the energy of the $U_4O_9$ U 5f states by ~0.25 eV and the O 2p by ~0.7 eV, expected for hole doping, and somewhat larger increases for $U_3O_7$, in agreement with the experimental RIXS that shows increases of ~0.5 eV for the U 5f and ~1.2 eV for the O 2p. The addition of O therefore shifts the energies of the occupied 5f states of $U_4O_9$ relative to $UO_2$ upwards by a few tenths of an eV, consistent with the calculation.

Magnifying the DOS and spectra around the Mott gap provides more detail (FIG. 2). The calculation gives a gap of ~1.6 eV for the $U_3O_7$ static structure (FIG. 2A) that is consistent with the reduction caused by thermally induced small polarons (93). Experimentally, while the RIXS gives the same increase of the occupied 5f states below the Fermi level relative to $UO_2$ for both $U_4O_9$ and $U_3O_8$(FIGS. 1B and 2B), the XAS that shows that the energies of the edges of the upper Hubbard bands (UHB) of $UO_2$ and $U_3O_8$ are similar because of the enhanced width for $UO_2$ also shows this edge is lower by 1.2 eV for $U_4O_9$ and 1.5 eV for $U_3O_7$(FIGS. 1A and 2C). These shifts that cannot be attributed to the core hole are sufficiently large so that the XAS traverses the gap to within a few tenths of an eV of the upper edge of the LHB. In addition, although the $UO_2$ NIXS spectrum ends abruptly, the XAS of $UO_2$ gradually tails off over the same range, suggesting a surface phenomenon that renders a fraction of it equivalent to $UO_{2+x}$ (cf. Raman spectra in (18)). These estimates for the gap are, if anything, low, since their alignment by placing the front of the 533.5 eV $UO_2$ plateau on the principal 5f peak in the calculated $UO_2$ DOS gives the $U_3O_8$ gap as ~1.5 eV in contrast to the calculated value of 0.5 eV (82, 95). Placing the XAS closer to the Fermi level, which would increase the overlap, may therefore be more accurate. If the tails on the spectra represent real states and not just a spectroscopic effect then the occupied and unoccupied states across the gap would appear to overlap for $UO_{2+x}$ even without this additional shift (FIG. 2E).

Figure 3:
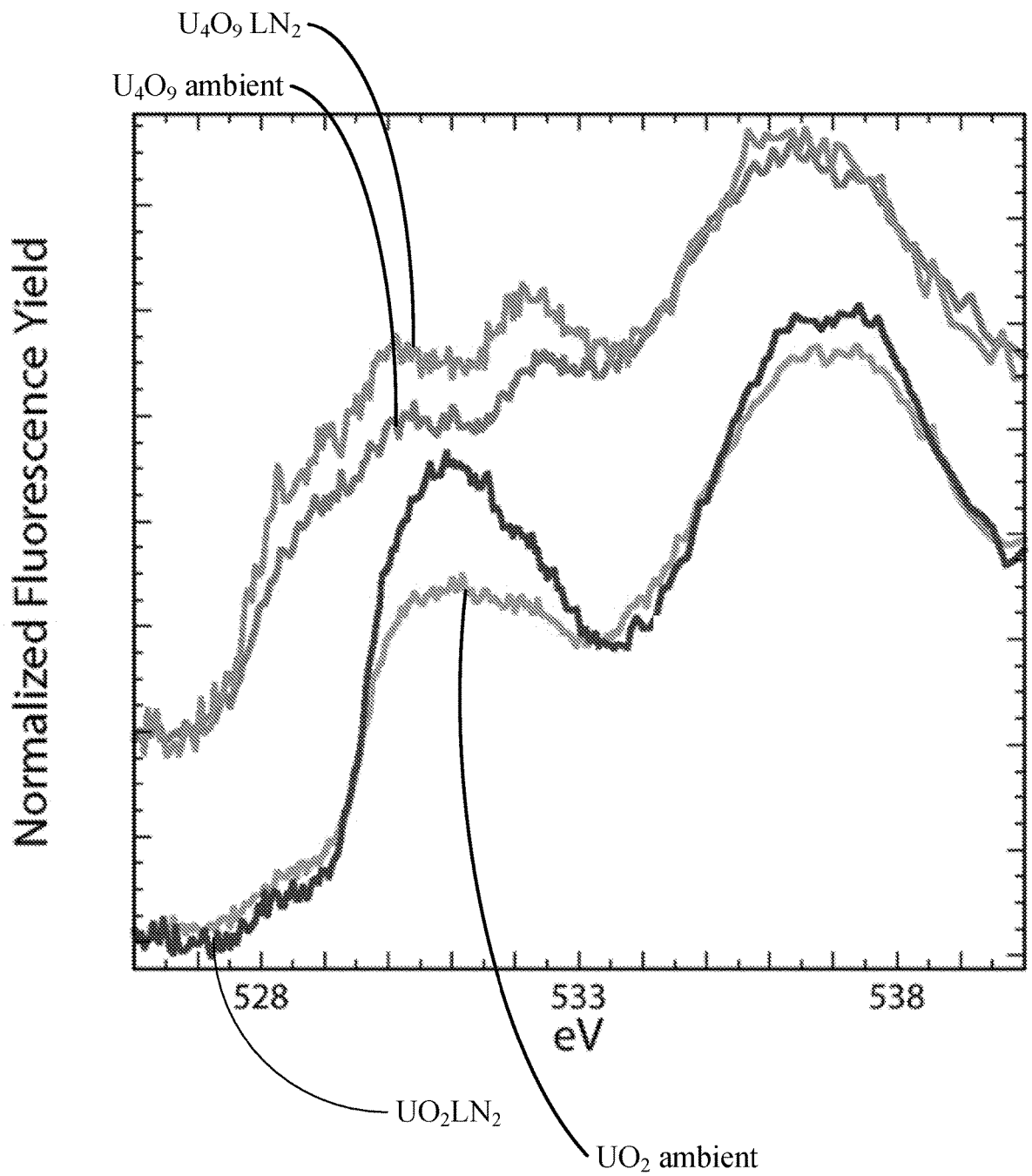
FIG. 3 illustrates O XAS of $UO_2$ and $U_4O_9$ at ambient and liquid $N_2$ temperatures. The changes in the spectra on cooling that are much larger in the region dominated by the 5f states are indicative of a redistribution of the mobile charges that, for $UO_2$, should be more in proximity to the surface because bulk structure measurements show no temperature dependence, in contrast to electron paramagnetic spectra of powders. These fluctuations are highly unusual compared to other materials such as high temperature cuprate superconductors where they are only a few percent, indicating an extremely large mobility of the charges. A corresponding mobility of the atoms over this temperature range was interpreted as evidence for a superfluid(18).

O-doping of $UO_2$ to $UO_{2+x}$ therefore substantially reduces or possibly even bridges the Mott gap principally by shifting the UHB downwards, with a small but finite DOS at the intersection with the LHB that increases rapidly with increasing energy (FIG. 2E). That it is specifically the states above the Fermi level where these effects occur implies that these unoccupied states are not derived from the static $UO_2$ ground state but from a different species. This would result from, e.g., our proposed aggregation and self-organization of the polarons into a CPQP. Probes and calculations limited to the static ground state structure therefore obtain relatively small deviations from $UO_2$ while probes sensitive to faster time scales (28, 29) find the CPQP (18, 19). The role of dynamics in the structure (18) is further corroborated by the changes in the XAS between ambient and liquid $N_2$ temperatures (FIG. 3). These show a reduction in the DOS at the UHB edge for $UO_2$ but an increase for $U_4O_9$ as well as other changes. Much smaller differences in these spectra from normal and superconducting cuprates were attributed to the redistribution of the mobile electrons between the available sites (96). That the $UO_2$ spectrum is also affected (cf. also the electron paramagnetic resonance spectra (19)) much more in the predominantly 5f feature and despite its static and dynamic structures being identical corroborates a proximity-to-the-surface effect.

Time-resolved photoemission was performed (38) concomitant with the excitation pulse with a time resolution of ~40 femtoseconds at excitations of 1.6, 3.1, and 4.7 eV that would be transitions from the U 5f state into, respectively, the gap, the unoccupied U 5f and the unoccupied U 6d states. The fluences of 0.13-0.51 mJ/cm$^2$ at 4.7 eV correspond to 0.002-0.006 excitations/U in the top 1 nm, comparable to the 0.009 excitations/Ta for $TaS_2$ that induce the insulator-metal transition (30)). As with the other optical pump experiments performed on $UO_{2(+x)}$, these measurements also gave highly unusual results. The prominent features in the 4.7 eV excitation spectra are the Mott gap and the front edge of the unoccupied UHB 5f states of the static $UO_2$ DOS (FIG. 2D). This includes the lower fluences below the high-order relaxation threshold (38) and whose relaxation therefore extrapolates to the slow component of the biexponential relaxation (5-7 ps over the fluence range), indicating that the state that gave the fast relaxation (4-0.6 ps) makes only a minor contribution to these spectra. The areas of the 5f spectral feature in the UHB after subtracting the background are linear with fluence even over the range where the fast relaxation is a large component of the total (SI7). This fast relaxation must therefore represent electrons distributed over the entire energy range, as for the 3.1 eV excitation. Close inspection of the spectra (FIG. 2D) shows that the flat backgrounds bracketing the UHB 5f feature do increase over their entire range with increasing fluence. Nevertheless, consistent with the spectrum consisting primarily of the minimally modified $UO_2$ DOS, the overlap of linear fits to the logarithm of the leading edge of the 5f peak (FIG. 4A) demonstrates an absence of the hot electrons that typically give either mid-gap states (30, 97, 98) or the photoinduced metallic state of thermalized hot electrons residing in states above the Fermi level (30, 31, 47, 99, 100) or edge of the valence band even in filled insulators (30).

The t=0 spectrum with 3.12 eV excitation, with fluences from 0.7-3.2 mJ/cm$^2$=0.015-0.07 excitations/U in the top nm, gives the converse DOS (FIG. 2d); it is continuous, featureless, and relatively flat over the full 3 eV monitored with no sign of features in the unoccupied 5f region. Apart from the excess electrons coming off of the upper edge of the LHB that occur in many photoexcited systems, it could be said to emulate the $UO_{2+x}$ DOS, analogous to the 4.7 eV excitation recapitulating the $UO_2$ DOS. This would result from the excited electrons giving the $UO_{2+x}$ CPQP directly without atom displacements, similar to the charge density wave in $TaS_2$ (30). Increased fluence increases the magnitude of this nonthermal DOS and also produces hot thermalized electrons whose temperature parallels the fluence (FIG. 4B). Like 4.7 eV, excitation at 3.1 eV also gave biexponential relaxation, with an initial fast lifetime of ~4-0.22 ps for 0.71-3.2 mJ/cm$^2$ and a slow lifetime of 8 ps (38). That the shapes of the spectra are retained even at fluences below that where the fast relaxation is minor therefore also indicates that it corresponds to the slow relaxation spectrum. This is corroborated by the ratio between its integrated areas for 0-1.5 eV and 1.5-3.25 eV being the same at all fluences (S7) (101).

Although this t=0 spectrum shows the expected metallic state (30, 101) typically observed in oxides (102), its extended energy, relatively flat DOS, and the stability implied by its extended fluence independence and association with the slow lifetime resemble the behavior of graphene (103). This is significant because, although this common response could be coincidental, the present disclosure shows that the DOS of O-doped $UO_{2+x}$ also resembles that of graphene in that the shift of the UHB and consequent closing of the Mott gap in $UO_{2+x}$ causes the DOS to descend to a narrow constriction at or near the Fermi level followed by a rapid increase immediately afterwards into the unoccupied states. Another similarity specific to the excited states of both is that thermalized electrons fill in this chokepoint off of the leading edge of the valence band as in metals, bridging the occupied and unoccupied states (FIG. 2C). It has already shown that the polaronic CPQP forms rapidly; the coherence coupled to the CPQP in $UO_{2(+x)}$ in time domain spectra is already at a maximum after the initial ¼ period of 250 fs, instead of the more typical half to one period from other materials (30, 31, 104). Alternatively, it could form in domains where the transient U (111) interplanar separation is large and mimics the CPQP structure at the instant of excitation (102).

The t=0 DOS produced by 3.1 and 4.7 eV excitation are opposites (and 1.6 eV gave no effect (38)). The former promotes electrons into the unoccupied states of the CPQP that forms concomitantly, the latter into those of the static $UO_2$ structure. That this is not a fluence effect is demonstrated by the lifetimes (38) and the complete absence of the 5f UHB feature with 3.1 eV. Energy dependence in the initial response to intense fs optical pulses is antithetical to the current depiction of the photon impulse promoting hot electrons into a continuous, nonthermal energy distribution (30, 101). This result for $UO_2$ is, however, obligatory since excitation at these energies also gave different results when probed by reflectivity that gave the CPQP when excited at 3.1 but not 4.7 eV (18), just as it also gives the CPQP-type result here.

Discussion

Relative to the minor modifications of the LHB, the substantial extension of the DOS from the edge of the UHB into the Mott gap indicates the formation of novel states separate from and not just perturbations of the $UO_2$ host. These results therefore corroborate this same interpretation of our previous experiments about the presence of the CPQP. Although the shape of the occupied states after 3.1 eV photoexcitation (FIG. 2D) differs from that with O-doping (FIG. 2C) in that the numbers of excited electrons at each energy are relatively flat instead of increasing to fill the available states above the chokepoint, the same trend is evident in that the numbers remain high through the $UO_2$ gap region and into its unoccupied states. It can therefore be inferred that this pattern is the signature in the DOS of the CPQP and that the polarons from both O-doping and photoexcitation behave similarly.

In addition to the previous findings of greatly extended lifetimes and coherence coupled to non-$UO_2$ static states, what is observed here are that electrons with energies 2-3 eV above the Fermi energy persisting for an extraordinary 6-9 ps or more at ambient temperature (38) (and possibly μs below 60 K if this is the same state observed in the optical pump-reflectivity probe experiments (18).) This can be understood for the static $UO_2$ 5f states obtained with 4.7 eV excitation because, as has been posited (38), relaxation requires crossing the full Mott gap (FIG. 2D). The absence of a gap in the DOS with 3.1 eV excitation obviates this rationale for the CPQP. The continuity in energy would be expected to accelerate the relaxation of the photoinduced CPQP relative to the UHB 5f, instead the relaxation times associated with the two states are actually within <50% of each other (38). Exceptionally long lifetimes are, however, characteristic of nonequlibrium BECs and therefore an indication of this state in $UO_{2(+x)}$. Although the CPQP in O-doped $UO_{2+x}$ with tunneling is considered as static because its polarons are not transient as with photoexcitation, it was found in cuprates that x-ray probes provide instantaneous snapshots of the multisite structure associated with the upper vibrational states of the double well because their ultrafast interaction time causes their energy to be broadened by the uncertainty principle (28, 29). The x-ray probes themselves therefore provide sufficient energy to populate levels coupled to the tunneling.

The quasiparticle non-equilibrium, exciton-polariton and phonon condensates form because relaxation is inhibited. The excited quasiparticles accumulate in the first state above the bottleneck to give the nonthermal population distribution that subsequently attains coherence. Underlying these extended lifetimes are specific resonances. For phonons it is the proximity of the excited phonon energy with the chemical potential (6, 105), for exciton-polaritons it is the proximity of the exciton and cavity photon energies around k=0 and their avoided crossing that creates the minimum in the lower polariton band (13), and for the dilute atomic gas fermion-diatomic molecule boson systems it is the matching of the continuum of the fermionic potential with the energy of the molecule that turns on their exchange via the Fano-Feshbach resonance (32, 60). A resonant effect has already been demonstrated in $UO_2$ by the excitation energy dependence of the coherence, lifetimes, and the formation of the photoexcited CPQP.

Figure 5:
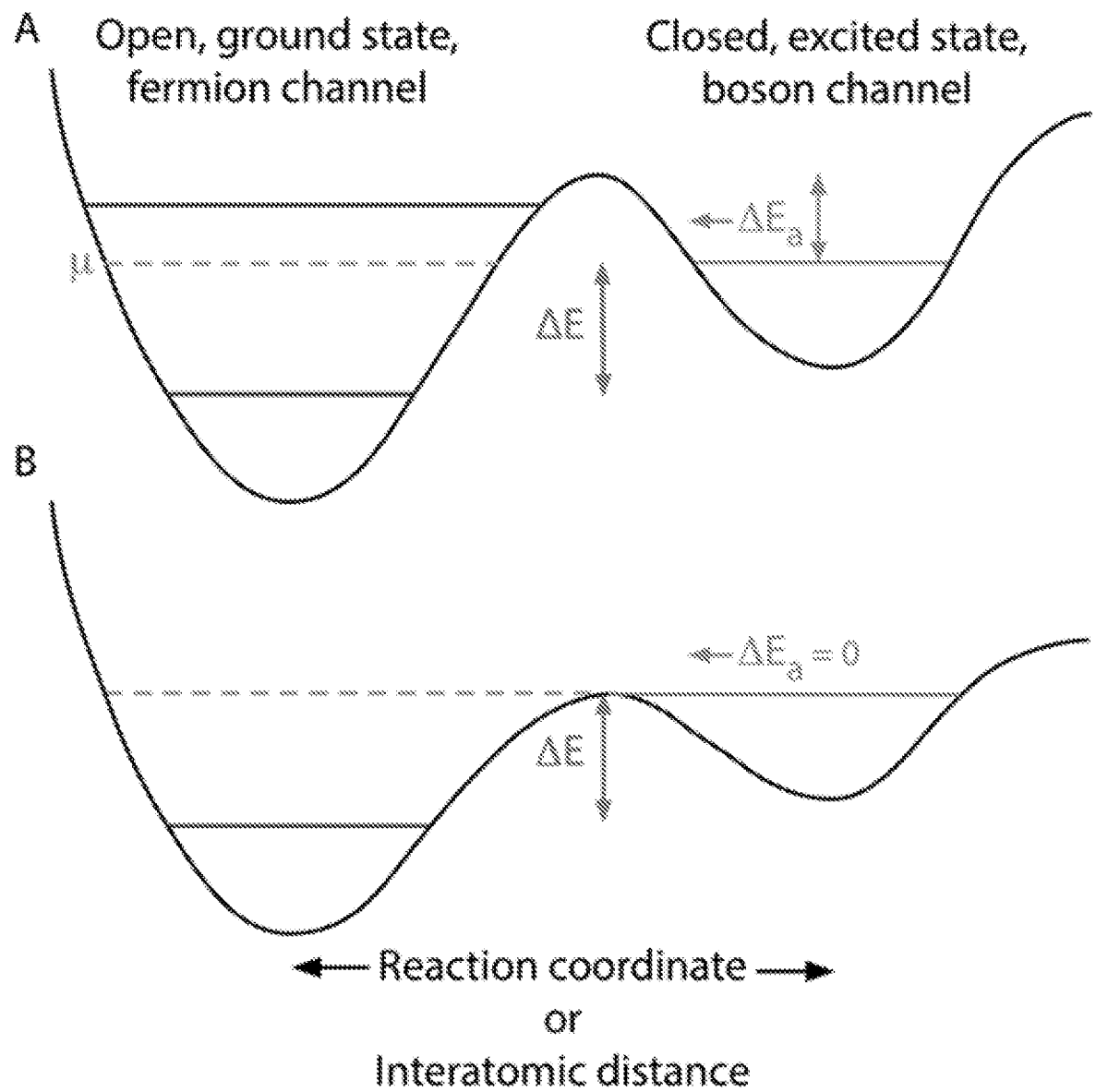
FIG. 5 illustrates potentials/reaction coordinates for asymmetric double well potentials representing the two states of the non-equilibrium condensate and their stabilization by a Fano-Feshback resonance. The pair potential is the curve across its entire range, the reaction coordinate is the range between the arrows.

The role of resonance and the microscopic themes in non-equilibrium Fröhlich BECs and the specific contributions to $UO_2$ are elucidated by examination of the generic potentials of two state systems. The polarons on the apical O in cuprates tunnel between the two halves of a symmetric, degenerate, double well potential because the two structures involved are identical (24-26, 28) (although it is possible that the polarons in the $CuO_2$ planes are more complicated (106)). An asymmetric double well would have been superfluous because of the assumption that the functionality originates in the ground state phase at all temperatures. In contrast, the two species involved in a non-equilibrium condensate are non-degenerate by definition, resulting in an asymmetric potential composed of the ground and excited quasiparticle states (FIG. 5). In this diagram the configuration of the overlapping potentials often used for photoexcitation as well as to depict the fermionic atom gas condensate Feshbach resonance (32) is unfolded into a more typical double well picture. The energies are for the constituent atoms or quasiparticles of the condensate, and the distance will be for a pair of atoms that represent an order parameter describing the total change in configuration. This same diagram between the two local minima can, however, also be viewed as a reaction coordinate, which is of interest because the fermionic diatomic molecule condensate undergoes changes in its chemical speciation as part of its coherence mechanism, as we have also proposed for $UO_{2(+x)}$. The important component of a double well potential is the barrier, whose height and width determine the ease of exchange between the two halves. Phonon and exciton-polariton condensates depend on a high barrier that is difficult to cross (FIG. 5A), resulting in the accumulation of particles in the excited state that subsequently condense. In contrast, since the continuum energy of the atoms equals the energy of the molecule the barrier for the diatomic molecule to split is zero, (FIG. 5B) with a smooth conic intersection of the two potentials instead of a peak or cusp (107). In the absence of an external energy source the atom gas condensate must therefore retain the excess energy ΔE while remaining coherent in order to continuing exchanging with the molecular one.

For the $UO_{2(+x)}$, CPQP the open channel is the unpaired spin ("triplet"), weakly paired, fermionic U(IV,V) polarons in the $U_4O_9$-like domains that have been shown (108, 109) to be more stable than isolated polarons, which would be the continuum state. The bosonic U(IV,VI) excited singlet state is the strongly paired closed channel. Relaxation is inhibited and the nonthermal population and condensation are favored when the chemical potential is near the energy of an excited phonon (6), although this derivation is not specific and should apply equally well to any system with oscillating dipoles. The chemical potential in $UO_2$ will be in the Mott gap, defined as midway in a semiconductor or insulator. Since the states of the CPQP span the gap, or at least the measured DOS is large at the midpoint of the calculated gap for $U_4O_9$, this condition is met. Insofar as polarons maximize the atom displacements and polarizability they also fulfill this criterion for strong condensation enhancement. In addition, the energy of the $U_4O_9$-like U(IV,V) cluster has been calculated to be 2.2 eV below that of the separated U(V)—O defects that would be the continuum-free polaron level (90). Remarkably, this is almost exactly the difference between the centers of the spectral features that would be the occupied U 5f(FIG. 2B) and the lowest energy unoccupied (FIG. 2C) states in $U_4O_9$. This proximity of the excited U(IV,VI) state energy to that of the continuum is the condition for the Fano-Feshbach resonance. $UO_{2(+x)}$ therefore also belongs to the FIG. 5B scenario, with U(V) fermions in the deeper minimum on the left and U(IV/VI) bosons the one on the right at the longer U-U distance that accommodates the terminal U(VI)-oxo moieties. Although it is an open question if the relaxation from the excited state can still be retarded in the absence of a barrier, $UO_{2(+x)}$ fulfills the stated criteria for non-equilibrium condensation.

These new results in combination with previous ones provide details on the underlying mechanism in energy-momentum space that complement the real space scenario, indicating that it is direct and does not involve suppression of competing orders despite the antiferromagnetism of $UO_2$ (19, 110). The x-ray and neutron structure measurements (18, 111) have identified the specific tunneling polarons that, because they alternate between the open channel fermion and closed channel boson states via the disproportionation reaction 2 U(V)↔U(IV)+U(VI), define the asymmetric double well. The persistence of the condensate to high temperature is therefore a natural consequence of its origin as an excitation. Coherence throughout the entire domain is attained through synchronization of the electron transfer and correlated rearrangement of the O ions that constitute this reaction via the relative stability of the U(IV,V) species at the short U-U distances on the compressive and U(IV,VI) ones at the long distances on the tensile side of the [111] phonon. This phonon is special, also being implicated in stress relief caused by various defects (36, 112). The long range force for $UO_{2(+x)}$ is therefore at least partly elastic instead of solely Coulomb. Specific to $UO_2$ and its absence of an insulator-to-metal transition; $UO_2$ differs from related materials in that the fluorite structure does not have a preferred orientation for adding O so that $U_4O_9$ is three dimensional. The layered U(IV)-(VI) structure that is the excited state displays the alternative valence that constitute a charge-density wave, inverting the normal energies of the insulating and metallic states. In addition, another possible reason for the differences in the response to different excitation energies is that the excited state produced by 3.1 eV but not 4.7 eV excitation is coupled to the U [111] phonon, analogous to phonon-driven enhancement of electron correlation in cuprates (113) and has recently been postulated for $C_{60}$ (114).

The electronic structure of the CPQP maps directly onto this real state model. The CPQP is a different species, not the minor perturbation of $UO_2$ predicted by the calculations, with only the states above the Fermi level affected because it is an excited state of $UO_2$. Its wide dispersion would result from the U—O bonds that, like the U-U pair, would have the almost continuous range of bond lengths over a minimum of several tenths of an A, augmented by the mixing of the two strongly coupled parent states via the tunneling (28). The tunneling would be another signature of a condensate, since it is far too long a distance for conventional tunneling but small within the superfluid (115) tunneling regime. In addition, the energy overlap of the ground U(IV,V) and excited U(IV,VI) DOS indicates that the dynamic exchange of their local atomic structures is also the coherent exchange between their electronic states that are separate at the Fermi level. This exchange enhances condensation in two-band descriptions of exotic superconductivity (116, 117). Thus, in $UO_2$ the phonon that impels the hopping of the charges also promotes the coherence and resultant condensation, which is the opposite of it disrupting competing orders (113, 114, 118). This coherent exchange, as a Fano-Feshbach resonance that amplifies exotic BCS (33, 34) and fermionic atom-molecule gas BEC condensates (60, 119, 120), would be the origin of the coherence of the two states or their combined single one.

Accepting the evidence that the CPQP in $UO_{2(+x)}$ is a non-equilibrium Fröhlich-type BEC, the question is whether it will have in common the properties of other condensates and also if it will exhibit novel ones. Although the extended lifetimes of the states after photoexcitation relative to other materials are remarkable, even more so are the formations of the CPQP and the static $UO_2$ DOS from their respective excitation impulses within the 40 femtosecond width of the measurement with no sign of the normal intermediate state. The optical switching time is therefore zero on this time scale, consistent with the different outcomes with the different excitation energies. The partly filled bands above the chokepoint that form with 3.1 eV excitation and span the entire range of energy (FIG. 2E) could be described as a "superthermal" metallic state. This is not the continuous, almost plasma-like electron distribution that relaxes in a few tens to hundreds of fs into a more normal metallic state with thermalized electrons that is the typical response of materials to a high fluence laser impulse but absent for $UO_{2(+x)}$ with its immediate switching. As described, this CPQP state persists for close to 10 ps or longer. The thermalized electrons (FIG. 4B) that may fill in and obscure the chokepoint in the CPQP DOS found with O-doping could originate either directly or via relaxation from the superthermal metal population. That this pattern occurs with lower numbers but identical distribution even at low fluence is additional evidence for the stability of the CPQP in that it demonstrates that it forms spontaneously even from only a small quantity of O-doped or solely from photoinduced polarons. Although suggesting that electrons 3 eV higher than the Fermi level are a signature of a condensate would seem contradictory, this energy is an attribute of the electrons on the atoms, not the energy of the condensate nor even its constituent polaronic quasiparticles. Since the atoms are tunneling through an anharmonic pair potential that traverses a 30% or wider range of U—O bond lengths it is perhaps not unexpected that they display a comparably wide range of electronic energies. In addition, there will be unusual constraints on the energy distribution because of the need to conserve it during the exchange between the ground and excited states. Equally notable in the context of energy flow is the absence of hot electrons with 4.7 eV excitation (FIG. 4A). The immediate formation of the static $UO_2$ excited state is concomitant with the channeling of the excess electronic energy into other locations. As noted, since the hot electrons on the leading edge of the LHB with 3.1 eV excitation could originate in relaxation from the superthermal state it is possible that the energy of this photon impulse also does not heat the electrons.

These results validate and extend our model for the CPQP and continue to highlight the preeminence of $UO_2$ as a system encompassing many of the current ideas about dynamic electron-phonon coupling as the origin of the polaron physics of Mott insulators and the convergence of Bose-Einstein and BCS condensates. We also note the observation that the Fano-Feshbach resonance that is not universal in non-equilibrium BECs is associated with a change in chemical speciation, differentiating homogeneous non-equilibrium BECs where the quasiparticles are only perturbations of the ground state from heterogeneous ones that involve a chemical reaction and coherent exchange between the ground and excited state species. Additional novel properties may be found as this system is explored more thoroughly.

Experimental Design.

These experiments elucidate the response of the density of states around the Mott gap to O-doping by using U M RIXS to probe the occupied states below the Fermi level in $UO_2$, $U_4O_9$, and $U_3O_7$, and O XAS and NIXS to probe the unoccupied states above the Fermi level in the same compounds. These measurements were complemented by similar ones on relevant standards, $Cs_2UO_2Cl_4$, $U_3O_8$, and α $UO_3$, to be used to understand the assignments and trends. These were supplemented by O XAS measurements on $UO_2$ and $U_4O_9$ samples mounted on the end of liquid nitrogen cooled cold finger to determine whether changing the temperature would affect the electron distribution even in the absence of a phase transition. Time resolved photoemission experiments coincident with the excitation pulse at a range of fluences with 1.6, 3.1, and 4.7 eV excitation energy were used to probe the response of the density of states around the Mott gap to photo-doping, which creates U(III) and U(V) polarons in $UO_2$ without lattice defects. The experiments were supplemented by calculations of the densities of states to predict the changes that would be expected with O-doping and the x-ray measurements for comparison with the experimental results.

Experimental Methods. The materials and experimental procedures and modeling methods have been described previously (18, 19, 37, 38, 87, 89, 90) in addition to the following information.

The O K non-resonant inelastic x-ray scattering (NIXS) spectra of $UO_2$ and $U_3O_7$ were measured at the same time as the $O_{4,5}$ NIXS spectra previously reported (37) and therefore were from the same materials and used the same preparation and experimental methods (121). The $UO_2$, $U_3O_7$, and $U_4O_9$ for the NIXS measurement were from the same materials as those used for a combined neutron and x-ray pair distribution function and U $L_3$ X-ray Absorption Fine Structure spectroscopy study (18). The single crystal of $UO_2$ was from the same boule as used in previous ultrafast optical studies (122). The sample of $Cs_2UO_2Cl_4$ was also from the same material used for in our $O_{4,5}$ NIXS report (37). The O K fluorescence yield (FY) XAS measurements were also performed as reported previously (121) except that the $UO_{2+x}/U_4O_9$ spectra were measured on beamline 10-1 instead of 8-2. A synopsis of these procedures as well as descriptions of those not included in this list follows. For the time resolved photoemission (38), the number of excitations is calculated using the listed fluences, 1 nm thickness, optical densities of $1.2\times10^5$ cm$^{-1}$ at 3.1 eV and $1.0\times10^5$ cm$^{-1}$ at 4.7 eV (123), density of 11.0 g/cm$^3$, and a formula weight for $UO_2$ of 270 g. No scattering correction was made.

Preparation of Samples. Ultrapure $UO_2$ was prepared by precipitating $UO_2(O_2)$ from aqueous solution, converted to $UO_3$ by heating in air at 400° C., followed by reduction with $H_2$ at 500° C. $U_4O_9$ for the NIXS measurement and $U_3O_7$ were made by heating a mixture of the appropriate amounts of $U_3O_8$ and $UO_2$ in a sealed quartz tube at 1000° C. for 15 days. Amorphous $UO_3$ was prepared by heating $UO_2(O_2)$ at 400° C. in air for 6 hours. It is assumed that this is locally identical to α $UO_3$ (124) that results from heating at a somewhat higher temperature (125) and differs in the U vacancies being disordered. Orthorhombic $U_3O_8$ was prepared by heating $UO_2(O_2)$ in air at 800° C. and verified by XRD. The FY samples of $UO_{2.25}/U_4O_9$ were made from the controlled oxidation of a different $UO_2$ starting material and verified by XAFS, XRD, and weight. $Cs_2UO_2Cl_4$ was prepared by the previously reported methods (37). Purity was checked by XRD, and for the fluorite compounds by neutron scattering and U $L_3$ XAFS, all of which were previously reported (18). All compounds were handled anaerobically because we have on some occasions observed relatively rapid changes in the U $L_3$ and O K XAFS spectra of $UO_2$ that imply oxidation on exposure to air, probably because of the condition of the surface. Samples were ground and cast into polystyrene films under inert atmosphere as reported (37, 121). Those for NIXS were around 70 wt-% of the material, 30 wt-% polystyrene. O K XAS samples were much more dilute, around 5 wt-%, and were mixed with C powder before casting into the polystyrene solutions poured into ca. 2×6 mm wells in individual Cu blocks, with ~20 Å of C subsequently sputtered onto their surfaces for protection and conduction.

Oxygen K-Edge NIXS and Fluorescence Yield Measurements.

All NIXS measurements were taken using the lower energy resolution inelastic X-ray scattering (LERIX) user facility at the PNC/XOR 20-ID undulator beamline of the Advanced Photon Source (126) using a double-crystal Si (111) monochromator with incident photon flux of ~$10^{12}$/s. The net energy resolution (fwhm) of the monochromator and the LERIX analyzer crystals is 1.3 eV, as determined from the width of the elastic scattering line. An interval of 0.2 eV was used in the actual measurement, counting for 80 seconds at each point for a total time of 6-10 hours per spectrum. NIXS data extraction and processing followed methods reported previously (126, 127). The dipole approximation to the NIXS cross section was verified by the independence of the oxygen K-edge shape over the range of q reported, so that the spectra shown here are the summed counts from six different detectors spanning from q ~3.3 to 4.8 a.u. The typical measurement time per data point is 80 s, which yields ~5000 counts in the q-integrated edge step above the ~60 000 counts from background due to the valence Compton scattering. Although the polystyrene matrix darkened in color during the measurement, the NIXS data were unaffected as determined by comparing spectra as the total dose accumulated.

Room temperature O K-edge XAS data were recorded at the Stanford Synchrotron Radiation Lightsource (SSRL) at VUV beamline 8-2 (128), utilizing bending magnet radiation and a spherical grating monochromator, under synchrotron ring conditions of 3.0 GeV and 85-100 mA. A standard vacuum system was used, except that for U a 1200 Å carbon window was used to isolate the chamber from the upstream instrumentation and ring. The incident radiation was monitored using an Au grid with 80% transmission. The fluorescence was measured at normal incidence using two International Radiation Detector XUV100 type photodiodes coated with 1000 Å of aluminum to reduce visible light absorption. This was accomplished by placing the photodiodes facing the sample with a 3 mm gap between them for the passage of the beam. The diodes were 5-10 mm from the sample and were mounted in a cavity in a grounded copper block to prevent electrical interference. The total electron yield (TEY) and FY data for the spectra of the various compounds showed no sign of radiation damage. The $UO_{2+x}$ and $U_4O_9$ were measured on beamline 10-1, a wiggler source with a similar monochromator. The sample was turned 45° and the diode monitoring the fluorescence was located at a right angle relative to the beam direction in the horizontal plane. FY data were converted to absorbance by dividing the diode by a Au grid current, similar to the 8-2 experiment. For both the 8-2 and 10-1 experiment, the spectra were normalized by subtracting a line that was fitted through a flat region below the initial rise in absorbance and the spectra offset so that the extrapolated value of this line at 553 eV equaled zero, then multiplied by a factor so that the value of a second line fitted over the flat region above the absorption edge features (approximately 550-590 eV) was unity at this same value. In some spectra sloping backgrounds beyond the spectral peaks caused the absorption to be below one in this region, resulting in a diminution in the amplitudes of these peaks as well. However, since we only compare relative amplitudes within a spectrum this has no effect on the interpretation of the results. Curve-fits to identify spectral features were performed with Gaussians plus an arctangent function to approximate the transition to the continuum. This arctangent was positioned prior to optimization within the higher energy peak, consistent with the assignment for $UO_2Cl_4^{2-}$ (83) and with the analogous behavior of transition metal oxides.(129) Because this results in a difference with previous assignments of the spectral features to electronic states, instead of referring to the lower and higher energy peaks as 5f and 6d we use the nomenclature from higher energy core transition metal level spectroscopy and refer to them as, respectively, the "preedge" that should be transitions to bound states and the "white line" that may include transitions to bound states, the transition to the continuum that begins at the ionization energy, and transitions to quasi-bound states.

U $M_5$ RIXS Measurements.

The RIXS experiment at the U $M_5$ edge was performed at the ID26 beamline of the European Synchrotron Radiation Facility(130). The incident energy was selected using the (111) reflection from a cryo-cooled Si crystal monochromator. Rejection of higher harmonics was achieved by three Si mirrors at the angles of 3.5, 4.0 and 2.5 mrad respectively. The beam size of 0.1×0.4 mm (vertical×horizontally) was measured. The valence to core RIXS at the U $M_5$ edge was recorded by X-ray emission spectrometer (131, 132) equipped with five Si(220) crystal analyzers. The intensity was normalized to the incident flux.

DFT/LDA+U Calculations

DFT+U or LDA+U calculations (133) based on projector augmented wave (PAW) potentials (134, 135) were carried out for $UO_2$ and the calculated structures for the $U_4O_9$ and $U_3O_7$ phases that are analogous to the neutron structures with large unit cells using the same computer code as the hybrid calculations (VASP) (136). These two phases were described with the structure models derived from ordering of quad-interstitial clusters (90), which correspond to the 0 K minimum energy configurations predicted by DFT+U (90). As reference, calculations were also performed on stoichiometric $UO_2$ described with a 2×2×2 fluorite supercell. All DFT+U calculations applied plane wave cut-off energy of 500 eV. Both volume and internal structural parameters were relaxed for all crystal structures. The latter was relaxed until the Hellmann-Feynman forces on each ion were sufficiently small (<0.02 eV/A) or until the total energy was converged to at least 0.0001 eV/atom. For $UO_2$ a 2×2×2 Monkhorst-Pack k point mesh was used and other structures applied meshes of approximately the same density. Convergence with respect to k points was verified for all cases. The Brillouin zone integration applied Gaussian smearing with a smearing parameter of 0.05 eV. The U and J parameters of, respectively, 4.5 and 0.5 eV, were taken from the $UO_2$ values determined by Dudarev et al. (137) and issues related to meta-stable electronic solutions were addressed using the reported approaches (138, 139).

FEFF9 Calculations.

Calculations of O K-edge XANES and LDOS were carried out for $UO_2$ and $Cs_2UO_2Cl_4$ using a version of the FEFF9 self-consistent real-space multiple scattering code (140, 141), which was extended to include spin-orbit splitting in the calculation of the LDOS. Valence densities and potentials were calculated self-consistently, and the U f states were allowed to relax. The calculations of the spectra were converged with respect to both the cluster sizes used for the modeling of the systems, and the maximum angular momentum used in the full multiple scattering (FMS) calculations. Final state effects were included using a constant Lorentzian broadening to account for the finite lifetime of the core-hole, and the Hedin-Lundquist self-energy model to account for the interactions between the photo-electron and the valence system. Additional core-hole effects were included via the final state rule, and compared to calculations without core-hole interactions.

Dirac-Hartree-Fock Calculations.

Additional evaluations of the effects of ligand field splitting and of spin-orbit coupling on multiplet splitting in the spectrum of $UO_2$ were obtained from relativistic Dirac-Hartree-Fock type calculations (87, 142) on the bare $U^{4+}$ ion with only spin-orbit splitting and the $UO_8$ cluster that will exhibit both spin-orbit and ligand field splitting. The bare $U^{4+}$ cation is a simple atomic model for U(IV) in $UO_2$ and neglects ligand field effects, including covalent mixing of U and O orbitals to form bonding and anti-bonding orbitals. The ligand field effects are taken into account with an embedded $UO_8$ cluster (143), which includes, in particular, the covalent mixing of U and O frontier orbitals (144). Furthermore, in order to represent multiplet effects for the XAS excited states, we consider wavefunctions for configurations of $U^{3+}$ where an additional electron is added to the frontier orbitals of $U^{4+}$, as discussed below. The wave functions for the cluster were determined with the full four-component formalism (143), including spin-orbit splitting, and also with a spin-free Hamiltonian (145) where only the scalar relativistic terms are included but the spin-orbit splitting is neglected. All calculations reported for $U^{4+}$, $UO_8$, and $U^{3+}$ were performed with the Dirac08 program system (146); details of the $U^{4+}$ and $UO_8$ embedded cluster calculations are given in (143). For $U^{3+}$, the multiplet splittings were determined for two configurations with 4-component orbitals for these configurations optimized with Dirac-Hartree-Fock calculations for the average of configurations. The angular momentum coupling of the valence level electrons for the isolated $U^{3+}$ cation, with open shell occupations of $5f^3$ and $5f^26d^1$ that are the U configurations that could be generated from excitations from an O is shell, which is not explicitly taken into account in this atomic model, was introduced by configuration mfixing of determinants that have different distributions of the electrons over the 14 5f spinors and the 10 6d spinors. This configuration mixing takes full account of the intermediate angular momentum coupling of the open shell electrons between j-j coupling and Russell-Saunders LS coupling. The computational procedures were as described in Ref. (87).

Statistical Analysis.

Spectroscopic results such as these that do not utilize amplitudes quantitatively are not amenable to statistical analysis. Noise levels, and the associated significance of the results, can be estimated by inspection. Uncertainties in energy are typically 0.1-0.2 eV.

Turning to FIG. 16, panel A), there is disclosed a sectional view of an electrical device 1602 in accordance with an embodiment of the present disclosure. FIG. 19, panel A), illustrates a cross-sectional view of the electrical device through line 1902-1902' of FIG. 16 panel A) in which there is a single $UO_{2+x}$ crystal or a first oriented crystal $UO_{2+x}$ film 102 between leads 106 and 108. FIG. 20, panel A), illustrates a cross-sectional view of the electrical device through line 1902-1902' of FIG. 16, panel A) in which there are multiple (e.g., 2 or more, 3 or more, 4 or more, 5 or more, or six or more) single $UO_{2+x}$ crystal or a first oriented crystal $UO_{2+x}$ films 102 between leads 106 and 108. In some embodiments, the electrical device 1602 operates in a range of −273° C. to 100° C. In some embodiments, the electrical device 1602 operates outside this temperature range. The electrical device 1602 comprises an insulating substrate 104 having a surface 105. The electrical 1602 device comprises a first single $UO_{2+x}$ crystal or a first oriented crystal $UO_{2+x}$ film 102 on a first portion of the surface 105. The first single $UO_{2+x}$ crystal or the first oriented crystal $UO_{2+x}$ film originates and hosts, under certain conditions, a non-equilibrium polaronic quantum phase-condensate. As used herein, the term "quantum phase-condensate," means that the material hosts a quantum phase and/or that it is condensed. The terms "condensed" and "condensate" are used interchangeably herein and refer to matter (e.g., a first single $UO_{2+x}$ crystal or a first oriented crystal $UO_{2+x}$) in which all the constituent particles of the matter are in the same state so that they become coherent (their wave functions are all in phase and therefore act synchronously) and exhibit quantum phenomena such as interference and superfluidity. This is distinguished from matter that is entangled (i.e., all the particles of the matter are described by a single wave function). The experiments summarized in the present disclosure provide direct evidence that the first single $UO_{2+x}$ crystal or the first oriented crystal $UO_{2+x}$ film 102 exhibits quantum phase behavior. The experiments summarized in the present disclosure provide direct substantial, albeit indirect, evidence that the charge inhomgeneities/polarons in the first single $UO_{2+x}$ crystal or the first oriented crystal $UO_{2+x}$ film are condensed or have the requisite quantum properties of a condensate.

Continuing to refer to FIG. 16, panel A), the electrical device 1602 further comprises a first lead 106 comprising a first electrically conductive material on a second portion of the surface 105. The first lead 106 is in electrical contact with the first single $UO_{2+x}$ crystal or the first oriented crystal $UO_{2+x}$ film 102.

Continuing to refer to FIG. 16, panel A), the electrical device 1602 further comprises a second lead 108 comprising a second electrically conductive material on a third portion of the surface 105. The second lead 108 is in electrical contact with the first single $UO_{2+x}$ crystal or the first oriented crystal $UO_{2+x}$ film 102. The first lead 106 and the second lead 108 are not in contact with each other as illustrated in FIG. 16, panel A).

Continuing to refer to FIG. 16, panel A), the electrical device 1602 further comprises a $UO_{2+x}$ excitation source 112 in operable communication with the first single $UO_{2+x}$ crystal or the first oriented crystal $UO_{2+x}$ film 102. In some embodiments the $UO_{2+x}$ excitation source 112 applies a gate voltage provided by lead 113 to the first single crystal or the first oriented crystal $UO_{2+x}$ film 102 without passing a current through the first single crystal or the first oriented crystal $UO_{2+x}$ film 102. As such, the excitation source 112 is configured to polarize a region of the first single crystal or the first oriented crystal $UO_{2+x}$ film 102 to activate the non-equilibrium polaronic quantum phase-condensate and thereby determine an electrical conductivity of the first single crystal or the first oriented crystal $UO_{2+x}$ film 102. A first state of the excitation source 112 causes the first single $UO_{2+x}$ crystal or the first oriented crystal $UO_{2+x}$ film to be electrically conducting, and thereby allow a current to pass from the first lead (source) to the second lead (drain). In some such embodiments, the first single crystal or the first oriented crystal $UO_{2+x}$ film 102 is grounded. In some such embodiments, the second lead (drain) is grounded. A second state of the excitation source 112 causes the first single $UO_{2+x}$ crystal or the first oriented crystal $UO_{2+x}$ film to be electrically non-conductive. Thus, when in the second state, current no longer flows from the first gate (source) to the second gate (drain).

In some embodiments, the $UO_{2+x}$ excitation source 112 is a metal such as aluminum, copper, silver, or gold. In some embodiments, the $UO_{2+x}$ excitation source 112 is less than 10 nM thick. In some embodiments, the $UO_{2+x}$ excitation source 112 is less than 5 nM thick.

Continuing to refer to FIG. 16, panel A), in some embodiments the $UO_{2+x}$ excitation source 112 is electrically isolated from the first single $UO_{2+x}$ crystal or the first oriented crystal $UO_{2+x}$ film 102 by an insulator 110. Therefore, in such embodiments, the $UO_{2+x}$ excitation source 112 does not pass a current into the first single $UO_{2+x}$ crystal or the first oriented crystal $UO_{2+x}$ film 102. As such, FIG. 16, panel A), represents an electrical device exhibiting a field effect or gating mode between an electrically conducting and electrically non-conductive state.

Continuing to refer to FIG. 16, panel A), in some embodiments, the $UO_{2+x}$ excitation source 112 applies a first voltage that is in a first voltage range to the first single $UO_{2+x}$ crystal or the first oriented crystal $UO_{2+x}$ film 102 when the $UO_{2+x}$ excitation source is in the first state and the $UO_{2+x}$ excitation source 112 applies a second electric voltage that is in a second voltage range to the first single $UO_{2+x}$ crystal or the oriented crystal $UO_{2+x}$ film 102 when the $UO_{2+x}$ source is in the second state. In such embodiments, the $UO_{2+x}$ excitation source 112 is electrically isolated from the first single $UO_{2+x}$ crystal or the first oriented crystal $UO_{2+x}$ film 102 by one or more insulator layers 110 and the substrate 104 is grounded. In other words, the $UO_{2+x}$ excitation source 112 does not pass a current through the first single $UO_{2+x}$ crystal or the first oriented crystal $UO_{2+x}$ film 102.

Electrical device 1602 is advantageous because the first single $UO_{2+x}$ crystal or the first oriented crystal $UO_{2+x}$ film 102 can be switched from the electrically conducting state to the electrically non-conductive state very quickly and thus serve as a very fast switching gate. Electrical device 1602 is further advantageous because of the electrical conductivity of the first single $UO_{2+x}$ crystal or the first oriented crystal $UO_{2+x}$ film 102 when in the electrically conducting state. For instance, in some embodiments, the electrical conductivity of the first single $UO_{2+x}$ crystal or the first oriented crystal $UO_{2+x}$ film 102 when in the electrically conducting state is at least one thousand times that of copper. In some embodiments, the electrical conductivity of the first single $UO_{2+x}$ crystal or the first oriented crystal $UO_{2+x}$ film 102 when in the electrically conducting state is at least ten thousand times that of copper, one million times that of copper, or ten million times that of copper. Stated differently, in some embodiments, the electrical resistance of the first single $UO_{2+x}$ crystal or the first oriented crystal $UO_{2+x}$ film 102 when in the electrically conducting state is at least one thousand times less than the resistance of copper. In some embodiments, the electrical resistance of the first single $UO_{2+x}$ crystal or the first oriented crystal $UO_{2+x}$ film 102 when in the electrically conducting state is at least 10 thousand times less than the resistance of copper, one million times less than the resistance of copper, or 10 million times less than the resistance of copper. As such, the electrical device 1602 illustrated in FIG. 16, panel A), can be made very small and still transmit large current and power. Such electrical devices have a wide range of practical applications, such as in the field of electric power transmission. An electrolytic copper cable rated for 220 kV with a cross section of 800 $mm^2$ has a resistance of 0.032 S/km and a continuous current capacity of ~800 A. Copper is considered to have one free electron that has a Fermi velocity of $1.6 \times 10^8$ cm/sec, giving it $0.6 \times^{-8}$ current carrying electrons/atom at the Fermi edge. In some embodiments the quantum phase-condensate in the first single $UO_{2+x}$ crystal or the first oriented crystal $UO_{2+x}$ film 102 has 0.03 current carrying electrons/atom at the Fermi edge, a factor of 50,000 higher. Conducting the same power as this Cu cable would therefore require only 0.02 $mm^2$ of the first single $UO_{2+x}$ crystal or the first oriented crystal $UO_{2+x}$ film 102, equivalent to a 40 mm wide 500 nm thick ribbon relative to the 32 mm wide Cu cylinder. The Cu in a 1 meter long section of this cable has a mass of 7200 g, compared to the first single $UO_{2+x}$ crystal or the first oriented crystal $UO_{2+x}$ film 102 mass of 2.2 mg. In some embodiments, the first single $UO_{2+x}$ crystal or the first oriented crystal $UO_{2+x}$ film 102 is supported on an appropriate substrate 104 such as $CaF_2$ or ytrrium stabilized zirconia (YSZ), which advantageously would also be quite thin to give it flexibility. Overall, the support structures for the first single $UO_{2+x}$ crystal or the first oriented crystal $UO_{2+x}$ film 102 would be combined with an insulation (not shown in FIG. 16, panel A) but shown instead in FIG. 18 panels B) and C)) and give an overall mass and volume well under that for conventional copper or aluminum. If the quantum phase-condensate was maintained in the first single $UO_{2+x}$ crystal or the first oriented crystal $UO_{2+x}$ film 102 by the current, discussed below with reference to FIG. 16, panel B), then no additional circuitry would be needed, although periodic electrodes might be required to initiate it. FIG. 19, panel B), illustrates a cross-sectional view of the electrical device through line 1904-1904' of FIG. 16, panel B) in which there is a single $UO_{2+x}$ crystal or a first oriented crystal $UO_{2+x}$ films 102 between leads 106 and 108. FIG. 20, panel B), illustrates a cross-sectional view of the electrical device through line 1904-1904' of FIG. 16, panel B) in which there are multiple (e.g., 2 or more, 3 or more, 4 or more, 5 or more, or six or more) single $UO_{2+x}$ crystals or first oriented crystal $UO_{2+x}$ films 102 between leads 106 and 108. If the quantum phase-condensate was formed in the first single $UO_{2+x}$ crystal or the first oriented crystal $UO_{2+x}$ film 102 and created by gating through a metal electrode electrically isolated from the $UO_{2+x}$ crystal or oriented single crystal film, in the form of the $UO_{2+x}$ excitation source 112 and insulation layer 110 would be present on one side of the ribbon, electrically and chemically isolated from the $UO_{2+x}$ excitation source 112 and a small voltage maintained between the $UO_{2+x}$ excitation source 112 and the grounded substrate 102.

As such, in some embodiments, the electrical device 1602 is a transmission line and what is depicted in FIG. 16, panel A), is a sectional view of this transmission line where lead 106 is at one end of the line and lead 108 is at the other end of the line. In some such embodiments, the insulating substrate 104 comprises an insulator layer (not shown) on a substrate carrier (not shown). This is illustrated, however, in FIG. 18, panel A), where there is an insulator layer 104 overlaying a substrate carrier 130. In some such embodiments, the insulating layer 104 comprises $LaAlO_3$, $CaF_2$, ytrrium stabilized zirconia, $ZrO_2$, MgO, $SrTiO_3$, $SiO_2$, $Al_2O_3$, $LiNbO_3$, $NdGaO_3$, $LaGaO_3$, $KTaO_3$, BaTiO3, or $MaGl_2O_4$ and the substrate carrier 130 comprises a metal (e.g. aluminum). In some such embodiments, referring to FIG. 18, panel B), the electrical device further comprises an electrical insulator 140 that wraps around and electrically insulates the electrical device. In some such embodiments, the electrical device is at least a meter in length, the first single $UO_{2+x}$ crystal or the first oriented crystal $UO_{2+x}$ film 102 is at least a meter in length, and the first single $UO_{2+x}$ crystal or the first oriented crystal $UO_{2+x}$ film 102 has a cross-section of 0.05 mm$^2$ or less.

Turning to FIG. 16, panel B), another electrical device 1604 in accordance with the present disclosure is disclosed. In some embodiments, the electrical device 1704 operates in a range of −273° C. to 100° C. In some embodiments, the electrical device 1604 operates outside this temperature range. The electrical device 1604 comprises an insulating substrate 104 having a surface 105. The electrical 1604 device comprises a first single $UO_{2+x}$ crystal or a first oriented crystal $UO_{2+x}$ film 102 on a first portion of the surface 105. The first single $UO_{2+x}$ crystal or the first oriented crystal $UO_{2+x}$ film originates and hosts, under certain conditions, a non-equilibrium polaronic quantum phase-condensate.

Continuing to refer to FIG. 16, panel B), the electrical device 1604 further comprises a first lead 106 comprising a first electrically conductive material on a second portion of the surface 105. The first least 106 is electrical contact with the first single $UO_{2+x}$ crystal or the first oriented crystal $UO_{2+x}$ film 102.

Continuing to refer to FIG. 16, panel B), the electrical device 1604 further comprises a second lead 108 comprising a second electrically conductive material on a third portion of the surface 105. The second lead 108 is in electrical contact with the first single $UO_{2+x}$ crystal or the first oriented crystal $UO_{2+x}$ film 102. The first lead 106 and the second lead 108 are not in contact with each other as illustrated in FIG. 16, panel B).

In the electrical device 1704, the first single $UO_{2+x}$ crystal or the first oriented crystal $UO_{2+x}$ film 102 is operable between an electrically conducting state and an electrically non-conductive state. The first single $UO_{2+x}$ crystal or the first oriented crystal $UO_{2+x}$ film is in the electrically conducting state when at least a threshold current is run from the first lead 106 to the second lead 108 of device 1704 or there is greater than a first voltage differential between the first lead and the second lead. The first single $UO_{2+x}$ crystal or the first oriented crystal $UO_{2+x}$ film 102 is in the electrically nonconducting state when less than the threshold current is run from the first lead 106 to the second lead 108 of the device 1604 or there is less than the first voltage differential between the first lead and the second lead.

Electrical device 1604 is advantageous because the first single $UO_{2+x}$ crystal or the first oriented crystal $UO_{2+x}$ film 102 can be switched from the electrically conducting state to the electrically non-conductive state very quickly and thus act as a very fast switching gate. Electrical device 1604 is further advantageous because of the electrical conductivity of the first single $UO_{2+x}$ crystal or the first oriented crystal $UO_{2+x}$ film 102 when in the electrically conducting state. For instance, in some embodiments, the electrical conductivity of the first single $UO_{2+x}$ crystal or the first oriented crystal $UO_{2+x}$ film 102 when in the electrically conducting state is at least one thousand times that of copper. In some embodiments, the electrical conductivity of the first single $UO_{2+x}$ crystal or the first oriented crystal $UO_{2+x}$ film 102 when in the electrically conducting state is at least 10 thousand times that of copper, one million times that of copper, or 10 million times that of copper. Stated differently, in some embodiments, the electrical resistance of the first single $UO_{2+x}$ crystal or the first oriented crystal $UO_{2+x}$ film 102 when in the electrically conducting state is at least one thousand times less than the resistance of copper. In some embodiments, the electrical resistance of the first single $UO_{2+x}$ crystal or the first oriented crystal $UO_{2+x}$ film 102 when in the electrically conducting state is at least 10 thousand times less than the resistance of copper, one million times less than the resistance of copper, or 10 million times less than the resistance of copper. As such, the electrical device 1604 illustrated in FIG. 16, panel B), can be made very small. Such electrical devices have a wide range of practical applications, such as in the field of electric power transmission. An electrolytic copper cable rated for 220 kV with a cross section of 800 mm$^2$ has a resistance of 0.032 Ω/km and a continuous current capacity of ~800 A. In some embodiments the quantum phase-condensate in the first single $UO_{2+x}$ crystal or the first oriented crystal $UO_{2+x}$ film 102 of electrical device 1704 has 0.03 current carrying electrons/atom, a factor of 50,000 higher. Conducting the same power as this copper cable would therefore require only 0.02 mm$^2$ of the first single $UO_{2+x}$ crystal or the first oriented crystal $UO_{2+x}$ film 102, equivalent to a 40 mm wide 500 nm thick ribbon relative to the 32 mm wide Cu cylinder. The copper in a 1 meter long section of this cable has a mass of 7200 grams, compared to the first single $UO_{2+x}$ crystal or the first oriented crystal $UO_{2+x}$ film 102 mass of 2.2 milligrams. In some embodiments, the first single $UO_{2+x}$ crystal or the first oriented crystal $UO_{2+x}$ film 102 of the electrical device 1604 is supported on an appropriate substrate 104 such as $CaF_2$ or ytrrium stabilized zirconia, which advantageously would also be quite thin to give it flexibility. Overall, the support structures for the first single $UO_{2+x}$ crystal or the first oriented crystal $UO_{2+x}$ film 102 of the electrical device 1604 would be combined with an insulation (not shown in FIG. 16, panel B)) and give an overall mass and volume well under that for conventional copper or aluminum. If the quantum phase-condensate was maintained in the first single $UO_{2+x}$ crystal or the first oriented crystal $UO_{2+x}$ film 102 by the current as discussed herein with reference to FIG. 16, panel B), then no additional circuitry is needed, although periodic electrodes might be required to initiate it. If the quantum phase-condensate was formed in the first single $UO_{2+x}$ crystal or the first oriented crystal $UO_{2+x}$ film 102 and created by gating then a metal electrode, in the form of the $UO_{2+x}$ excitation source 112 and insulation layer 110 would be present on one side of the ribbon, electrically and chemically isolated from the $UO_{2+x}$ excitation source 112 and a small voltage maintained between the $UO_{2+x}$ excitation source 112 and the grounded substrate 102.

As such, in some embodiments, the electrical device 1604 is transmission line and what is being visualized in FIG. 16, panel B), is a sectional view of this transmission line down the length of the transmission line. In some such embodiments, the insulating substrate 104 comprises an insulator layer (not shown) on a substrate carrier (not shown). This is illustrated, however, in FIG. 18, panel B), in a cross-sectional view of the electrical device, in relation to FIG. 16, panel B), where there is now an insulator layer 104 overlaying a substrate carrier 130. Further, while FIG. 18 panel B) shows a cross section of the electrical device, FIG. 18 panel C) again shows a sectional view of the electrical device through line 1802-1802' of FIG. 18 B). In some such embodiments, the insulating layer 104 comprises $LaAlO_3$, $CaF_2$, ytrrium stabilized zirconia, $ZrO_2$, MgO, $SrTiO_3$, $SiO_2$, $Al_2O_3$, $LiNbO_3$, $NdGaO_3$, $LaGaO_3$, $KTaO3$, $BaTiO3$, or $MaGl_2O_4$ and the substrate carrier 130 comprises a metal (e.g. aluminum). In some such embodiments, referring to FIG. 18, panel B), the electrical device further comprises an electrical insulator 140 that wraps around and electrically insulates the electrical device. In some such embodiments, the electrical device is at least a meter in length, the first single $UO_{2+x}$ crystal or the first oriented crystal $UO_{2+x}$ film 102 is at least a meter in length, and the first single $UO_{2+x}$ crystal or the first oriented crystal $UO_{2+x}$ film 102 has a cross-section of 0.05 mm² or less. In some such embodiments, the device is manufactured using thing film techniques such as PE-CVD.

Turning to FIG. 16, panel C), there is disclosed another electrical device 1606 in accordance with the present disclosure that operates by resonance induction. FIG. 19, panel C), illustrates a cross-sectional view of the electrical device through line 1906-1906' of FIG. 17, panel C) in which there is a single $UO_{2+x}$ crystal or a first oriented crystal $UO_{2+x}$ films 102 between leads 106 and 108. FIG. 20, panel c), illustrates a cross-sectional view of the electrical device through line 1906-1906' of FIG. 16, panel C) in which there is a multiple (e.g., 2 or more, 3 or more, 4 or more, 5 or more, or six or more) single $UO_{2+x}$ crystals or a first oriented crystal $UO_{2+x}$ films 102 between leads 106 and 108. In some embodiments, the electrical device 1606 operates in a range of −273° C. to 100° C. In some embodiments, the electrical device 1606 operates outside this temperature range. The electrical device 1606 comprises an insulating substrate 104 having a surface 105. The electrical device 1606 comprises a first single $UO_{2+x}$ crystal or a first oriented crystal $UO_{2+x}$ film 102 on a first portion of the surface 105. The first single $UO_{2+x}$ crystal or the first oriented crystal $UO_{2+x}$ film originates and hosts, under certain conditions, a non-equilibrium polaronic quantum phase-condensate.

Continuing to refer to FIG. 16, panel C), the electrical device 1606 further comprises a first lead 106 comprising a first electrically conductive material on a second portion of the surface 105. The first least 106 is electrical contact with the first single $UO_{2+x}$ crystal or the first oriented crystal $UO_{2+x}$ film 102.

Continuing to refer to FIG. 16, panel C), the electrical device 1606 further comprises a second lead 108 comprising a second electrically conductive material on a third portion of the surface 105. The second lead 108 is in electrical contact with the first single $UO_{2+x}$ crystal or the first oriented crystal $UO_{2+x}$ film 102. The first lead 106 and the second lead 108 are not in contact with each other as illustrated in FIG. 16, panel C).

Continuing to refer to FIG. 16, panel C), the electrical device 1606 further comprises a $UO_{2+x}$ excitation source or gate 120 in operable communication with the first single $UO_{2+x}$ crystal or the first oriented crystal $UO_{2+x}$ film 102. However, the excitation source is electrically isolated from the first single $UO_{2+x}$ crystal or the first oriented crystal $UO_{2+x}$ film 102 so that current does not pass from the excitation source 120 to the first single $UO_{2+x}$ crystal or the first oriented crystal $UO_{2+x}$ film 102. In some such embodiments, the excitation source 120 is electrically isolated from the first single $UO_{2+x}$ crystal or the first oriented crystal $UO_{2+x}$ film 102 by one or more insulator layers 150 as illustrated in FIG. 16, panel C).

In some embodiments the excitation source 120 is configured to polarize a region of the first single crystal or the first oriented crystal $UO_{2+x}$ film 102 to activate the non-equilibrium polaronic quantum phase-condensate and thereby determine an electrical conductivity of the first single crystal or the first oriented crystal $UO_{2+x}$ film 102. A first state of the excitation source 120 causes the first single $UO_{2+x}$ crystal or the first oriented crystal $UO_{2+x}$ film 102 to be electrically conducting. A second state of the excitation source 120 causes the first single $UO_{2+x}$ crystal or the first oriented crystal $UO_{2+x}$ film 102 to be electrically non-conductive. In some such embodiments, the first state of the excitation source 120 is characterized by a first alternating current that is run through the excitation source 120 (e.g., from the left to the right in the perspective of FIG. 16, panel C), or vice versa, in resonance with a state of the first single crystal or the first oriented crystal $UO_2+x$ film 102. However, this alternating current does not run through the first single $UO_{2+x}$ crystal or the first oriented crystal $UO_{2+x}$ film 102 because of the insulator 150. In such embodiments, the frequency of the alternating current is tuned to be in resonance with a change of state within a condensate within the first single $UO_{2+x}$ crystal or the first oriented crystal $UO_{2+x}$ film 102. The second state of the excitation source 120 is characterized by an absent of the first alternating current in the excitation source. As such, FIG. 16, panel C), represents an electrical device exhibiting gating mode between an electrically conducting and electrically non-conductive state using resonance induction. While not drawn, it will be appreciated that the excitation source 120 is connected to electrical terminals to drive the alternating current (e.g., from left to right or from right to left in the perspective of FIG. 16, panel C).

FIG. 17 illustrates an electrical device 1702 in accordance with the present disclosure. In some embodiments, the electrical device 1702 operates in a range of −273° C. to 100° C. In some embodiments, the electrical device 1702 operates outside the range of −273° C. to 100° C. The electrical device 1702 comprises an insulating substrate 104 having a surface. The electrical device 1702 further comprises a first single $UO_{2+x}$ crystal or a first oriented crystal $UO_{2+x}$ film 140, in a metastable electrically conducting state, on a first portion of the surface. In other words, the first single $UO_{2+x}$ crystal or the first oriented crystal $UO_{2+x}$ film 102 is suspended in the metastable electrically conducting state. For instance, in some embodiments, the first single $UO_{2+x}$ crystal or a first oriented crystal $UO_{2+x}$ film 102 is inhibited from relaxing out of the electrically conducting state. In some embodiments, the first single $UO_{2+x}$ crystal or the first oriented crystal $UO_{2+x}$ film 102 is subjected to mechanical strain by compression, tension, or bending that slightly modifies the distances between the atoms and the degree of overlap of the electronic states in the first single $UO_{2+x}$ crystal or the first oriented crystal $UO_{2+x}$ film 102. In some embodiments, the first single $UO_{2+x}$ crystal or the first oriented crystal $UO_{2+x}$ film 102 is in the metastable electrically conducting state because the substrate 104 has a predetermined degree of epitaxial mismatch with the first single $UO_{2+x}$ crystal or the first oriented crystal $UO_{2+x}$ film 102 that induces a strain on the first single $UO_{2+x}$ crystal or the first oriented crystal $UO_{2+x}$ film 102, and this strain causes the metastable electrically conducting state. In some such embodiments the substrate 104 comprises a layer of $CaF_2$ or yttrium stabilized zirconia that is in contact with the first single $UO_{2+x}$ crystal or the first oriented crystal $UO_{2+x}$ film 102 and this layer of $CaF_2$ or yttrium stabilized zirconia is supported by a metal layer, base, or substrate that is electrically isolated from the first single $UO_{2+x}$ crystal or the first oriented crystal $UO_{2+x}$ film 102 by the $CaF_2$ or yttrium stabilized zirconia.

Continuing with FIG. 17, the electrical device 1702 further comprises a first lead 106 comprising a first electrically conductive material on a second portion of the surface 104. The first lead 106 is in electrical contact with a first portion 140-1 of the first single $UO_{2+x}$ crystal or the first oriented crystal $UO_{2+x}$ film 140. The electrical device 1702 further comprises a second 108 lead comprising a second electrically conductive material on a third portion of the surface. The second lead 108 is in electrical contact with a second portion 140-2 of the first single $UO_{2+x}$ crystal or the first oriented crystal $UO_{2+x}$ film 140. A third portion 140-3 of the first single $UO_{2+x}$ crystal or the first oriented crystal $UO_{2+x}$ film 140 is between the first portion 140-1 and the second portion 140-2 of the first single $UO_{2+x}$ crystal or the first oriented crystal $UO_{2+x}$ film 140 and is not in direct electrical contact with either the first lead 106 or the second lead 108.

Figure 9:
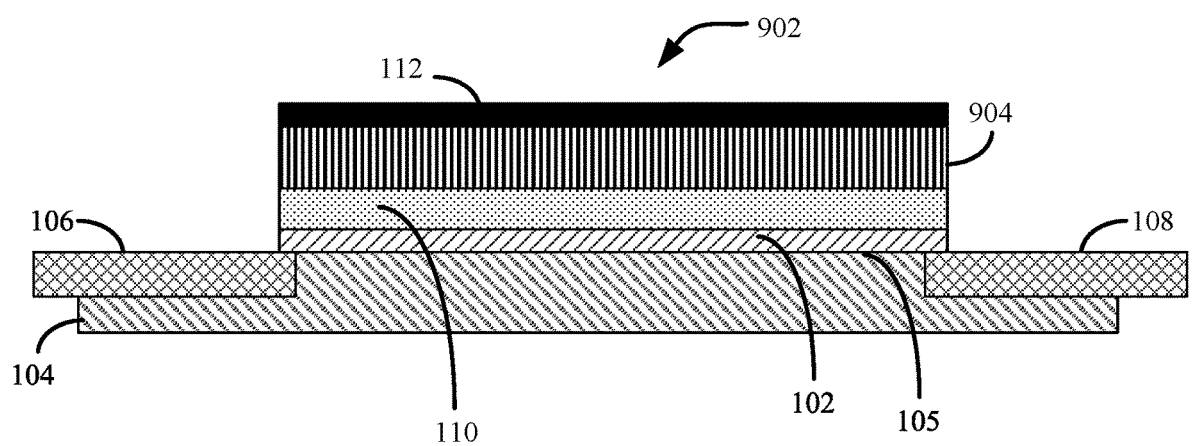
FIG. 9 illustrates an electrical device in accordance with the present disclosure for sensing magnetic fields.

Turning to FIG. 9 there is disclosed a sectional view of an electrical device 902 in accordance with an embodiment of the present disclosure. In some embodiments, the electrical device 902 operates in a range of −273° C. to 100° C. In some embodiments, the electrical device 902 operates outside this temperature range. The electrical device 902 comprises an insulating substrate 104 having a surface 105. The electrical device 902 comprises a first single $UO_{2+x}$ crystal or a first oriented crystal $UO_{2+x}$ film 102 on a first portion of the surface 105. The first single $UO_{2+x}$ crystal or the first oriented crystal $UO_{2+x}$ film originates and hosts, under certain conditions, a non-equilibrium polaronic quantum phase-condensate.

Continuing to refer to FIG. 9, the electrical device 902 further comprises a first lead 106 comprising a first electrically conductive material on a second portion of the surface 105. The first least 106 is electrical contact with the first single $UO_{2+x}$ crystal or the first oriented crystal $UO_{2+x}$ film 102.

Continuing to refer to FIG. 9, the electrical device 902 further comprises a second lead 108 comprising a second electrically conductive material on a third portion of the surface 105. The second lead 108 is in electrical contact with the first single $UO_{2+x}$ crystal or the first oriented crystal $UO_{2+x}$ film 102. The first lead 106 and the second lead 108 are not in contact with each other as illustrated in FIG. 9.

Continuing to refer to FIG. 9, the electrical device 902 further comprises a $UO_{2+x}$ excitation source 112 in operable communication with the first single $UO_{2+x}$ crystal or the first oriented crystal $UO_{2+x}$ film 102. The excitation source 112 is configured to polarize a region of the first single crystal or the first oriented crystal $UO_{2+x}$ film 102 to activate the non-equilibrium polaronic quantum phase-condensate and thereby determine an electrical conductivity of the first single crystal or the first oriented crystal $UO_{2+x}$ film 102. A first state of the excitation source 112 causes the first single $UO_{2+x}$ crystal or the first oriented crystal $UO_{2+x}$ film to be electrically conducting. A second state of the excitation source 112 causes the first single $UO_{2+x}$ crystal or the first oriented crystal $UO_{2+x}$ film to be electrically non-conductive.

In some embodiments, the $UO_{2+x}$ excitation source 112 is a metal such as aluminum, copper, silver, or gold. In some embodiments, the $UO_{2+x}$ excitation source 112 is less than 10 nM thick. In some embodiments, the $UO_{2+x}$ excitation source 112 is less than 5 nM thick.

Continuing to refer to FIG. 9, in some embodiments the $UO_{2+x}$ excitation source 112 is electrically isolated from the first single $UO_{2+x}$ crystal or the first oriented crystal $UO_{2+x}$ film 102 by an insulator 110. Therefore, in such embodiments, the $UO_{2+x}$ excitation source 112 does not pass a current into to the first single $UO_{2+x}$ crystal or the first oriented crystal $UO_{2+x}$ film 102.

Continuing to refer to FIG. 9, in some embodiments, the $UO_{2+x}$ excitation source 112 applies a first voltage that is in a first voltage range to the first single $UO_{2+x}$ crystal or the first oriented crystal $UO_{2+x}$ film 102 when the $UO_{2+x}$ excitation source is in the first state and the $UO_{2+x}$ excitation source 112 applies a second electric voltage that is in a second voltage range to the first single $UO_{2+x}$ crystal or the first oriented crystal $UO_{2+x}$ film 102 when the $UO_{2+x}$ source is in the second state. In such embodiments, the $UO_{2+x}$ excitation source 112 is electrically isolated from the first single $UO_{2+x}$ crystal or the first oriented crystal $UO_{2+x}$ film 102 by one or more insulator layers 110 and the substrate 104 is grounded. Device 902 further includes a layer of ferromagnetic material 904 (e.g., Fe, Co, or some alloys) that tunes the $UO_{2+x}$ excitation source 112 that turns it off and on by adding to it. In other words, the ferromagnetic material 904 changes a switch energy of the device 902 by imposing a magnetic field inside the first single $UO_{2+x}$ crystal or the first oriented crystal $UO_{2+x}$ film 102. As such, the ferromagnetic material 904 serves as a binary switch. When the total field that is the sum of (i) the external magnetic field the first single $UO_{2+x}$ crystal or the first oriented crystal $UO_{2+x}$ film 102 is sensing and (ii) the magnetic field of the ferromagnetic material layer 904 exceeds a predetermined threshold strength the first single $UO_{2+x}$ crystal or the first oriented crystal $UO_{2+x}$ film 102 is induced into an electrically conducting state. Moreover, when the total field that is the sum of (i) the external magnetic field the first single $UO_{2+x}$ crystal or the first oriented crystal $UO_{2+x}$ film 102 is sensing and (ii) the magnetic field of the ferromagnetic material layer 904 is less than the predetermined threshold strength, the first single $UO_{2+x}$ crystal or the first oriented crystal $UO_{2+x}$ film 102 is induced into an electrically nonconducting state. In some such embodiments, the ferromagnetic material layer 904 is electrically isolated from the first oriented crystal $UO_{2+x}$ film 102 by insulator 110. As such, device 902 has applications as an ultrasensitive (because the difference in resistance between off and on is enormous) and ultrafast (because of the switching time) read head in a magnetic storage device. Device 902 could also be tuned actively by having a way to modify the strength of the ferromagnetic material 904. This could be as simple as changing the separation distance between the ferromagnetic material 904 and the first single $UO_{2+x}$ crystal or the first oriented crystal $UO_{2+x}$ film 102. In such embodiments, device 902 can serve to measure the strength of the external magnetic field via the distance between the ferromagnetic material 904 and the first single $UO_{2+x}$ crystal or the first oriented crystal $UO_{2+x}$ film 102 that causes it to switch from the conducting to the non-conducting state, in addition to embodiments in which device 902 serves as a switch at fixed ferromagnetic contribution by the ferromagnetic material 904.

In some embodiments, one or more of the components of the devices illustrated in FIGS. 17, 18, 19, 20, 21, and 9 are manufactured using thin film techniques, nonlimiting disclosure of which is provided below.

Chemical Vapor Deposition.

In some embodiments, one or more layers of the disclosed electrical devices are deposited by chemical vapor deposition. In chemical vapor deposition (CVD), the constituents of a vapor phase, often diluted with an inert carrier gas, react at a hot surface (typically higher than 190° C.) to deposit a solid film. Generally, chemical vapor deposition reactions require the addition of energy to the system, such as heating the chamber or the wafer. For more information on chemical vapor deposition, exemplary devices used to perform chemical vapor deposition, and process conditions are used to perform chemical vapor deposition of silicon nitride, see Van Zant, Microchip Fabrication, Fourth Edition, McGraw-Hill, New York, 2000, pp. 363-393; and Madou, Fundamentals of Microfabrication, Second Edition, 2002, pp. 144-154, CRC Press, each of which are hereby incorporated by reference herein in their entireties.

Reduced Pressure Chemical Vapor Deposition.

In some embodiments, one or more layers of the disclosed electrical devices are deposited by reduced pressure chemical vapor deposition (RPCVD). RPCVD is typically performed at below 10 Pa and at temperatures in the range of (550° C.-600° C.). The low pressure used in RPCVD results in a large diffusion coefficient, which leads to growth of a layer that is limited by the rate of surface reactions rather than the rate of mass transfer to the substrate. In RPCVD, reactants can typically be used without dilution. RPCVD is performed, for example, in some embodiments, in a horizontal tube hot wall reactor.

Low Pressure Chemical Vapor Deposition.

In some embodiments, one or more layers of the disclosed electrical devices are deposited by low pressure chemical vapor deposition (LPCVD) or very low pressure CVD. LPCVD is typically performed at below 1 Pa.

Atmospheric Chemical Vapor Deposition.

In some embodiments, one or more layers of the disclosed electrical devices are deposited by atmospheric to slightly reduced pressure chemical vapor deposition. Atmospheric pressure to slightly reduced pressure CVD (APCVD) is used, for example, to grow APCVD is a relatively simplistic process that has the advantage of producing layers at high deposition rates and low temperatures (350° C.-400° C.).

Plasma Enhanced Chemical Vapor Deposition.

In some embodiments, one or more layers of the disclosed electrical devices are deposited by plasma enhanced (plasma assisted) chemical vapor deposition (PECVD). PECVD systems feature a parallel plate chamber operated at a low pressure (e.g., 2-5 Torr) and low temperature (300° C.-400° C.). A radio-frequency-induced glow discharge, or other plasma source is used to induce a plasma field in the deposition gas. PECVD systems that are used include, but are not limited to, horizontal vertical flow PECVD, barrel radiant-heated PECVD, and horizontal-tube PECVD. In some embodiments, remote plasma CVD (RPCVD) is used. Remote plasma CVD is described, for example, in U.S. Pat. No. 6,458,715 to Sano et al., which is hereby incorporated by reference in its entirety.

Anodization.

In some embodiments, one or more layers of the disclosed electrical devices are deposited by anodization. Anodization is an oxidation process performed in an electrolytic cell. The material to be anodized becomes the anode (+) while a noble metal is the cathode (−). Depending on the solubility of the anodic reaction products, an insoluble layer (e.g., an oxide) results. If the primary oxidizing agent is water, the resulting oxides generally are porous, whereas organic electrolytes lead to very dense oxides providing excellent passivation. See, e.g., Madou et al., 1982, J. Electrochem. Soc. 129, pp. 2749-2752, which is hereby incorporated by reference in its entirety.

Sol-Gel Deposition Techniques.

In some embodiments, one or more layers of the disclosed electrical devices are deposited by a sol gel process. In a sol-gel process solid particles, chemical precursors, in a colloidal suspension in a liquid (a sol) forms a gelatinous network (a gel). Upon removal of the solvent by heating a glass or ceramic layer. Both sol and gel formation are low temperature processes. For sol formation, an appropriate chemical precursor is dissolved in a liquid, for example, tetraethylsiloxane (TEOS) in water. The sol is then brought to its gel-point, that is, the point in the phase diagram where the sol abruptly changes from a viscous liquid to a gelatinous, polymerized network. In the gel state the material is shaped (e.g., a fiber or a lens) or applied onto a substrate by spinning, dipping, or spraying. In the case of TEOS, a silica gel is formed by hydrolysis and condensation using hydrochloric acid as the catalyst. Drying and sintering at temperatures between 200° C. to 600° C. transforms the gel into a glass and ultimately into silicon dioxide.

In the semiconductor industry the sol-gel method described is often used to deposit silicon dioxide. The method is known as the Spin-On Glass method (SOG). Spin-On Glass materials have been widely used as a diffusion source or a planarizing dielectric or multilevel metalization schemes in the fabrication of nowadays integrated circuits. SOGs are in general Si—O network polymers in organic solvents, and prepared through the hydrolysis-condensation reaction that implied the sol-gel technology. SOG materials can be divided into three groups: 1) silicate based compounds, 2) organosilicon compounds and 3) dopant-organic compounds. More information on SOG can be found, for example, in Nguyen Nhu Toan, Spin-On Glass Materials and Applications in Advanced IC Technologies, 1999, which is hereby incorporated herein by reference in its entirety.

Vacuum Evaporation.

In one embodiment of the present disclosure, one or more layers of the disclosed electrical devices are deposited by vacuum evaporation. Vacuum evaporation takes place inside an evacuated chamber. The chamber can be, for example, a quartz bell jar or a stainless steel enclosure. Inside the chamber is a mechanism that evaporates the metal source, a wafer holder, a shutter, thickness and rate monitors, and heaters. The chamber is connected to a vacuum pump. There are any number of different ways in which the metal is evaporated within the chamber, including filament evaporation, E-beam gun evaporation, and hot plate evaporation. See, for example, Van Zant, Microchip Fabrication, Fourth Edition, McGraw-Hill, New York, 2000, pp. 407-411, which is hereby incorporated by reference herein in its entirety.

Sputter Deposition/Physical Vapor Deposition.

In another embodiment of the present disclosure, one or more layers of the disclosed electrical devices are deposited by sputtering. Sputtering, like evaporation, takes place in a vacuum. However, it is a physical not a chemical process (evaporation is a chemical process), and is referred to as physical vapor deposition. Inside the vacuum chamber is a slab, called a target, of the desired film material. The target is electrically grounded. An inert gas such as argon is introduced into the chamber and is ionized to a positive charge. The positively charged argon atoms are attracted to the grounded target and accelerate toward it.

During the acceleration they gain momentum, and strike the target, causing target atoms to scatter. That is, the argon atoms "knock off" atoms and molecules from the target into the chamber. The sputtered atoms or molecules scatter in the chamber with some coming to rest on the wafer. A principal feature of a sputtering process is that the target material is deposited on the wafer with chemical or compositional change. In some embodiments of the present disclosure, direct current (DC) diode sputtering, radio frequency (RF) diode sputtering, triode sputtering, DC magnetron sputtering or RF magnetron sputtering is used. See, for example, Van Zant, Microchip Fabrication, Fourth Edition, McGraw-Hill, New York, 2000, pp. 411-415; U.S. Pat. Nos. 5,203,977; 5,486,277; and 5,742,471, each of which is hereby incorporated by reference herein in its entirety.

RF diode sputtering is a vacuum coating process where an electrically isolated cathode is mounted in a chamber that can be evacuated and partially filled with an inert gas. If the cathode material is an electrical conductor, a direct-current high-voltage power supply is used to apply the high voltage potential. If the cathode is an electrical insulator, the polarity of the electrodes is reversed at very high frequencies to prevent the formation of a positive charge on the cathode that would stop the ion bombardment process. Since the electrode polarity is reversed at a radio frequency, this process is referred to as 133 sputtering. Magnetron sputtering is different form of sputtering. Magnetron sputtering uses a magnetic field to trap electrons in a region near the target surface thus creating a higher probability of ionizing a gas atom. The high density of ions created near the target surface causes material to be removed many times faster than in diode sputtering. The magnetron effect is created by an array of permanent magnets included within the cathode assembly that produce a magnetic field normal to the electric field.

Collimated Sputtering.

In another embodiment of the present disclosure, one or more layers of the disclosed electrical devices are deposited by collimated sputtering. Collimated sputtering is a sputtering process where the arrival of metal occurs at an angel normal to the wafer surface. The metal is collimated by a thick honeycomb grid that effectively blocks off angle metal atoms in some embodiments. Alternatively, ionizing the metal atoms and attracting them towards the wafer collimates the metal. Collimated sputtering improves filling of high aspect ratio contacts.

Laser Ablated Deposition.

In another embodiment of the present disclosure, one or more layers of the disclosed electrical devices are deposited by laser ablated deposition. In one form of laser ablated deposition, a rotating cylindrical target surface is provided for the laser ablation process. The target is mounted in a vacuum chamber so that it is rotated about the longitudinal axis of the cylindrical surface target and simultaneously translated along the longitudinal axis. A laser beam is focused by a cylindrical lens onto the target surface along a line that is at an angle with respect to the longitudinal axis to spread a plume of ablated material over a radial arc. The plume is spread in the longitudinal direction by providing a concave or convex lateral target surface. The angle of incidence of the focused laser beam is other than normal to the target surface to provide a glancing geometry in some embodiments. Simultaneous rotation about and translation along the longitudinal axis produce a smooth and even ablation of the entire cylindrical target surface and a steady evaporation plume. Maintaining a smooth target surface is useful in reducing undesirable splashing of particulates during the laser ablation process and thereby depositing high quality thin films. See, for example, U.S. Pat. No. 5,049,405, which is hereby incorporated by reference herein in its entirety.

Molecular Beam Deposition.

In another embodiment of the present disclosure, one or more layers of the disclosed electrical devices are deposited by molecular beam deposition. Molecular beam deposition is a method of growing films, under vacuum conditions, by directing one or more molecular beams at a substrate. In some instances, molecular beam deposition involves epitaxial film growth on single crystal substrates by a process that typically involves either the reaction of one or more molecular beams with the substrate or the deposition on the substrate of the beam particles. The term "molecular beam" refers to beams of monoatomic species as well as polyatomic species. The term molecular beam deposition includes both epitaxial growth and nonepitaxial growth processes. Molecular beam deposition is a variation of simple vacuum evaporation. However, molecular beam deposition offers better control over the species incident on the substrate than does vacuum evaporation. Good control over the incident species, coupled with the slow growth rates that are possible, permits the growth of thin layers having compositions (including dopant concentrations) that are precisely defined. Compositional control is aided by the fact that growth is generally at relatively low substrate temperatures, as compared to other growth techniques such as liquid phase epitaxy or chemical vapor deposition, and diffusion processes are very slow.

Essentially arbitrary layer compositions and doping profiles are obtained with precisely controlled layer thickness.

In fact, layers as thin as a monolayer are grown by MBE. Furthermore, the relatively low growth temperature permits growth of materials and use of substrate materials that could not be used with higher temperature growth techniques. See for example, U.S. Pat. No. 4,681,773, which is hereby incorporated by reference herein in its entirety.

Ionized Physical Vapor Deposition.

In another embodiment of the present disclosure, one or more layers of the disclosed electrical devices are deposited by ionized physical vapor deposition (I-PVD), also known as ionized metal plasma (IMP). In I-PVD, metal atoms are ionized in an intense plasma. Once ionized, the metal is directed by electric fields perpendicular to the wafer surface. Metal atoms are introduced into the plasma by sputtering from the target. A high density plasma is generated in the central volume of the reactor by an inductively coupled plasma (ICP) source. This electron density is sufficient to ionize approximately 80% of the metal atoms incident at the wafer surface. The ions from the plasma are accelerated and collimated at the surface of the wafer by a plasma sheath. The sheath is a region of intense electric field that is directed toward the wafer surface. The field strength is controlled by applying a radio frequency bias.

Ion Beam Deposition.

In another embodiment of the present disclosure, one or more layers of the disclosed electrical devices are deposited by ion beam deposition (IBD). IBD uses an energetic, broad beam ion source carefully focused on a grounded metallic or dielectric sputtering target. Material sputtered from the target deposits on a nearby substrate to create a film. Most applications also use a second ion source, termed an ion assist source (IAD), which is directed at the substrate to deliver energetic noble or reactive ions at the surface of the growing film. The ion sources are "gridded" ion sources and are typically neutralized with an independent electron source. IBD processing yields excellent control and repeatability of film thickness and properties. Process pressures in IBD systems are approximately 10-4 Torr. Hence, there is very little scattering of either ions delivered by the ion sources or material sputtered from the target of the surface. Compared to sputter deposition using magnetron or diode systems, sputter deposition by IBD is highly directional and more energetic. In combination with a substrate fixture that rotates and changes angle, IBD systems deliver a broad range of control over sidewall coatings, trench filling and liftoff profiles.

Atomic Layer Deposition.

In another embodiment of the present disclosure, one or more layers of the disclosed electrical devices are deposited by atomic layer deposition. Atomic layer deposition is also known as atomic layer epitaxy, sequential layer deposition, and pulsed-gas chemical vapor deposition. Atomic layer deposition involves use of a precursor based on self-limiting surface reactions. Generally, an object is exposed to a first species that deposits as a monolayer on the object. Then, the monolayer is exposed to a second species to form a fully reacted layer plus gaseous byproducts. The process is typically repeated until a desired thickness is achieved. Atomic layer deposition and various methods to carry out the same are described in U.S. Pat. No. 4,058,430 to Suntola et al., entitled "Method for Producing Compound Thin Films," U.S. Pat. No. 4,413,022 to Suntola et al., entitled "Method for Performing Growth of Compound Thin Films," to Ylilammi, and George et al., 1996, J. Phys. Chem. 100, pp. 13121-13131, each of which is hereby incorporated by reference herein in its entirety. Atomic layer deposition has also been described as a chemical vapor deposition operation performed under controlled conditions that cause the deposition to be self-limiting to yield deposition of, at most, a monolayer. The deposition of a monolayer provides precise control of film thickness and improved compound material layer uniformity. Atomic layer deposition is performed using equipment such as the Endura Integrated Cu Barrier/Seed system (Applied Materials, Santa Clara, Calif.).

Hot Filament Chemical Vapor Deposition.

In another embodiment of the present disclosure, one or more layers of the disclosed electrical devices are deposited by hot filament chemical vapor deposition (HFCVD). In HFCVD, reactant gases are flowed over a heated filament to form precursor species that subsequently impinge on the substrate surface, resulting in the deposition of high quality films. HFCVD has been used to grow a wide variety of films, including diamond, boron nitride, aluminum nitride, titanium nitride, boron carbide, as well as amorphous silicon nitride. See, for example, Deshpande et al., 1995, J. Appl. Phys. 77, pp. 6534-6541, which is hereby incorporated by reference herein in its entirety.

REFERENCES CITED

All references cited herein, including those set forth in the "List of References" section below, are hereby incorporated by reference in their entirety and for all purposes to the same extent as if each individual publication or patent or patent application was specifically and individually indicated to be incorporated by reference in its entirety for all purposes.

LIST OF REFERENCES

1. M. H. Anderson, J. R. Ensher, M. R. Matthews, C. E. Wieman, E. A. Cornell, Observation of Bose-Einstein condensation in a dilute atomic vapor. *Science* 269, 198-201 (1995).
2. K. B. Davis, M. O. Mewes, M. R. Andrews, N. J. Vandruten, D. S. Durfee, D. M. Kurn, W. Ketterle, Bose-Einstein condensation in a gas of sodium atoms. *Phys. Rev. Lett.* 75, 3969-3973 (1995).
3. J. M. Blatt, W. Brandt, K. W. Boer, BOSE-EINSTEIN CONDENSATION OF EXCITONS. *Phys. Rev.* 126, 1691-& (1962).
4. S. A. Moskalenko, REVERSIBLE OPTICO-HYDRODYNAMIC PHENOMENA IN A NONIDEAL EXCITON GAS. *Soviet Physics-Solid State* 4, 199-204 (1962).
5. L. V. Keldysh, A. N. Kozlov, COLLECTIVE PROPERTIES OF EXCITONS IN SEMICONDUCTORS. *Soviet Physics Jetp-Ussr* 27, 521-& (1968).
6. H. Fröhlich, Long-range coherence and energy-storage in biological-systems. *International Journal of Quantum Chemistry* 2, 641-649 (1968).
7. H. Fröhlich, Bose condensation of strongly excited longitudinal electric modes. *Phys. Lett. A* A 26, 402-& (1968).
8. L. V. Butov, C. W. Lai, A. L. Ivanov, A. C. Gossard, D. S. Chemla, Towards Bose-Einstein condensation of excitons in potential traps. *Nature* 417, 47-52 (2002).
9. M. Combescot, R. Combescot, F. Dubin, Bose-Einstein condensation and indirect excitons: a review. *Reports on Progress in Physics* 80, (2017).
10. T. Nikuni, M. Oshikawa, A. Oosawa, H. Tanaka, Bose-Einstein condensation of dilute magnons in TlCuCl$_3$. *Phys. Rev. Lett.* 84, 5868-5871 (2000).
11. S. O. Demokritov, V. E. Demidov, O. Dzyapko, G. A. Melkov, A. A. Serga, B. Hillebrands, A. N. Slavin, Bose- Einstein condensation of quasi-equilibrium magnons at room temperature under pumping. *Nature* 443, 430-433 (2006).
12. J. Kasprzak, M. Richard, S. Kundermann, A. Baas, P. Jeambrun, J. M. J. Keeling, F. M. Marchetti, M. H. Szymanska, R. Andre, J. L. Staehli, V. Savona, P. B. Littlewood, B. Deveaud, L. S. Dang, Bose-Einstein condensation of exciton polaritons. *Nature* 443, 409-414 (2006).
13. T. Byrnes, N. Y. Kim, Y. Yamamoto, Exciton-polariton condensates. *Nature Phys.* 10, 803 (2014).
14. T. Guillet, C. Brimont, -17, -956 (2016).
15. N. Y. Kim, K. Kusudo, T. Byrnes, N. Masumoto, Y. Yamamoto, in *Principles and Methods of Quantum Information Technologies*, Y. Yamamoto, K. Semba, Eds. (2016), vol. 911, pp. 363-384.
16. D. Sanvitto, S. Kena-Cohen, The road towards polaritonic devices. *Nature Mater.* 15, 1061-1073 (2016).
17. L. V. Butov, Excitonic devices. *Superlattices and Microstructures* 108, 2-26 (2017).
18. S. D. Conradson, T. Durakiewicz, F. J. Espinosa-Faller, Y. Q. An, D. A. Andersson, A. R. Bishop, K. S. Boland, J. A. Bradley, D. D. Byler, D. L. Clark, D. R. Conradson, L. L. Conradson, A. L. Costello, N. J. Hess, G. H. Lander, A. Llobet, M. B. Martucci, J. Mustre de Leon, D. Nordlund, J. S. Lezama-Pacheco, T. Proffen, G. Rodriguez, D. E. Schwarz, G. T. Seidler, A. D. Taylor, S. A. Trugman, T. A. Tyson, J. A. Valdez, Possible Bose condensate behavior in a quantum phase originating in a collective excitation in the chemically and optically doped Mott-Hubbard system, $UO_{2(+x)}$. *Phys. Rev. B* 88, 115135 (2013).
19. S. D. Conradson, S. M. Gilbertson, S. L. Daifuku, J. A. Kehl, T. Durakiewicz, D. A. Andersson, A. R. Bishop, D. D. Byler, P. Maldonado, P. M. Oppeneer, J. A. Valdez, M. L. Neidig, G. Rodriguez, Possible demonstration of a polaronic Bose-Einstein(-Mott) condensate in $UO_{2(+x)}$ by ultrafast THz Spectroscopy and microwave dissipation. *Sci. Rep.* 5, 15278 (2015).
20. S. D. Conradson, D. A. Andersson, K. S. Boland, J. A. Bradley, D. D. Byler, T. Durakiewicz, S. M. Gilbertson, S. A. Kozimor, K. O. Kvashnina, D. Nordlund, G. Rodriguez, G. T. Seidler, P. S. Bagus, S. M. Butorin, D. R. Conradson, F. J. Espinosa-Faller, N. J. Hess, J. J. Kas, J. S. Lezama-Pacheco, P. Martin, M. B. Martucci, J. J. Rehr, J. A. Valdez, A. R. Bishop, G. Baldinozzi, D. L. Clark, A. Tayal, Closure of the Mott gap and formation of a superthermal metal in the Frohlich-type nonequilibrium polaron Bose-Einstein condensate in UO2+x. *Phys. Rev. B* 96, 125114 (2017).
21. N. G. Duffield, GLOBAL STABILITY OF CONDENSATION IN THE CONTINUUM-LIMIT FOR FROHLICH PUMPED PHONON SYSTEM. *Journal of Physics a-Mathematical and General* 21, 625-641 (1988).
22. J. R. Reimers, L. K. McKemmish, R. H. McKenzie, A. E. Mark, N. S. Hush, Weak, strong, and coherent regimes of Frohlich condensation and their applications to terahertz medicine and quantum consciousness. *P. Natl. Acad. Sci. USA* 106, 4219-4224 (2009).
23. S. D. Conradson, I. D. Raistrick, A. R. Bishop, Axial oxygen centered lattice instabilities and high-temperature superconductivity. *Science* 248, 1394-1398 (1990).
24. J. M. Deleon, S. D. Conradson, I. Batistic, A. R. Bishop, Evidence for an axial oxygen-centered lattice fluctuation associated with the superconducting transition in $YBa_2Cu_3O_7$. *Phys. Rev. Lett.* 65, 1675-1678 (1990).
25. J. M. Deleon, S. D. Conradson, I. Batistic, A. R. Bishop, I. D. Raistrick, M. C. Aronson, F. H. Garzon, Axial oxygen-centered lattice instabilities in $YBa_2Cu_3O_7$— an application of the analysis of extended X-ray-absorption fine-structure in anharmonic systems. *Phys. Rev. B* 45, 2447-2457 (1992).
26. J. M. Deleon, I. Batistic, A. R. Bishop, S. D. Conradson, S. A. Trugman, Polaron origin for anharmonicity of the axial oxygen in $YBa_2Cu_3O_7$. *Phys. Rev. Lett.* 68, 3236-3239 (1992).
27. M. I. Salkola, A. R. Bishop, J. M. Deleon, S. A. Trugman, Dynamic polaron tunneling in $YBa_2Cu_3O_7$— optical-response and inelastic neutron-scattering. *Phys. Rev. B* 49, 3671-3674 (1994).
28. M. I. Salkola, A. R. Bishop, S. A. Trugman, J. M. Deleon, Correlation-function analysis of nonlinear and nonadiabatic systems: Polaron tunneling. *Phys. Rev. B* 51, 8878-8891 (1995).
29. J. M. DeLeon, S. D. Conradson, T. Tyson, A. R. Bishop, M. Salkola, F. J. Espinosa, J. L. Pena, in *Applications of Synchrotron Radiation Techniques to Materials Science III*, L. J. Terminello, S. M. Mini, H. Ade, D. L. Perry, Eds. (Cambridge University Press, 1996), vol. 437, pp. 189-199.
30. L. Perfetti, P. A. Loukakos, M. Lisowski, U. Bovensiepen, M. Wolf, H. Berger, S. Biermann, A. Georges, Femtosecond dynamics of electronic states in the Mott insulator $1T-TaS_2$ by time resolved photoelectron spectroscopy. *New. J. Phys.* 10, 53019 (2008).
31. I. Avigo, R. Cortes, L. Rettig, S. Thirupathaiah, H. S. Jeevan, P. Gegenwart, T. Wolf, M. Ligges, M. Wolf, J. Fink, U. Bovensiepen, Coherent excitations and electron-phonon coupling in $Ba/EuFe_2As_2$ compounds investigated by femtosecond time- and angle-resolved photoemission spectroscopy. *J. Phys.-Condens. Matter* 25, 094003 (2013).
32. Q. J. Chen, J. Stajic, S. Tan, K. Levin, BCS-BEC crossover: From high temperature superconductors to ultracold superfluids. *Phys. Rep.* 412, 1-88 (2005).
33. A. Bianconi, Feshbach shape resonance in multiband superconductivity in heterostructures. *J. Supercon.* 18, 625-636 (2005).
34. A. Bianconi, Shape resonances in superstripes. *Nature Phys.* 9, 536-537 (2013).
35. A. Bianconi, Shape resonances in multi-condensate granular superconductors formed by networks of nanoscale-striped puddles. 10*th International Conference on Materials and Mechanisms of Superconductivity* (M2s-X) 449, 012002 (2013).
36. L. Desgranges, P. Simon, P. Martin, G. Guimbretiere, G. Baldinozzi, What can we learn from Raman spectroscopy on irradiation-induced defects in $UO_2$? *JOM* 66, 2546-2552 (2014).
37. J. A. Bradley, S. Sen Gupta, G. T. Seidler, K. T. Moore, M. W. Haverkort, G. A. Sawatzky, S. D. Conradson, D. L. Clark, S. A. Kozimor, K. S. Boland, Probing electronic correlations in actinide materials using multipolar transitions. *Phys. Rev. B* 81, 193104 (2010).
38. S. M. Gilbertson, T. Durakiewicz, G. L. Dakovski, Y. Li, J.-X. Zhu, S. D. Conradson, S. A. Trugman, G. Rodriguez, Ultrafast photoemission spectroscopy of the uranium dioxide $UO_2$ Mott insulator: Evidence for a robust energy gap structure. *Phys. Rev. Lett.* 112, 087402 (2014).
39. H. Keller, A. Bussmann-Holder, K. A. Mueller, Jahn-Teller physics and high-T, superconductivity. *Mater. Today* 11, 38-46 (2008).
40. M. Magnuson, S. M. Butorin, L. Werme, J. Nordgren, K. E. Ivanov, J. H. Guo, D. K. Shuh, Uranium oxides investigated by x-ray absorption and emission spectroscopies. *Appl. Surf Sci.* 252, 5615-5618 (2006).
41. U. Bovensiepen, Coherent and incoherent excitations of the Gd(0001) surface on ultrafast timescales. *J. Phys.-Condens. Matter* 19, (2007).
42. P. Gallagher, M. Lee, T. A. Petach, S. W. Stanwyck, J. R. Williams, K. Watanabe, T. Taniguchi, D. Goldhaber-Gordon, A high-mobility electronic system at an electrolyte-gated oxide surface. *Nature Commun.* 6, (2015).
43. R. Okazaki, Y. Nishina, Y. Yasui, F. Nakamura, T. Suzuki, I. Terasaki, Current-Induced Gap Suppression in the Mott Insulator Ca2RuO4. *J. Phys. Soc. Jpn.* 82, (2013).
44. P. Bhattacharya, T. Frost, S. Deshpande, M. Z. Baten, A. Hazari, A. Das, Room Temperature Electrically Injected Polariton Laser. *Phys. Rev. Lett.* 112, (2014).
45. T. Byrnes, K. Wen, Y. Yamamoto, Macroscopic quantum computation using Bose-Einstein condensates. *Phys. Rev. A* 85, 040306(R) (2012).
46. T. Byrnes, S. Koyama, K. Yan, Y. Yamamoto, Neural networks using two-component Bose-Einstein condensates. *Sci. Rep.* 3, 02531 (2013).
47. J. Faure, J. Mauchain, E. Papalazarou, M. Marsi, D. Boschetto, I. Timrov, N. Vast, Y. Ohtsubo, B. Arnaud, L. Perfetti, Direct observation of electron thermalization and electron-phonon coupling in photoexcited bismuth. *Phys. Rev. B* 88, 075120 (2013).
48. A. A. Melnikov, O. V. Misochko, S. V. Chekalin, Ultrafast electronic dynamics in laser-excited crystalline bismuth. *J. Appl. Phys.* 114, 033502 (2013).
49. K. Haupt, M. Eichberger, N. Erasmus, A. Rohwer, J. Demsar, K. Rossnagel, H. Schwoerer, Ultrafast Metamorphosis of a Complex Charge-Density Wave. *Phys. Rev. Lett.* 116, (2016).
50. L. Le Guyader, T. Chase, A. H. Reid, R. K. Li, D. Svetin, X. Shen, T. Vecchione, X. J. Wang, D. Mihailovic, H. A. Durr, Stacking order dynamics in the quasi-two-dimensional dichalcogenide 1T-TaS2 probed with MeV ultrafast electron diffraction. *Structural Dynamics* 4, (2017).
51. L. Ma, C. Ye, Y. Yu, X. F. Lu, X. Niu, S. Kim, D. Feng, D. Tomanek, Y.-W. Son, X. H. Chen, Y. Zhang, A metallic mosaic phase and the origin of Mott-insulating state in 1T-TaS2. *Nature Commun.* 7, (2016).
52. D. Mihailovic, D. Dvorsek, V. V. Kabanov, J. Demsar, L. Forro, H. Berger, Femtosecond data storage, processing, and search using collective excitations of a macroscopic quantum state. *Appl. Phys. Lett.* 80, 871-873 (2002).
53. L. Perfetti, P. A. Loukakos, M. Lisowski, U. Bovensiepen, H. Berger, S. Biermann, P. S. Cornaglia, A. Georges, M. Wolf, Time evolution of the electronic structure of 1T-TaS2 through the insulator-metal transition. *Phys. Rev. Lett.* 97, (2006).
54. J. C. Petersen, S. Kaiser, N. Dean, A. Simoncig, H. Y. Liu, A. L. Cavalieri, C. Cacho, I. C. E. Turcu, E. Springate, F. Frassetto, L. Poletto, S. S. Dhesi, H. Berger, A. Cavalleri, Clocking the Melting Transition of Charge and Lattice Order in 1T-TaS2 with Ultrafast Extreme-Ultraviolet Angle-Resolved Photoemission Spectroscopy. *Phys. Rev. Lett.* 107, 177402/177401-177404 (2011).
55. L. Stojchevska, I. Vaskivskyi, T. Mertelj, P. Kusar, D. Svetin, S. Brazovskii, D. Mihailovic, Ultrafast Switching to a Stable Hidden Quantum State in an Electronic Crystal. *Science* 344, 177-180 (2014).
56. D. Svetin, I. Vaskivskyi, S. Brazovskii, D. Mihailovic, Three-dimensional resistivity and switching between correlated electronic states in 1T-TaS2. *Sci. Rep.* 7, (2017).
57. D. Svetin, I. Vaskivskyi, P. Sutar, E. Goreshnik, J. Gospodaric, T. Mertelj, D. Mihailovic, Transitions between photoinduced macroscopic quantum states in 1T-TaS2 controlled by substrate strain. *Applied Physics Express* 7, (2014).
58. I. Vaskivskyi, J. Gospodaric, S. Brazovskii, D. Svetin, P. Sutar, E. Goreshnik, I. A. Mihailovic, T. Mertelj, D. Mihailovic, Controlling the metal-to-insulator relaxation of the metastable hidden quantum state in 1T-TaS2. *Science Advances* 1, (2015).
59. I. Vaskivskyi, I. A. Mihailovic, S. Brazovskii, J. Gospodaric, T. Mertelj, D. Svetin, P. Sutar, D. Mihailovic, Fast electronic resistance switching involving hidden charge density wave states. *Nature Commun.* 7, (2016).
60. E. A. Donley, N. R. Claussen, S. T. Thompson, C. E. Wieman, Atom-molecule coherence in a Bose-Einstein condensate. *Nature* 417, 529-533 (2002).
61. T. R. T. Han, F. R. Zhou, C. D. Malliakas, P. M. Duxbury, S. D. Mahanti, M. G. Kanatzidis, C. Y. Ruan, Exploration of metastability and hidden phases in correlated electron crystals visualized by femtosecond optical doping and electron crystallography. *Science Advances* 1, (2015).
62. H. T. Yuan, H. Shimotani, A. Tsukazaki, A. Ohtomo, M. Kawasaki, Y. Iwasa, High-Density Carrier Accumulation in ZnO Field-Effect Transistors Gated by Electric Double Layers of Ionic Liquids. *Advanced Functional Materials* 19, 1046-1053 (2009).
63. M. Y. Li, T. Graf, T. D. Schladt, X. Jiang, S. S. P. Parkin, Role of Percolation in the Conductance of Electrolyte-Gated $SrTiO_3$. *Phys. Rev. Lett.* 109, (2012).
64. T. A. Petach, M. Lee, R. C. Davis, A. Mehta, D. Goldhaber-Gordon, Mechanism for the large conductance modulation in electrolyte-gated thin gold films. *Phys. Rev. B* 90, (2014).
65. J. Jeong, N. B. Aetukuri, D. Passarello, S. D. Conradson, M. G. Samant, S. S. P. Parkin, Giant reversible, facet-dependent, structural changes in a correlated-electron insulator induced by ionic liquid gating. *P. Natl. Acad. Sci. USA* 112, 1013-1018 (2015).
66. T. D. Schladt, T. Graf, N. B. Aetukuri, M. Y. Li, A. Fantini, X. Jiang, M. G. Samant, S. S. P. Parkin, Crystal-Facet-Dependent Metallization in Electrolyte-Gated Rutile TiO2 Single Crystals. *Acs Nano* 7, 8074-8081 (2013).
67. J. Jeong, N. Aetukuri, T. Graf, T. D. Schladt, M. G. Samant, S. S. P. Parkin, Suppression of Metal-Insulator Transition in $VO_2$ by Electric Field-Induced Oxygen Vacancy Formation. *Science* 339, 1402-1404 (2013).
68. F. Nakamura, M. Sakaki, Y. Yamanaka, S. Tamaru, T. Suzuki, Y. Maeno, Electric-field-induced metal maintained by current of the Mott insulator Ca2RuO4. *Sci. Rep.* 3, (2013).
69. G. Mazza, A. Amaricci, M. Capone, M. Fabrizio, Field-Driven Mott Gap Collapse and Resistive Switch in Correlated Insulators. *Phys. Rev. Lett.* 117, (2016).
70. M. J. Hollander, Y. Liu, W. J. Lu, L. J. Li, Y. P. Sun, J. A. Robinson, S. Datta, Electrically Driven Reversible Insulator-Metal Phase Transition in 1T-TaS2. *Nano Letters* 15, 1861-1866 (2015).
71. C. Schneider, A. Rahimi-Iman, N. Y. Kim, J. Fischer, I. G. Savenko, M. Amthor, M. Lermer, A. Wolf, L. Worschech, V. D. Kulakovskii, I. A. Shelykh, M. Kamp, S. Reitzenstein, A. Forchel, Y. Yamamoto, S. Hofling, An electrically pumped polariton laser. *Nature* 497, 348-352 (2013).

72. N. G. Duffield, STABILITY OF BOSE-EINSTEIN CONDENSATION IN FROHLICH PUMPED PHONON SYSTEM. *Phys. Lett. A* 110, 332-334 (1985).

73. D. Mihailovic, MANGANITE FILMS Tuning phase diagrams. *Nature Mater.* 15, 930-931 (2016).

74. A. Singer, S. K. K. Patel, V. Uhlir, R. Kukreja, A. Ulvestad, E. M. Dufresne, A. R. Sandy, E. E. Fullerton, O. G. Shpyrko, Phase coexistence and pinning of charge density waves by interfaces in chromium. *Phys. Rev. B* 94, (2016).

75. J. D. Zhang, X. L. Tan, M. K. Liu, S. W. Teitelbaum, K. W. Post, F. Jin, K. A. Nelson, D. N. Basov, W. B. Wu, R. D. Averitt, Cooperative photoinduced metastable phase control in strained manganite films. *Nature Mater.* 15, 956-960 (2016).

76. F. Jin, Q. Y. Feng, Z. Guo, D. Lan, B. B. Chen, H. R. Xu, Z. Wang, L. F. Wang, G. Y. Gao, F. Chen, Q. Y. Lu, W. B. Wu, Multilevel control of the metastable states in a manganite film. *J. Appl. Phys.* 121, (2017).

77. Y. Li, X. F. Liu, W. L. Guo, Equation of state for charge-doping-induced deformation and hardening in cubic crystals. *Phys. Rev. B* 96, (2017).

78. B. T. Seaman, M. Kramer, D. Z. Anderson, M. J. Holland, Atomtronics: Ultracold-atom analogs of electronic devices. *Phys. Rev. A* 75, (2007).

79. E. Gibney, Atom circuits a step closer. *Nature News*, (2014).

80. F. Jollet, T. Petit, S. Gota, N. Thromat, M. Gautier-Soyer, A. Pasturel, The electronic structure of uranium dioxide: An oxygen K-Edge X-ray absorption study. *J. Phys.-Condens. Matter* 9, 9393-9401 (1997).

81. S. W. Yu, J. G. Tobin, J. C. Crowhurst, S. Sharma, J. K. Dewhurst, P. Olalde Velasco, W. L. Yang, W. J. Siekhaus, f-f origin of the insulating state in uranium dioxide: X-ray absorption experiments and first-principles calculations. *Phys. Rev. B* 83, 165102 (2011).

82. X.-D. Wen, M. W. Loble, E. R. Batista, E. Bauer, K. S. Boland, A. K. Burrell, S. D. Conradson, S. R. Daly, S. A. Kozimor, S. G. Minasian, R. L. Martin, T. M. McCleskey, B. L. Scott, D. K. Shuh, T. Tyliszczak, Electronic structure and O K-edge XAS spectroscopy of $U_3O_8$. *J. Electron Spectrosc.* 194, 81-87 (2014).

83. R. G. Denning, J. C. Green, T. E. Hutchings, C. Dallera, A. Tagliaferri, K. Giarda, N. B. Brookes, L. Braicovich, Covalency in the uranyl Ion: A polarized X-ray spectroscopic study. *J. Chem. Phys.* 117, 8008-8020 (2002).

84. X.-D. Wen, R. L. Martin, L. E. Roy, G. E. Scuseria, S. P. Rudin, E. R. Batista, T. M. McCleskey, B. L. Scott, E. Bauer, J. J. Joyce, T. Durakiewicz, Effect of spin-orbit coupling on the actinide dioxides $AnO_2$ (An=Th, Pa, U, Np, Pu, and Am): A screened hybrid density functional study. *J. Chem. Phys.* 137, 154707 (2012).

85. X.-D. Wen, R. L. Martin, L. E. Roy, G. E. Scuseria, Density functional theory studies of the electronic structure of solid state actinide oxides. *Chem. Rev.* 113, 1063-1096 (2013).

86. J. G. Tobin, S. W. Yu, R. Qiao, W. L. Yang, C. H. Booth, D. K. Shuh, A. M. Duffin, D. Sokaras, D. Nordlund, T. C. Weng, Covalency in oxidized uranium. *Phys. Rev. B* 92, 045130 (2015).

87. P. S. Bagus, E. S. Ilton, R. L. Martin, H. J. A. Jensen, S. Knecht, Spin-orbit coupling in actinide cations. *Chem. Phys. Lett.* 546, 58-62 (2012).

88. L. E. Roy, T. Durakiewicz, R. L. Martin, J. E. Peralta, G. E. Scuseria, C. G. Olson, J. J. Joyce, E. Guziewicz, Dispersion in the Mott insulator $UO_2$: A comparison of photoemission spectroscopy and screened hybrid density functional theory. *J. Comput. Chem.* 29, 2288-2294 (2008).

89. K. O. Kvashnina, Y. O. Kvashnin, S. M. Butorin, Role of resonant inelastic X-ray scattering in high-resolution core-level spectroscopy of actinide materials. *J. Electron Spectrosc.* 194, 27-36 (2014).

90. D. A. Andersson, G. Baldinozzi, L. Desgranges, D. R. Conradson, S. D. Conradson, Density functional theory calculations of $UO_2$ oxidation: Evolution of $UO_{2+x}$, $U_4O_{9-y}$, $U_3O_7$, and $U_3O_8$. *Inorg. Chem.* 52, 2769-2778 (2013).

91. F. Garrido, R. M. Ibberson, L. Nowicki, B. T. M. Willis, Cuboctahedral oxygen clusters in $U_3O_7$. *J. Nucl. Mater.* 322, 87-89 (2003).

92. L. Desgranges, G. Badinozzi, D. Simeone, H. E. Fischer, Refinement of the alpha-$U_4O_9$ crystalline structure: New insight into the $U_4O_9$ D $U_3O_8$ transformation. *Inorg. Chem.* 50, 6146-6151 (2011).

93. P. Ruello, K. D. Becker, K. Ullrich, L. Desgranges, C. Petot, G. Petot-Ervas, Thermal variation of the optical absorption of $UO_2$: Determination of the small polaron self-energy. *J. Nucl. Mater.* 328, 46-54 (2004).

94. W. Siekhaus, J. Crowhurst, in *Actinides 2009* L. Rao, J. G. Tobin, D. K. Shuh, Eds. (IOP Science, San Francisco, 2009), vol. 9, pp. 012055.

95. X.-D. Wen, R. L. Martin, G. E. Scuseria, S. P. Rudin, E. R. Batista, A. K. Burrell, Screened hybrid and DFT plus U studies of the structural, electronic, and optical properties of $U_3O_8$. *J. Phys.-Condens. Matter* 25, 025501 (2013).

96. J.-Y. Lin, P. R. Lee, Y. T. Liu, C.-Y. Mou, Y.-J. Chen, K. H. Wu, C. W. Luo, J. Y. Juang, T. M. Uen, J. M. Lee, J. M. Chen, in *ArXiv e-prints*. (2010), pp. 1-11.

97. K. W. Kim, G. D. Gu, C. C. Homes, T. W. Noh, Bound excitons in $Sr_2CuO_3$. *Phys. Rev. Lett.* 101, 177404 (2008).

98. H. Okamoto, T. Miyagoe, K. Kobayashi, H. Uemura, H. Nishioka, H. Matsuzaki, A. Sawa, Y. Tokura, Photoinduced transition from Mott insulator to metal in the undoped cuprates $Nd_2CuO_4$ and $La_2CuO_4$. *Phys. Rev. B* 83, 125102 (2011).

99. L. Perfetti, P. A. Loukakos, M. Lisowski, U. Bovensiepen, H. Eisaki, M. Wolf, Ultrafast electron relaxation in superconducting $Bi_2Sr_2CaCu_2O_{8+\delta}$ by time-resolved photoelectron spectroscopy. *Phys. Rev. Lett.* 99, 197001 (2007).

100. V. Brouet, J. Mauchain, E. Papalazarou, J. Faure, M. Marsi, P. H. Lin, A. Taleb-Ibrahimi, P. Le Fevre, F. Bertran, L. Cario, E. Janod, B. Corraze, V. T. Phuoc, L. Perfetti, Ultrafast filling of an electronic pseudogap in an incommensurate crystal. *Phys. Rev. B* 87, 041106(R) (2013).

101. M. Bauer, A. Marienfeld, M. Aeschlimann, Hot electron lifetimes in metals probed by time-resolved two-photon photoemission. *Prog. Surf. Sci.* 90, 319-376 (2015).

102. D. Wegkamp, J. Staehler, Ultrafast dynamics during the photoinduced phase transition in $VO_2$. *Prog. Surf. Sci.* 90, 464-502 (2015).

103. S. Gilbertson, G. L. Dakovski, T. Durakiewicz, J.-X. Zhu, K. M. Dani, A. D. Mohite, A. Dattelbaum, G. Rodriguez, Tracing ultrafast separation and coalescence of carrier distributions in graphene with time-resolved photoemission. *J. Phys. Chem. Lett.* 3, 64-68 (2012).

104. R. Yusupov, T. Mertelj, V. V. Kabanov, S. Brazovskii, P. Kusar, J. H. Chu, I. R. Fisher, D. Mihailovic, Coherent 104. dynamics of macroscopic electronic order through a symmetry breaking transition. *Nature Phys.* 6, 681-684 (2010).
105. O. V. Misochko, M. Hase, K. Ishioka, M. Kitajima, Transient Bose-Einstein condensation of phonons. *Phys. Lett. A* 321, 381-387 (2004).
106. J. M. Deleon, G. G. Li, S. D. Conradson, Planar oxygen-centered lattice instabilities in Tl-based high-temperature superconductors. *Physica C* 220, 377-382 (1994).
107. I. B. Bersuker, *The Jahn-Teller Effect*. (Cambridge University Press, New York, 2006), pp. 616.
108. D. A. Andersson, J. Lezama, B. P. Uberuaga, C. Deo, S. D. Conradson, Cooperativity Among Defect Sites in $AO_{2+x}$ and $A_4O_9$(A=U,Np,Pu): Density Functional Calculations. *Phys. Rev. B* 79, 024110 (2009).
109. D. A. Andersson, F. J. Espinosa-Faller, B. P. Uberuaga, S. D. Conradson, Stability and Migration of Large Oxygen Clusters in $UO_{2+x}$: Density Functional Theory Calculations. *J. Chem. Phys.* 136, 234702 (2012).
110. R. Caciuffo, G. Amoretti, P. Santini, G. H. Lander, J. Kulda, P. D. Du Plessis, Magnetic excitations and dynamical Jahn-Teller distortions in $UO_2$. *Phys. Rev. B* 59, 13892-13900 (1999).
111. S. D. Conradson, D. Manara, F. Wastin, D. L. Clark, G. H. Lander, L. A. Morales, J. Rebizant, V. V. Rondinella, Local structure and charge distribution in the $UO_2$—$U_4O_9$ system. *Inorg. Chem.* 43, 6922-6935 (2004).
112. L. F. He, M. Gupta, M. A. Kirk, J. Pakarinen, J. Gan, T. R. Allen, In Situ TEM Observation of Dislocation Evolution in Polycrystalline $UO_2$. *JOM* 66, 2553-2561 (2014).
113. R. Mankowsky, A. Subedi, M. Foerst, S. O. Mariager, M. Chollet, H. T. Lemke, J. S. Robinson, J. M. Glownia, M. P. Minitti, A. Frano, M. Fechner, N. A. Spaldin, T. Loew, B. Keimer, A. Georges, A. Cavalleri, Nonlinear lattice dynamics as a basis for enhanced superconductivity in $YBa_2Cu_3O_{6.5}$. *Nature* 516, 71-73 (2014).
114. M. Mitrano, A. Cantaluppi, D. Nicoletti, S. Kaiser, A. Perucchi, S. Lupi, P. Di Pietro, D. Pontiroli, M. Ricco, S. R. Clark, D. Jaksch, A. Cavalleri, Possible light-induced superconductivity in $K_3C_{60}$ at high temperature. *Nature* 530, 461 (2016).
115. O. V. Misochko, Experimental Evidence of the Existence of a Nonstationary Coherent Crystal State in Bismuth. *J. Exp. Theor. Phys.* 118, 227-234 (2014).
116. A. Vittorini-Orgeas, A. Bianconi, From *Majorana* theory of atomic autoionization to Feshbach resonances in high temperature superconductors. *J. Supercond. Nov. Magn.* 22, 215-221 (2009).
117. K. Okazaki, Y. Ito, Y. Ota, Y. Kotani, T. Shimojima, T. Kiss, S. Watanabe, C. T. Chen, S. Niitaka, T. Hanaguri, H. Takagi, A. Chainani, S. Shin, Superconductivity in an electron band just above the Fermi level: possible route to BCS-BEC superconductivity. *Sci. Rep.* 4, 4109 (2014).
118. D. Nicoletti, E. Casandruc, Y. Laplace, V. Khanna, C. R. Hunt, S. Kaiser, S. S. Dhesi, G. D. Gu, J. P. Hill, A. Cavalleri, Optically induced superconductivity in striped $La_{2-x}Ba_xCuO_4$ by polarization-selective excitation in the near infrared. *Phys. Rev. B* 90, 100503 (2014).
119. C. A. Regal, M. Greiner, D. S. Jin, Observation of resonance condensation of fermionic atom pairs. *Phys. Rev. Lett.* 92, 040403 (2004).
120. Y. I. Shin, C. H. Schunck, A. Schirotzek, W. Ketterle, Phase diagram of a two-component Fermi gas with resonant interactions. *Nature* 451, 689-694 (2008).
121. J. A. Bradley, P. Yang, E. R. Batista, K. S. Boland, C. J. Burns, D. L. Clark, S. D. Conradson, S. A. Kozimor, R. L. Martin, G. T. Seidler, B. L. Scott, D. K. Shuh, T. Tyliszczak, M. P. Wilkerson, L. E. Wolfsberg, Experimental and Theoretical Comparison of the O K-Edge Nonresonant Inelastic X-ray Scattering and X-ray Absorption Spectra of $NaReO_4$. *J. Am. Chem. Soc.* 132, 13914-13921 (2010).
122. Y. Q. An, A. J. Taylor, S. D. Conradson, S. A. Trugman, T. Durakiewicz, G. Rodriguez, Ultrafast hopping dynamics of 5f electrons in the Mott insulator $UO_2$ studied by femtosecond pump-probe spectroscopy. *Phys. Rev. Lett.* 106, 207402 (2011).
123. T. R. Griffiths, H. V. S. Hubbard, G. C. Allen, P. A. Tempest, A new method for the determination of x in $UO_{2+x}$: optical-absorption spectroscopy measurements. *J. Nucl. Mater.* 151, 307-312 (1988).
124. C. Greaves, B. E. F. Fender, Structure of alpha-$UO_3$ by Neutron and Electron-Diffraction. *Acta Crystallogr.* B 28, 3609-3614 (1972).
125. V. J. Wheeler, R. M. Dell, E. Wait, Uranium Trioxide and the $UO_3$ Hydrates. *J. Inorg. Nucl. Chem.* 26, 1829-1845 (1964).
126. T. T. Fister, G. T. Seidler, L. Wharton, A. R. Battle, T. B. Ellis, J. O. Cross, A. T. Macrander, W. T. Elam, T. A. Tyson, Q. Qian, Multielement spectrometer for efficient measurement of the momentum transfer dependence of inelastic X-ray scattering. *Rev. Sci. Instrum.* 77, 063901 (2006).
127. T. T. Fister, G. T. Seidler, C. Hamner, J. O. Cross, J. A. Soininen, J. J. Rehr, Background Proportional Enhancement of the Extended Fine Structure in Nonresonant Inelastic X-Ray Scattering. *Phys. Rev. B* 74, 214117 (2006).
128. K. G. Tirsell, V. P. Karpenko, A General-Purpose Sub-Kev X-Ray Facility at the Stanford-Synchrotron-Radiation-Laboratory. *Nucl. Instrum. Meth. A* 291, 511-517 (1990).
129. F. M. F. Degroot, M. Grioni, J. C. Fuggle, J. Ghijsen, G. A. Sawatzky, H. Petersen, Oxygen is X-Ray-Absorption Edges of Transition-Metal Oxides. *Phys. Rev. B* 40, 5715-5723 (1989).
130. C. Gauthier, V. A. Sole, R. Signorato, J. Goulon, E. Moguiline, The ESRF beamline ID26: X-ray absorption on ultra dilute sample. *J. Synchrotron Radiat.* 6, 164-166 (1999).
131. K. O. Kvashnina, S. M. Butorin, P. Martin, P. Glatzel, Chemical State of Complex Uranium Oxides. *Phys. Rev. Lett.* 111, (2013).
132. K. O. Kvashnina, A. C. Scheinost, A Johann-type x-ray emission spectrometer at the Rossendorf beamline. *J. Synchrotron Radiat.* 23, 836-841 (2016).
133. A. I. Liechtenstein, V. I. Anisimov, J. Zaanen, Density-Functional Theory and Strong-Interactions—Orbital Ordering in Mott-Hubbard Insulators. *Phys. Rev. B* 52, R5467-R5470 (1995).
134. G. Kresse, D. Joubert, From ultrasoft pseudopotentials to the projector augmented-wave method. *Phys. Rev. B* 59, 1758-1775 (1999).
135. P. E. Blochl, Projector Augmented-Wave Method. *Phys. Rev. B* 50, 17953-17979 (1994).
136. G. Kresse, L. O.
137. S. L. Dudarev, D. N. Manh, A. P. Sutton, Effect of Mott-Hubbard Correlations on the Electronic Structure and Structural Stability of Uranium Dioxide. *Philos. Mag. B* 75, 613-628 (1997).

138. B. Dorado, B. Amadon, M. Freyss, M. Bertolus, DFT Plus U Calculations of the Ground State and Metastable States of Uranium Dioxide. *Phys. Rev. B* 79, 235125 (2009).

139. B. Meredig, A. Thompson, H. A. Hansen, C. Wolverton, A. van de Walle, Method for Locating Low-Energy Solutions Within DFT Plus U. *Phys. Rev. B* 82, 195128 (2010).

140. J. J. Rehr, R. C. Albers, Theoretical Approaches to X-Ray Absorption Fine Structure. *Rev. Mod. Phys.* 72, 621-654 (2000).

141. J. J. Rehr, J. J. Kas, M. P. Prange, A. P. Sorini, Y. Takimoto, F. Vila, Ab Initio Theory and Calculations of X-Ray Spectra. *C. R. Phys.* 10, 548-559 (2009).

142. P. S. Bagus, H. Freund, H. Kuhlenbeck, E. S. Ilton, A New Analysis of X-Ray Adsorption Branching Ratios: Use of Russell-Saunders Coupling. *Chem. Phys. Lett.* 455, 331-334 (2008).

143. E. S. Ilton, P. S. Bagus, Ligand Field Effects on the Multiplet Structure of the U4f XPS of $UO_2$. *Surf Sci.* 602, 1114-1121 (2008).

144. P. S. Bagus, E. S. Ilton, C. J. Nelin, The Interpretation of XPS Spectra: Insights Into Materials Properties. *Surf Sci. Rep.* 68, 273-304 (2013).

145. K. G. Dyall, An Exact Separation of the Spin-Free and Spin-Dependent Terms of the Dirac-Coulomb-Breit Hamiltonian. *J. Chem. Phys.* 100, 2118-2127 (1994).

146. H. J. Visscher, H. J. A. Jensen, T. Saue, R. Bast, S. Dubillard, K. G. Dyall, U. Ekstrom, E. Eliav, T. Fleig, A. S. P. Gomes, T. U. Helgaker, J. Henriksson, M. Iliaš, C. R. Jacob, S. Knecht, P. Norman, J. Olsen, M. Pernpointner, K. Ruud, P. Salek, J. Sikkema. (2008).

Alternative Embodiments

Many modifications and variations of this invention can be made without departing from its spirit and scope, as will be apparent to those skilled in the art. The specific embodiments described herein are offered by way of example only. The embodiments were chosen and described in order to best explain the principles of the invention and its practical applications, to thereby enable others skilled in the art to best utilize the invention and various embodiments with various modifications as are suited to the particular use contemplated. The invention is to be limited only by the terms of the appended claims, along with the full scope of equivalents to which such claims are entitled.

What is claimed:

1. An electrical device comprising:
(A) an insulating substrate having a surface;
(B) a first single $UO_{2+x}$ crystal or a first oriented crystal $UO_{2+x}$ film on a first portion of the surface, wherein the first single $UO_{2+x}$ crystal or the first oriented crystal $UO_{2+x}$ film originates and hosts a non-equilibrium polaronic quantum phase-condensate;
(C) a first lead comprising a first electrically conductive material on a second portion of the surface in electrical contact with the first single $UO_{2+x}$ crystal or the first oriented crystal $UO_{2+x}$ film;
(D) a second lead comprising a second electrically conductive material on a third portion of the surface, wherein the second lead is in electrical contact with the first single $UO_{2+x}$ crystal or the first oriented crystal $UO_{2+x}$ film and wherein the first and second leads are not in contact with each other; and
(E) a $UO_{2+x}$ excitation source in operable communication with the first single $UO_{2+x}$ crystal or the first oriented crystal $UO_{2+x}$ film, wherein the excitation source is configured to polarize a region of the first single crystal or the first oriented crystal $UO_{2+x}$ film to activate the non-equilibrium polaronic quantum phase-condensate and determine an electrical conductivity of the first single crystal or the first oriented crystal $UO_{2+x}$ film, wherein
a first state of the excitation source causes the first single $UO_{2+x}$ crystal or the first oriented crystal $UO_{2+x}$ film to be electrically conducting, and
a second state of the excitation source causes the first single $UO_{2+x}$ crystal or the first oriented crystal $UO_{2+x}$ film to be electrically non-conductive.

2. The electrical device of claim 1, wherein
the $UO_{2+x}$ excitation source applies a first voltage that is in a first voltage range to the first single $UO_{2+x}$ crystal or the first oriented crystal $UO_{2+x}$ film when the $UO_{2+x}$ excitation source is in the first state, and
the $UO_{2+x}$ excitation source applies a second electric voltage that is in a second voltage range to the first single $UO_{2+x}$ crystal or the oriented crystal $UO_{2+x}$ film when the $UO_{2+x}$ source is in the second state.

3. The electrical device of claim 1, wherein
the $UO_{2+x}$ excitation source applies a light with an energy of 2.5-3.5 eV and with a fluence of 0.1-5 milliJoules/$cm^2$ to the first single $UO_{2+x}$ crystal or the first oriented crystal $UO_{2+x}$ film when the $UO_{2+x}$ excitation source is in the first state, and
the $UO_{2+x}$ excitation source applies (i) a light with an energy of 4-5 eV with a fluence of 0.1-5 milliJoules/$cm^2$ or (ii) no light to the first single $UO_{2+x}$ crystal or the first oriented crystal $UO_{2+x}$ film when the $UO_{2+x}$ excitation source is in the second state.

4. The electrical device of claim 1, wherein, when the first single $UO_{2+x}$ crystal or the first oriented crystal $UO_{2+x}$ film is electrically conducting, an observable of the first single $UO_{2+x}$ crystal or the first oriented crystal $UO_{2+x}$ film is detectable when the first single $UO_{2+x}$ crystal or the first oriented crystal $UO_{2+x}$ film is exposed to a magnetic field of 0.1 gauss or greater interacting with the magnetic moments of electrons participating in the polaronic quantum-phase condensate to modify the energy of a state in which they reside and thereby change a state of the first single $UO_{2+x}$ crystal or the first oriented crystal $UO_{2+x}$ film.

5. The electrical device of claim 4, wherein the observable comprises:
a change in resistance between the first lead and the second lead,
an absorption or emission of electromagnetic radiation by the first single $UO_{2+x}$ crystal or first oriented crystal $UO_{2+x}$ film, or
a change in voltage between the first lead and the second lead.

6. The electrical device of claim 1, wherein
the $UO_{2+x}$ excitation source applies a first laser pulse that is between 2.5 and 3.5 electron volts at the first single $UO_{2+x}$ crystal or the first oriented crystal $UO_{2+x}$ film when the $UO_{2+x}$ excitation source is in the first state, and
the $UO_{2+x}$ excitation source applies a second laser pulse that is between 4 and 5.2 electron volts at the first single $UO_{2+x}$ crystal or the first oriented crystal $UO_{2+x}$ film when the $UO_{2+x}$ excitation source is in the second state.

7. The electrical device of claim 6, wherein the first laser pulse switches the first single $UO_{2+x}$ crystal or the first oriented crystal $UO_{2+x}$ film from electrically insulating to electrically conducting in less than 50 femtoseconds.

8. The electrical device of claim 7, wherein the second laser pulse switches the first single $UO_{2+x}$ crystal or the first oriented crystal $UO_{2+x}$ film from electrically conducting to electrically insulating in less than 50 femtoseconds.

9. The electrical device of claim 1, wherein the insulating substrate comprises an insulator layer on a substrate carrier.

10. The electrical device of claim 9, wherein
the insulating layer comprises $LaAlO_3$, $CaF_2$, ytrrium stabilized zirconia, $ZrO_2$, MgO, $SrTiO_3$, $SiO_2$, $Al_2O_3$, $LiNbO_3$, $NdGaO_3$, $LaGaO_3$, KTaO3, BaTiO3, or $MaGl_2O_4$, and
the substrate carrier comprises a polycrystalline material, monocrystalline silicon, or a semiconductor material.

11. The electrical device of claim 9, wherein
the insulating layer comprises crystalline $LaAlO_3$, $CaF_2$, ytrrium stabilized zirconia, $ZrO_2$, MgO, $SrTiO_3$, $SiO_2$, $Al_2O_3$, $LiNbO_3$, $NdGaO_3$, $LaGaO_3$, KtaO3, BaTiO3, or $MaGl_2O_4$, and
the substrate carrier comprises a polycrystalline material, monocrystalline silicon, or a semiconductor material.

12. The electrical device of claim 9, wherein
the insulating layer comprises $LaAlO_3$, $CaF_2$, ytrrium stabilized zirconia, $ZrO_2$, MgO, $SrTiO_3$, $SiO_2$, $Al_2O_3$, $LiNbO_3$, $NdGaO_3$, $LaGaO_3$, KtaO3, BaTiO3, or $MaGl_2O_4$, and
the substrate carrier comprises a metal.

13. The electrical device of claim 11, wherein the substrate carrier comprises aluminum, aluminum oxide.

14. The electrical device of claim 1, wherein the first single $UO_{2+x}$ crystal or the first oriented crystal $UO_{2+x}$ film has a resistivity of less than $10^{-4}$ Ω·cm when the first single $UO_{2+x}$ crystal or the first oriented crystal $UO_{2+x}$ film is electrically conducting.

15. The electrical device of claim 1, wherein the first single $UO_{2+x}$ crystal or the first oriented crystal $UO_{2+x}$ film is in the [111] orientation with respect to the insulating substrate.

16. The electrical device of claim 1, wherein x is in the range −0.05 to 0.35.

17. The electrical device of claim 1, wherein the first lead comprises a first metal and the second lead comprises a second metal.

18. The electrical device of claim 17, wherein the first metal is the same as the second metal.

19. The electrical device of claim 18, wherein the first metal and the second metal are the same or different and are each selected from the group consisting of gold, copper, aluminum, silver, platinum, iron, or alloys thereof.

20. The electrical device of claim 1, wherein the device is a superconducting field effect transistor in which the first lead is the source, the second lead is the drain, the $UO_{2+x}$ excitation source is the gate.

21. The electrical device of claim 1, wherein the $UO_{2+x}$ excitation source comprises an electrode that is separated from the first oriented crystal $UO_{2+x}$ film by an ionic liquid and
the $UO_{2+x}$ excitation source applies a first voltage that is in a first voltage range to the ionic liquid when the $UO_{2+x}$ excitation source is in the first state, and
the $UO_{2+x}$ excitation source applies (i) a second electric voltage that is in a second voltage range or (ii) no voltage to the ionic liquid when the $UO_{2+x}$ excitation source is in the second state.

22. The electrical device of claim 1, wherein a third state of the excitation source does not affect the conductivity of the first single $UO_{2+x}$ crystal or the first oriented crystal $UO_{2+x}$ film.

23. The electrical device of claim 1, wherein
the first state of the excitation source is characterized by a first alternating current that is run through the excitation source in resonance with a state of the first single crystal or the first oriented crystal $UO_{2+x}$ film, wherein a frequency of the alternating current is tuned to be in resonance with a change of state within a condensate within the first single $UO_{2+x}$ crystal or the first oriented crystal $UO_{2+x}$ film, and
the second state of the excitation source is characterized by an absence of the first alternating current in the excitation source.

24. The electrical device of claim 1, wherein the $UO_{2+x}$ excitation source is electrically isolated from the first single $UO_{2+x}$ crystal or the first oriented crystal $UO_{2+x}$ film by an insulator.

25. The electrical device of claim 1, wherein
the excitation source is metal layer overlaying the first single $UO_{2+x}$ crystal or the first oriented crystal $UO_{2+x}$ film.

26. The electrical device of claim 25, wherein the metal layer comprises more than 80 percent w/v aluminum, copper, silver or gold.

27. The electrical device of claim 26, wherein the metal layer comprises more than 80 percent w/v aluminum, copper, silver or gold is less than 10 nM thick.

28. The electrical device of claim 1, wherein
the electrical device is a transmission line, and
the insulating substrate comprises an insulator layer on a substrate carrier.

29. The electrical device of claim 28,
wherein the insulating substrate comprises an insulator layer on a substrate carrier, the insulating layer comprises $LaAlO_3$, $CaF_2$, ytrrium stabilized zirconia, $ZrO_2$, MgO, $SrTiO_3$, $SiO_2$, $Al_2O_3$, $LiNbO_3$, $NdGaO_3$, $LaGaO_3$, KTaO3, BaTiO3, or $MaGl_2O_4$, and the substrate carrier comprises a metal.

30. The electrical device of claim 28, further comprising an electrical insulator that wraps around and electrical insulates the electrical device.

31. The electrical device of claim 28, wherein
the first single $UO_{2+x}$ crystal or the first oriented crystal $UO_{2+x}$ film is at least a meter in length, and
the first single $UO_{2+x}$ crystal or the first oriented crystal $UO_{2+x}$ film has a cross-section of 0.05 mm$^2$ or less.

32. The electrical device of claim 28, wherein
the first single $UO_{2+x}$ crystal or the first oriented crystal $UO_{2+x}$ film is at least a meter in length, and
the first single $UO_{2+x}$ crystal or the first oriented crystal $UO_{2+x}$ film has thickness of less than 1000 nM.

33. The electrical device of claim 28, wherein
the first single $UO_{2+x}$ crystal or the first oriented crystal $UO_{2+x}$ film is at least a meter in length, and
the first single $UO_{2+x}$ crystal or the first oriented crystal $UO_{2+x}$ film has thickness of less than 500 nM,
the insulating substrate comprises an insulator layer on a substrate carrier,
the insulating layer comprises $LaAlO_3$, $CaF_2$, ytrrium stabilized zirconia, $ZrO_2$, MgO, $SrTiO_3$, $SiO_2$, $Al_2O_3$, $LiNbO_3$, $NdGaO_3$, $LaGaO_3$, KTaO3, BaTiO3, or $MaGl_2O_4$, and
the substrate carrier comprises a metal.

34. The electrical device of claim 28, wherein
the first single $UO_{2+x}$ crystal or the first oriented crystal $UO_{2+x}$ film is at least a meter in length, and
the first single $UO_{2+x}$ crystal or the first oriented crystal $UO_{2+x}$ film has thickness of less than 600 nM and a width of less than 25 millimeters,
the insulating substrate comprises an insulator layer on a substrate carrier,
the insulating layer comprises $CaF_2$ or ytrrium stabilized zirconia, and
the substrate carrier comprises aluminum.

35. The electrical device of claim 1, wherein the first single $UO_{2+x}$ crystal or the first oriented crystal $UO_{2+x}$ film is electrically non-conductive when it has an electrical resistivity of 1.29 µΩ·m or greater.

36. The electrical device of claim 1, wherein the first single $UO_{2+x}$ crystal or the first oriented crystal $UO_{2+x}$ film is electrically non-conductive when it has an electrical resistivity of 0.5 µΩ·m or greater.

37. The electrical device of claim 1, further comprising a plurality of single $UO_{2+x}$ crystals or first oriented crystal $UO_{2+x}$ films on the first portion of the surface, the plurality of single $UO_{2+x}$ crystals or oriented crystal $UO_{2+x}$ films including the single $UO_{2+x}$ crystal or first oriented crystal $UO_{2+x}$ film, wherein each single $UO_{2+x}$ crystal or oriented crystal $UO_{2+x}$ film in the plurality of single $UO_{2+x}$ crystals or oriented crystal $UO_{2+x}$ films: (i) originates and hosts a non-equilibrium polaronic quantum phase-condensate and (ii) is in electrical contract with both the first lead and the second lead.

38. The electrical device of claim 37, wherein the plurality of single $UO_{2+x}$ crystals or oriented crystal $UO_{2+x}$ films comprises 5 or more single $UO_{2+x}$ crystals or oriented crystal $UO_{2+x}$ films.

39. The electrical device of claim 37, wherein the plurality of single $UO_{2+x}$ crystals or oriented crystal $UO_{2+x}$ films comprises 15 or more single $UO_{2+x}$ crystals or oriented crystal $UO_{2+x}$ films.

* * * * *